(12) United States Patent
Lin

(10) Patent No.: US 8,436,449 B2
(45) Date of Patent: May 7, 2013

(54) CHIP PACKAGE AND METHOD FOR FABRICATING THE SAME

(75) Inventor: Mou-Shiung Lin, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 13/107,058

(22) Filed: May 13, 2011

(65) Prior Publication Data

US 2011/0215446 A1    Sep. 8, 2011

Related U.S. Application Data

(63) Continuation of application No. 11/850,674, filed on Sep. 5, 2007, now Pat. No. 7,960, 825.

(60) Provisional application No. 60/824,617, filed on Sep. 6, 2006.

(51) Int. Cl.
*H01L 23/58* (2006.01)

(52) U.S. Cl.
USPC .............. 257/632; 257/E23.002; 257/692; 257/E23.119

(58) Field of Classification Search .......... 257/692, 257/E23.119, 632, E23.002
See application file for complete search history.

(56) References Cited

U.S. PATENT DOCUMENTS

| | | | |
|---|---|---|---|
| 5,136,360 A | 8/1992 | Harada et al. | |
| 5,384,488 A | 1/1995 | Golshan et al. | |
| 5,854,740 A | 12/1998 | Cha | |
| 5,969,424 A | 10/1999 | Matsuki et al. | |
| 6,066,877 A | 5/2000 | Williams et al. | |
| 6,187,680 B1 | 2/2001 | Costrini et al. | |
| 6,229,221 B1 | 5/2001 | Kloen et al. | |
| 6,276,353 B1 | 8/2001 | Briggs et al. | |
| 6,300,234 B1 | 10/2001 | Flynn et al. | |
| 6,376,353 B1 | 4/2002 | Zhou et al. | |
| 6,383,916 B1 | 5/2002 | Lin | |
| 6,410,435 B1 | 6/2002 | Ryan | |
| 6,476,506 B1 | 11/2002 | O'Connor et al. | |
| 6,476,507 B1 | 11/2002 | Takehara | |
| 6,593,222 B2 | 7/2003 | Smoak | |
| 6,593,649 B1 | 7/2003 | Lin et al. | |
| 6,605,528 B1 | 8/2003 | Lin et al. | |
| 6,649,509 B1 | 11/2003 | Lin et al. | |
| 6,683,380 B2 | 1/2004 | Efland et al. | |
| 6,756,295 B2 | 6/2004 | Lin et al. | |
| 6,762,115 B2 | 7/2004 | Lin et al. | |
| 6,798,050 B1 | 9/2004 | Homma et al. | |

(Continued)

OTHER PUBLICATIONS

U.S. Appl. No. 13/107,058, filed May 13, 2011, Soderholm, Krista Z., Non-Final OA mailed Jun. 28, 2012.

(Continued)

*Primary Examiner* — Matthew W Such
*Assistant Examiner* — Krista Soderholm
(74) *Attorney, Agent, or Firm* — Seyfarth Shaw LLP

(57) ABSTRACT

A method for fabricating chip package includes providing a semiconductor chip with a bonding pad, comprising an adhesion/barrier layer, connected to a pad through an opening in a passivation layer, next adhering the semiconductor chip to a substrate using a glue material, next bonding a wire to the bonding pad and to the substrate, forming a polymer material on the substrate, covering the semiconductor chip and the wire, next forming a lead-free solder ball on the substrate, and then cutting the substrate and polymer material to form a chip package.

20 Claims, 31 Drawing Sheets

U.S. PATENT DOCUMENTS

| | | |
|---|---|---|
| 6,800,555 B2 | 10/2004 | Test et al. |
| 6,844,631 B2 | 1/2005 | Yong et al. |
| 6,979,647 B2 | 12/2005 | Bojkov et al. |
| 7,060,607 B2 | 6/2006 | Efland |
| 7,230,340 B2 | 6/2007 | Lin |
| 7,271,489 B2 | 9/2007 | Lin et al. |
| 7,319,277 B2 | 1/2008 | Lin |
| 7,355,282 B2 | 4/2008 | Lin et al. |
| 7,372,161 B2 | 5/2008 | Lin et al. |
| 7,381,642 B2 | 6/2008 | Lin et al. |
| 7,393,772 B2 | 7/2008 | Gleixner et al. |
| 7,394,161 B2 | 7/2008 | Kuo et al. |
| 7,416,971 B2 | 8/2008 | Lin et al. |
| 7,420,276 B2 | 9/2008 | Lin et al. |
| 7,423,346 B2 | 9/2008 | Lin et al. |
| 7,468,545 B2 | 12/2008 | Lin et al. |
| 7,470,927 B2 | 12/2008 | Lee et al. |
| 7,470,997 B2 | 12/2008 | Lin et al. |
| 7,473,999 B2 | 1/2009 | Lin et al. |
| 7,508,059 B2 | 3/2009 | Lin et al. |
| 7,582,556 B2 | 9/2009 | Lin et al. |
| 7,960,825 B2 | 6/2011 | Lin |
| 2001/0035452 A1 | 11/2001 | Test et al. |
| 2001/0051426 A1 | 12/2001 | Pozder et al. |
| 2002/0000671 A1 | 1/2002 | Zuniga et al. |
| 2002/0043723 A1 | 4/2002 | Shimizu et al. |
| 2003/0006271 A1* | 1/2003 | Chen et al. ............... 228/180.5 |
| 2003/0179549 A1* | 9/2003 | Zhong et al. ............... 361/707 |
| 2003/0222295 A1 | 12/2003 | Lin |
| 2004/0070042 A1 | 4/2004 | Lee et al. |
| 2004/0227239 A1 | 11/2004 | Murata et al. |
| 2005/0189633 A1 | 9/2005 | Wang et al. |
| 2006/0014316 A1* | 1/2006 | Lin et al. ............... 438/108 |
| 2006/0079019 A1 | 4/2006 | Kim |
| 2006/0186180 A1 | 8/2006 | Bosco |
| 2007/0045757 A1 | 3/2007 | Matsubara et al. |
| 2007/0045855 A1 | 3/2007 | Lo et al. |
| 2007/0205520 A1* | 9/2007 | Chou et al. ............... 257/780 |
| 2007/0212869 A1 | 9/2007 | Chou et al. |
| 2007/0275503 A1 | 11/2007 | Lin et al. |
| 2008/0001290 A1 | 1/2008 | Chou et al. |
| 2008/0020512 A1* | 1/2008 | Karnezos et al. ............ 438/110 |
| 2008/0042280 A1 | 2/2008 | Lin et al. |
| 2008/0080111 A1 | 4/2008 | Lin et al. |

OTHER PUBLICATIONS

Foreign Office Action and Search Report for Taiwan Patent Application No. 096133091 dated Apr. 6, 2011 with English summary translation.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

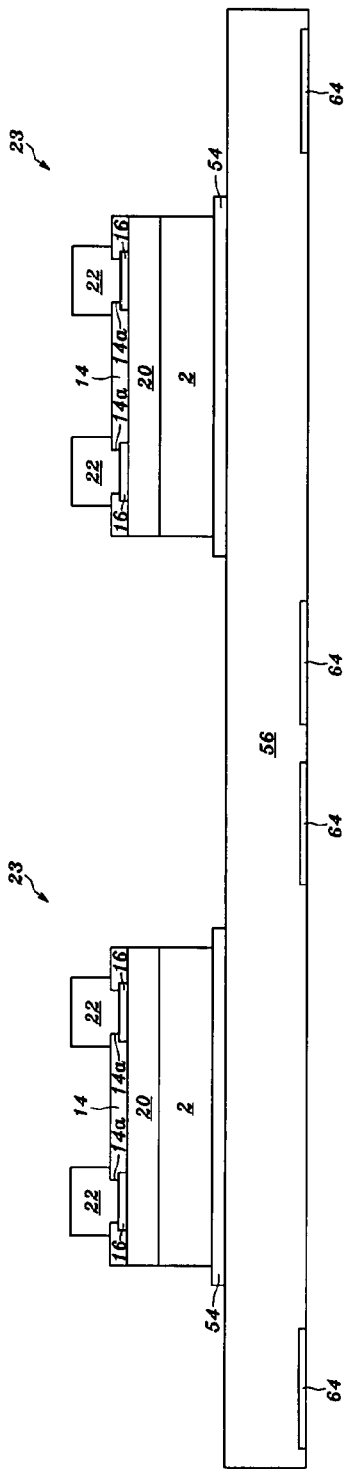
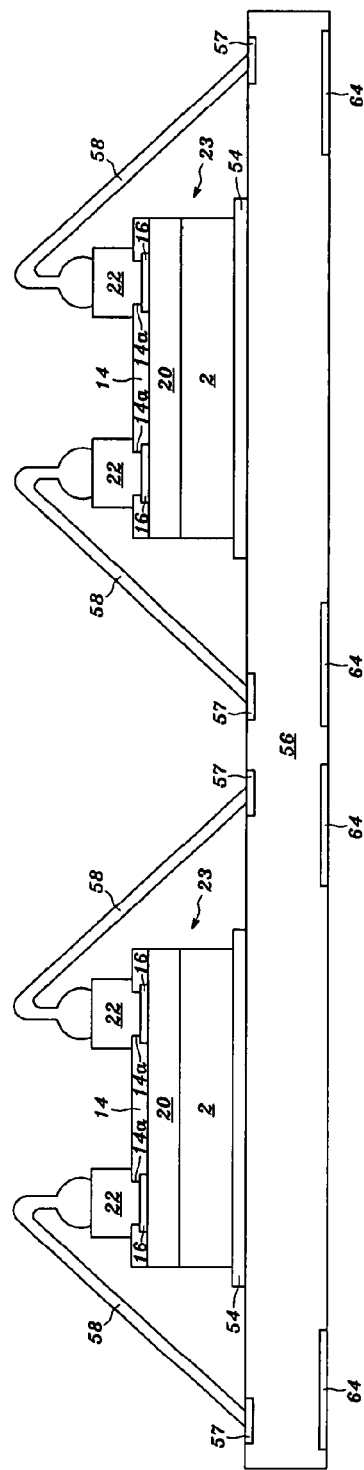
Fig. 9A
Fig. 9B

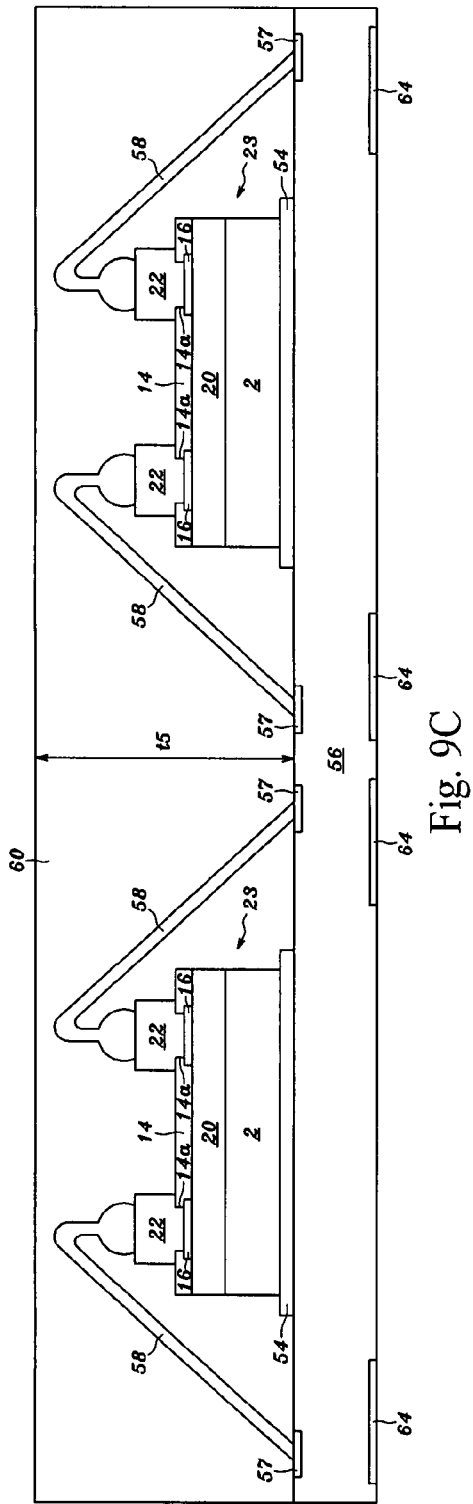
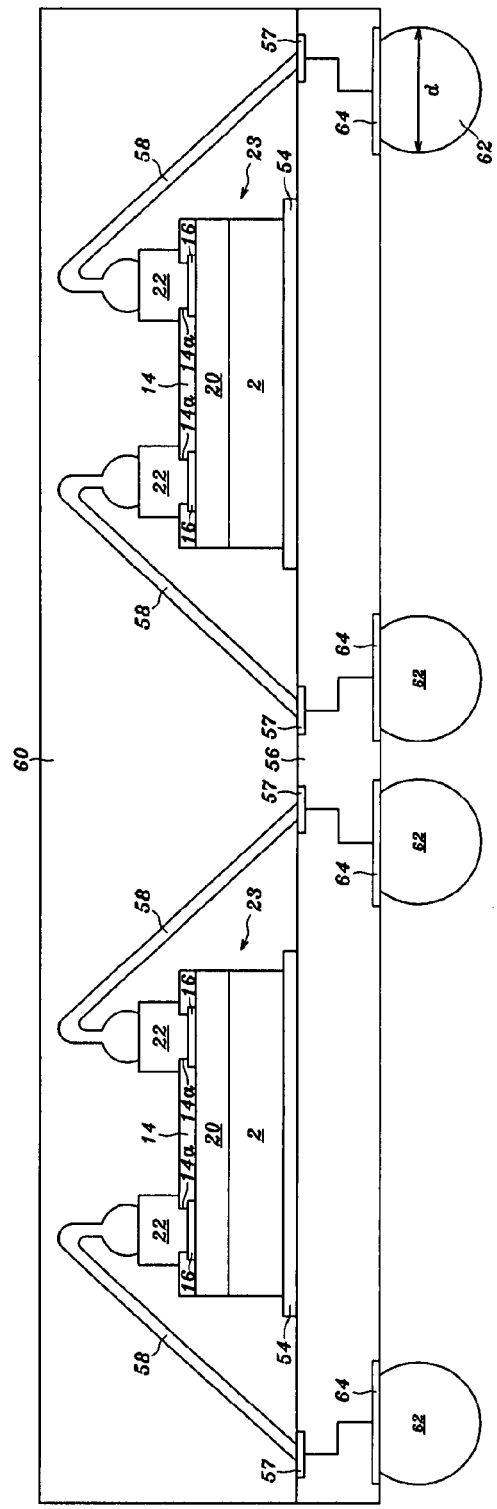
Fig. 9C
Fig. 9D

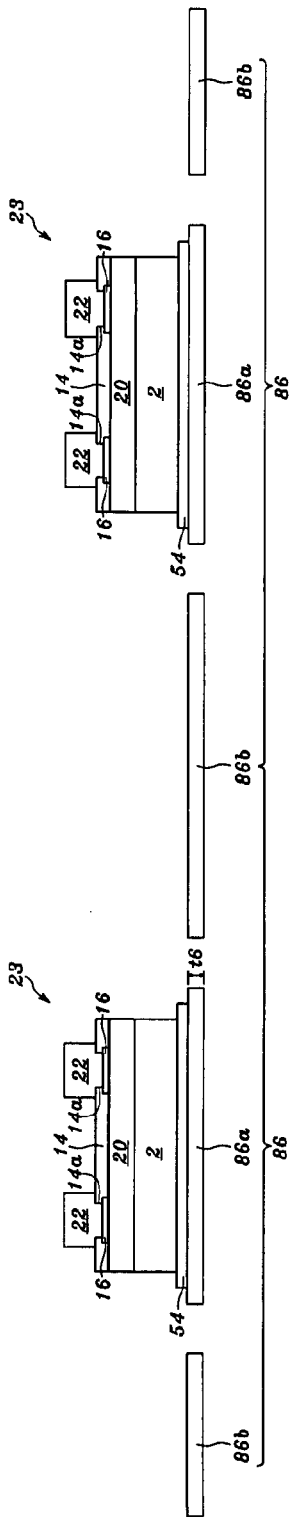
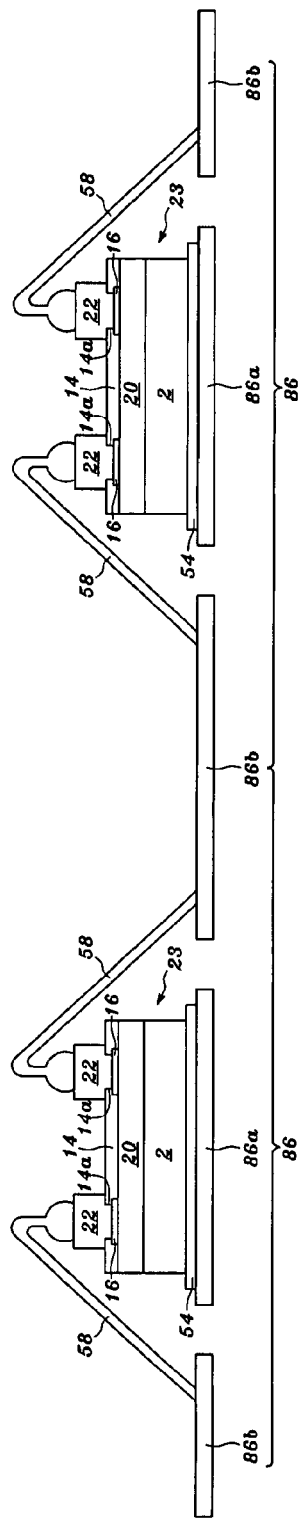
Fig. 11A
Fig. 11B

CHIP PACKAGE AND METHOD FOR FABRICATING THE SAME

This application is a continuation of U.S. application Ser. No. 11/850,674, filed Sep. 5, 2007, currently pending, which claims priority to U.S. provisional application No. 60/824,617, filed on Sep. 6, 2006, which is herein incorporated by reference in its entirety.

BACKGROUND OF THE INVENTION

1. Field of the Invention

The invention relates to a chip package, and, more specifically, to a chip package with a specific pad between a bonding wire and an aluminum pad exposed by an opening in a passivation layer or between a bonding wire and an aluminum cap, leading the intermetallic compound (IMC) to be avoided.

2. Brief Description of the Related Art

Wirebonding is the process of providing electrical connection between a semiconductor chip and an external circuit using very fine bonding wires. The wire used in wirebonding is usually made either of gold (Au).

Referring to FIG. 1, in the prior art of a BGA (ball grid array) package, one end of a gold wire 110 is ball bonded to an aluminum cap 114 over a copper pad 120 exposed by an opening 118a in a passivation layer 118 of a semiconductor chip 112, and the other end of the gold wire 110 is wedge bonded to a BGA substrate 116. The copper pad 120 of the semiconductor chip 112 can be electrically connected to a solder ball 122 under the BGA substrate 116 via the gold wire 110 and a metal trace of the BGA substrate 116.

However, the intermetallic compound (IMC) could be formed the gold wire 110 and the aluminum cap 114 in the following high-temperature packaging process, such as in the lead-free ball planting process. The intermetallic compound has a brittle structure, leading a poor reliability for the BGA package. Besides, the gold wire 110 in a high-power application could be heated at a high temperature, which also could lead the undesired intermetallic compound (IMC) formed the gold wire 110 and the aluminum cap 114.

SUMMARY OF THE INVENTION

It is the objective of the invention to provide a chip package for eliminating inter-metallic-compound (IMC) formation during a packaging process.

It is the objective of the invention to provide a chip package for improving the product reliability under the lead-free industrial requirement.

It is the objective of the invention to provide a chip package with a good electrical performance.

In order to reach the above objectives, the present invention provides a chip package comprising: a ball-grid-array (BGA) substrate, a glue material, such as epoxy based material or polyimide (PI), on a top surface of the BGA substrate, a semiconductor chip on the glue material, wherein the semiconductor chip comprises a passivation layer over a circuit structure, an opening in the passivation layer exposing a pad of the circuit structure, and a bonding pad over the pad exposed by the opening, a wire bonded to the bonding pad and to the BGA substrate, a polymer material, such as epoxy based material, benzocyclobutane (BCB) or polyimide, on the top surface of the BGA substrate, covering the semiconductor chip and the wire, and a lead-free solder ball on a bottom surface of the BGA substrate.

In order to reach the above objectives, the present invention provides a chip package comprising: a BGA substrate, a glue material, such as epoxy based material or polyimide (PI), on a top surface of the BGA substrate, a semiconductor chip on the glue material, wherein the semiconductor chip comprises a passivation layer over a circuit structure, an opening in the passivation layer exposing a pad of the circuit structure, and a bonding pad connected to the pad through the opening, a wire bonded to the bonding pad and to the BGA substrate, a polymer material, such as epoxy based material, benzocyclobutane (BCB) or polyimide, on the top surface of the BGA substrate, covering the semiconductor chip and the wire, and a lead-free solder ball on a bottom surface of the BGA substrate.

In order to reach the above objectives, the present invention provides a chip package comprising: a lead frame, a glue material, such as epoxy based material or polyimide (PI), on a die pad of the lead frame, a semiconductor chip on the glue material, wherein the semiconductor chip comprises a passivation layer over a circuit structure, an opening in the passivation layer exposing a pad of the circuit structure, and a bonding pad over the pad exposed by the opening, a wire bonded to the bonding pad and to a lead of the lead frame, a polymer material, such as epoxy based material, benzocyclobutane (BCB) or polyimide, enclosing the die pad, an inner partition of the lead, the semiconductor chip and the wire.

In order to reach the above objectives, the present invention provides a chip package comprising: a lead frame, a glue material, such as epoxy based material or polyimide (PI), on a die pad of the lead frame, a semiconductor chip on the glue material, wherein the semiconductor chip comprises a passivation layer over a circuit structure, an opening in the passivation layer exposing a pad of the circuit structure, and a bonding pad connected to the pad through the opening, a wire bonded to the bonding pad and to a lead of the lead frame, a polymer material, such as epoxy based material, benzocyclobutane (BCB) or polyimide, enclosing the die pad, an inner partition of the lead, the semiconductor chip and the wire.

In order to reach the above objectives, a method for fabricating a chip package comprises the following steps: providing a semiconductor chip with a bonding pad connected to a pad through an opening in a passivation layer, adhering the semiconductor chip to a top surface of a BGA substrate, bonding a wire to the bonding pad and to the BGA substrate, forming a polymer material on the top surface of the BGA substrate, covering the semiconductor chip and the wire, depositing a lead-free solder on a bottom surface of the BGA substrate, reflowing the lead-free solder at a temperature of between 200 and 300° C., and preferably between 230 and 260° C., to form a lead-free solder ball joined with the bottom surface of the BGA substrate, and cutting the polymer material and the BGA substrate.

To enable the objectives, technical contents, characteristics and accomplishments of the present invention, the embodiments of the present invention are to be described in detail in cooperation with the attached drawings below.

BRIEF DESCRIPTION OF THE DRAWINGS

FIGS. 9A through 9E are sectional views showing a process according to one embodiment of the present invention.

FIGS. 11A through 11D are sectional views showing a process according to another one embodiment of the present invention.

DETAILED DESCRIPTION OF THE INVENTION

Figure 1:
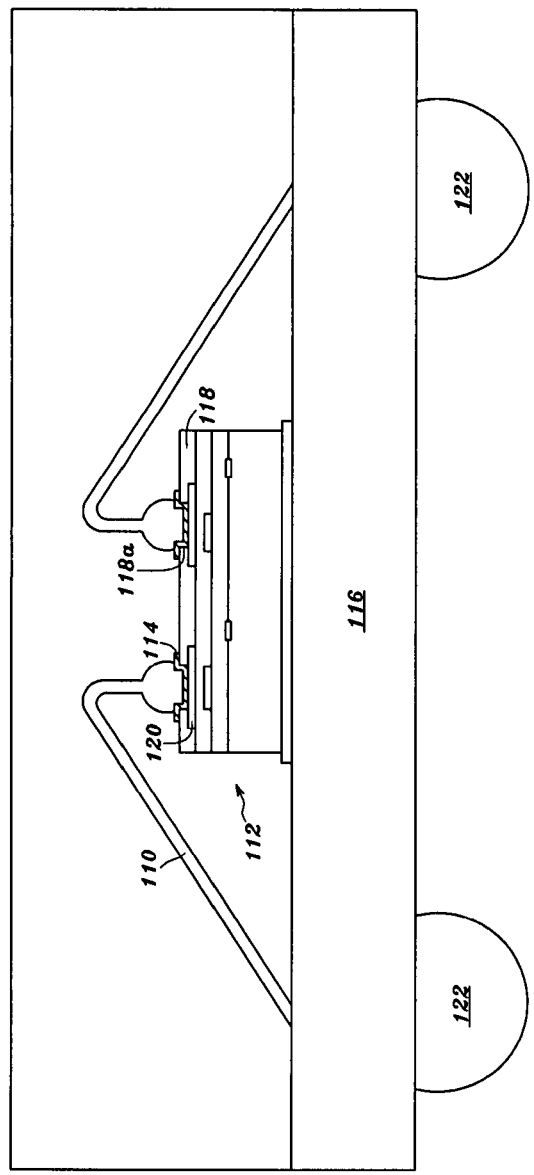
FIG. 1 is a cross-sectional view schematically showing a BGA package according to the prior art.
Figure 2A:
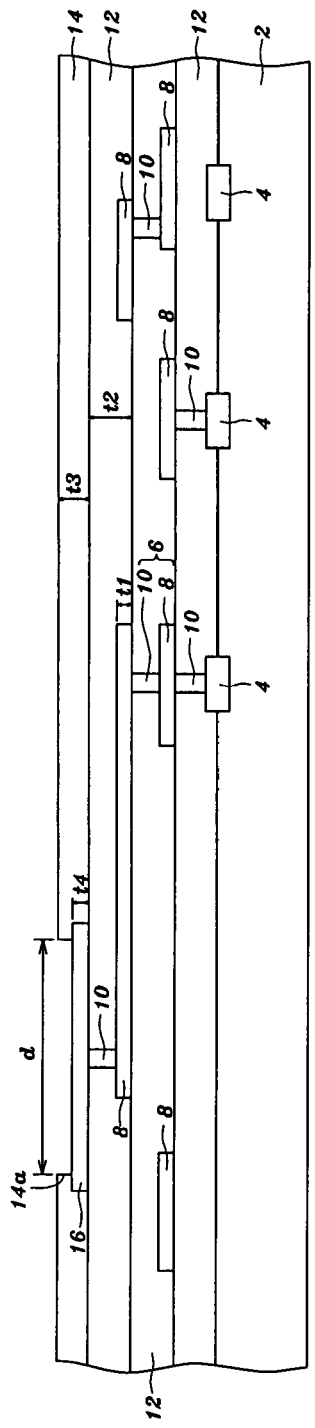
FIGS. 2A and 2B are cross-sectional views schematically showing various structures according to the present invention.

Referring to FIG. 2A, a semiconductor substrate or semiconductor blank wafer 2 may be a silicon substrate or silicon wafer, a GaAs substrate or GaAs wafer, or a SiGe substrate or SiGe wafer. Multiple semiconductor devices 4 are formed in or over the semiconductor substrate 2. The semiconductor device 4 may be a memory device, a logic device, a passive device, such as resistor, capacitor, inductor or filter, or an active device, such as p-channel MOS device, n-channel MOS device, CMOS (Complementary Metal Oxide Semiconductor), BJT (Bipolar Junction Transistor) or BiCMOS (Bipolar CMOS) device.

A circuit structure 6, fine line metal trace structure, is formed over the semiconductor substrate 2 and connect to the semiconductor device 4. The circuit structure 6 comprises multiple patterned metal layers 8 having a thickness t1 of less than 3 micrometers (such as between 0.2 and 2 µm) and multiple metal plugs 10. For example, the patterned metal layers 8 and the metal plugs 10 are principally made of copper, wherein the patterned metal layer 8 is a copper layer having a thickness of less than 3 µm (such as between 0.2 and 2 µm). Alternatively, the patterned metal layer 8 is principally made of aluminum or aluminum-alloy, and the metal plug 10 is principally made of tungsten, wherein the patterned metal layer 8 is an aluminum-containing layer having a thickness of less than 3 µm (such as between 0.2 and 2 µm).

One of the patterned metal layers 8 may be formed by a damascene process including sputtering an adhesion/barrier layer, such as tantalum or tantalum nitride, on an insulating layer, composed of Low-K oxide and oxynitride, and in an opening in the insulating layer, then sputtering a first copper layer on the adhesion/barrier layer, then electroplating a second copper layer on the first copper layer, then removing the first and second copper layers and the adhesion/barrier layer outside the opening in the insulating layer using a chemical mechanical polishing (CMP) process. Alternatively, one of the patterned metal layer 8 may be formed by a process including sputtering an aluminum-alloy layer, containing more than 90 wt % aluminum and less than 10 wt % copper, on an insulating layer, such as oxide, then patterning the aluminum-alloy layer using photolithography and etching processes.

Multiple dielectric layers 12 having a thickness t2 of less than 3 micrometers, such as between 0.3 and 2.5 µm, are located over the semiconductor substrate 2 and interposed respectively between the neighboring patterned metal layers 8, and the neighboring patterned metal layers 8 are interconnected through the metal plugs 10 inside the dielectric layer 12. The dielectric layer 12 is commonly formed by a chemical vapor deposition (CVD) process. The material of the dielectric layer 12 may include silicon oxide, silicon oxynitride, TEOS (Tetraethoxysilane), a compound containing silicon, carbon, oxygen and hydrogen (such as $Si_wC_xO_yH_z$), silicon nitride (such as $Si_3N_4$), FSG (Fluorinated Silicate Glass), Black Diamond, SiLK, a porous silicon oxide, a porous compound containing nitrogen, oxygen and silicon, SOG (Spin-On Glass), BPSG (borophosphosilicate glass), a polyarylene ether, PBO (Polybenzoxazole), or a material having a low dielectric constant (K) of between 1.5 and 3, for example.

A passivation layer 14 is formed over the circuit structure 6 and over the dielectric layers 12. The passivation layer 14 can protect the semiconductor devices 4 and the circuit structure 6 from being damaged by moisture and foreign ion contamination. In other words, mobile ions (such as sodium ion), transition metals (such as gold, silver and copper) and impurities can be prevented from penetrating through the passivation layer 14 to the semiconductor devices 4, such as transistors, polysilicon resistor elements and polysilicon-polysilicon capacitor elements, and to the circuit structure 6.

The passivation layer 14 is commonly made of silicon oxide (such as $SiO_2$), silicon oxynitride, silicon nitride (such as $Si_3N_4$), or PSG (phosphosilicate glass). The passivation layer 14 commonly has a thickness t3 of more than 0.3 µm, such as between 0.3 and 1.5 µm. In a preferred case, the silicon nitride layer in the passivation layer 14 has a thickness of more than 0.3 µm. Ten methods for depositing the passivation layer 14 are described as below.

In a first method, the passivation layer 14 is formed by depositing a silicon oxide layer with a thickness of between 0.2 and 1.2 µm using a CVD method and then depositing a silicon nitride layer with a thickness of 0.2 and 1.2 µm on the silicon oxide layer using a CVD method.

In a second method, the passivation layer 14 is formed by depositing a silicon oxide layer with a thickness of between 0.2 and 1.2 µm using a CVD method, next depositing a silicon oxynitride layer with a thickness of between 0.05 and 0.15 µm on the silicon oxide layer using a Plasma Enhanced CVD (PECVD) method, and then depositing a silicon nitride layer with a thickness of between 0.2 and 1.2 µm on the silicon oxynitride layer using a CVD method.

In a third method, the passivation layer 14 is formed by depositing a silicon oxynitride layer with a thickness of between 0.05 and 0.15 µm using a CVD method, next depositing a silicon oxide layer with a thickness of between 0.2 and 1.2 µm on the silicon oxynitride layer using a CVD method, and then depositing a silicon nitride layer with a thickness of between 0.2 and 1.2 µm on the silicon oxide layer using a CVD method.

In a fourth method, the passivation layer 14 is formed by depositing a first silicon oxide layer with a thickness of between 0.2 and 0.5 µm using a CVD method, next depositing a second silicon oxide layer with a thickness of between 0.5 and 1 µm on the first silicon oxide layer using a spin-coating method, next depositing a third silicon oxide layer with a thickness of between 0.2 and 0.5 µm on the second silicon oxide layer using a CVD method, and then depositing a silicon nitride layer with a thickness of 0.2 and 1.2 µm on the third silicon oxide using a CVD method.

In a fifth method, the passivation layer 14 is formed by depositing a silicon oxide layer with a thickness of between 0.5 and 2 µm using a High Density Plasma CVD (HDP-CVD)

method and then depositing a silicon nitride layer with a thickness of 0.2 and 1.2 μm on the silicon oxide layer using a CVD method.

In a sixth method, the passivation layer 14 is formed by depositing an Undoped Silicate Glass (USG) layer with a thickness of between 0.2 and 3 μm, next depositing an insulating layer of TEOS, PSG or BPSG (borophosphosilicate glass) with a thickness of between 0.5 and 3 μm on the USG layer, and then depositing a silicon nitride layer with a thickness of 0.2 and 1.2 μm on the insulating layer using a CVD method.

In a seventh method, the passivation layer 14 is formed by optionally depositing a first silicon oxynitride layer with a thickness of between 0.05 and 0.15 μm using a CVD method, next depositing a silicon oxide layer with a thickness of between 0.2 and 1.2 μm on the first silicon oxynitride layer using a CVD method, next optionally depositing a second silicon oxynitride layer with a thickness of between 0.05 and 0.15 μm on the silicon oxide layer using a CVD method, next depositing a silicon nitride layer with a thickness of between 0.2 and 1.2 μm on the second silicon oxynitride layer or on the silicon oxide using a CVD method, next optionally depositing a third silicon oxynitride layer with a thickness of between 0.05 and 0.15 μm on the silicon nitride layer using a CVD method, and then depositing a silicon oxide layer with a thickness of between 0.2 and 1.2 μm on the third silicon oxynitride layer or on the silicon nitride layer using a CVD method.

In a eighth method, the passivation layer 14 is formed by depositing a first silicon oxide layer with a thickness of between 0.2 and 1.2 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 1.2 μm on the second silicon oxide layer using a CVD method, next depositing a silicon nitride layer with a thickness of between 0.2 and 1.2 μm on the third silicon oxide layer using a CVD method, and then depositing a fourth silicon oxide layer with a thickness of between 0.2 and 1.2 μm on the silicon nitride layer using a CVD method.

In a ninth method, the passivation layer 14 is formed by depositing a first silicon oxide layer with a thickness of between 0.5 and 2 μm using a HDP-CVD method, next depositing a silicon nitride layer with a thickness of between 0.2 and 1.2 μm on the first silicon oxide layer using a CVD method, and then depositing a second silicon oxide layer with a thickness of between 0.5 and 2 μm on the silicon nitride using a HDP-CVD method.

In a tenth method, the passivation layer 14 is formed by depositing a first silicon nitride layer with a thickness of between 0.2 and 1.2 μm using a CVD method, next depositing a silicon oxide layer with a thickness of between 0.2 and 1.2 μm on the first silicon nitride layer using a CVD method, and then depositing a second silicon nitride layer with a thickness of between 0.2 and 1.2 μm on the silicon oxide layer using a CVD method.

An opening 14a in the passivation layer 14 exposes a pad 16 of the circuit structure 6 used to input or output signals or to be connected to a power source or a ground reference. The pad 16 may have a thickness t4 of between 0.4 and 3 μm or between 0.2 and 2 μm. For example, the pad 16 may be composed of a sputtered aluminum layer or a sputtered aluminum-copper-alloy layer with a thickness of between 0.2 and 2 μm. Alternatively, the pad 16 may include an electroplated copper layer with a thickness of between 0.2 and 2 μm, and a barrier layer, such as tantalum or tantalum nitride, on a bottom surface and side walls of the electroplated copper layer.

Therefore, the pad 16 can be an aluminum pad, principally made of sputtered aluminum with a thickness of between 0.2 and 2 μm. Alternatively, the pad 16 can be a copper pad, principally made of electroplated copper with a thickness of between 0.2 and 2 μm.

The opening 14a may have a transverse dimension d, from a top view, of between 0.5 and 20 μm or between 20 and 200 μm. The shape of the opening 14a from a top view may be a circle, and the diameter of the circle-shaped opening 14a may be between 0.5 and 20 μm or between 20 and 200 μm. Alternatively, the shape of the opening 14a from a top view may be a square, and the width of the square-shaped opening 14a may be between 0.5 and 20 μm or between 20 and 200 μm. Alternatively, the shape of the opening 14a from a top view may be a polygon, such as hexagon or octagon, and the polygon-shaped opening 14a may have a width of between 0.5 and 20 μm or between 20 and 200 μm. Alternatively, the shape of the opening 14a from a top view may be a rectangle, and the rectangle-shaped opening 14a may have a shorter width of between 0.5 and 20 μm or between 20 and 200 μm. Further, there may be some of the semiconductor devices 4 under the pad 16 exposed by the opening 14a. Alternatively, there may be no active devices under the pad 16 exposed by the opening 14a.

Figure 2B:
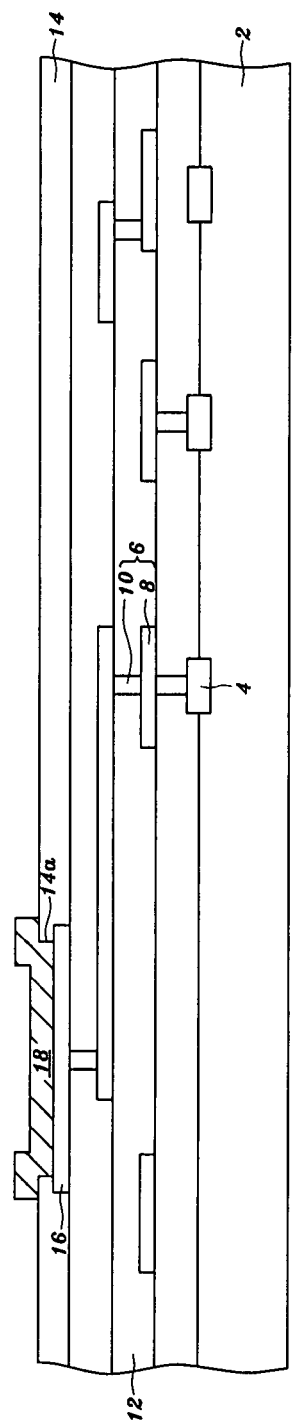

Referring to FIG. 2B, a metal cap 18 having a thickness of between 0.4 and 3 μm can be optionally formed on the pad 16 exposed by the opening 14a in the passivation layer 14 to prevent the pad 16 from being oxidized or contaminated. For example, the metal cap 18 may comprise a barrier layer having a thickness of between 0.01 and 0.7 μm on the pad 16, such as copper pad, exposed by the opening 14a, and an aluminum-containing layer having a thickness of between 0.4 and 2 μm on the barrier layer, wherein the barrier layer may be made of titanium, a titanium-tungsten alloy, titanium nitride, tantalum, tantalum nitride, chromium or alloy of refractory metal, and the aluminum-containing layer may be an aluminum layer, an aluminum-copper alloy layer or an Al—Si—Cu alloy layer. Alternatively, the metal cap 18 may be an aluminum-containing layer having a thickness of between 0.4 and 2 μm directly on the pad 16, such as copper pad, exposed by the opening 14a, without the above-mentioned barrier layer between the aluminum-containing layer and the pad 16, wherein the aluminum-containing layer may be an aluminum layer, an aluminum-copper alloy layer or an Al—Si—Cu alloy layer.

For example, the metal cap 18 may include a tantalum-containing layer, such as tantalum layer or tantalum-nitride layer, having a thickness of between 0.01 and 0.7 μm on the pad 16, principally made of electroplated copper, exposed by the opening 14a, and an aluminum-containing layer, such as aluminum layer or aluminum-alloy layer, having a thickness of between 0.4 and 2 μm on the tantalum-containing layer. Alternatively, the metal cap 18 may include a titanium-containing layer, such as titanium layer or titanium-tungsten-alloy layer, having a thickness of between 0.01 and 0.7 μm on the pad 16, principally made of electroplated copper, exposed by the opening 14a, and an aluminum-containing layer, such as aluminum layer or aluminum-alloy layer, having a thickness of between 0.4 and 2 μm on the tantalum-containing layer.

The semiconductor substrate 2, the circuit structure 6, the dielectric layer 12, the passivation layer 14 and the pad 16 are described in the above paragraphs. Below, the scheme 20 between the semiconductor substrate 2 and the passivation layer 14 may be any one of the structures shown in FIGS. 2A and 2B between the semiconductor substrate 2 and the passivation layer 14; the scheme 20 represents the combination of the semiconductor devices 4, the circuit structure 6 (including the metal layers 8 and the metal plugs 10) and the dielectric layers 12 in FIG. 2A and FIG. 2B.

Figure 3:
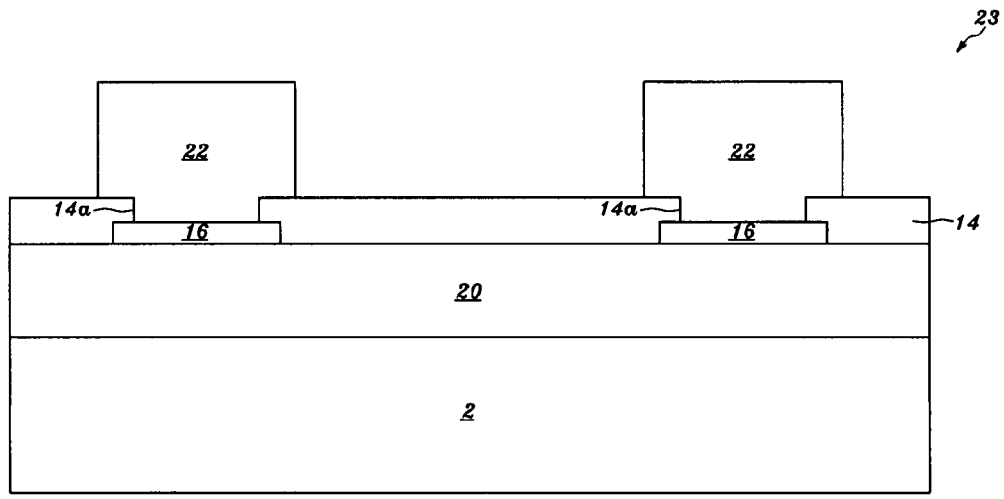
FIG. 3 is a cross-sectional view showing a semiconductor chip with a bonding pad according to the present invention.

Referring to FIG. 3, in the present invention, a bonding pad 22 having a thickness of between 1 and 20 μm, and preferably of between 3 and 5 μm, can be formed on the pad 16, such as aluminum pad or copper pad, exposed by the opening 14a in the passivation layer 14. The bonding pad 22 may be used to be bonded with a wire, such as gold wire. A method of forming the bonding pad 22 on the pad 16 exposed by the opening 14a can be referred to FIGS. 4A-4G. After a semiconductor wafer is formed with the bonding pad 22, the semiconductor wafer can be separated into multiple individual semiconductor chips 23, integrated circuit chips, by a laser cutting process or by a mechanical cutting process.

Figure 4A:
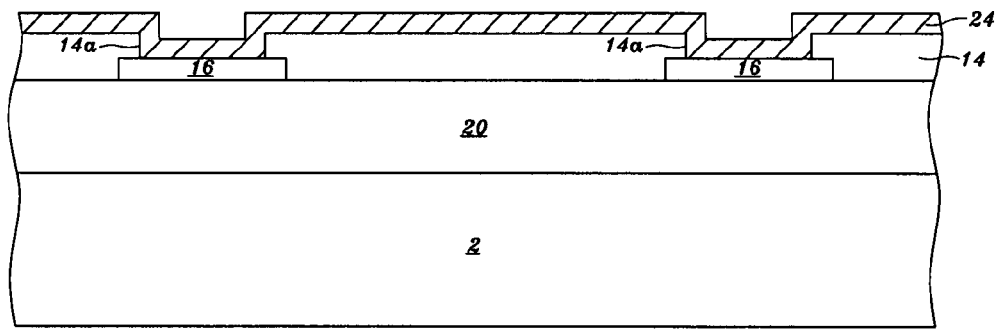
FIGS. 4A through 4G are cross-sectional views showing a process of forming a bonding pad over a pad exposed by an opening in a passivation layer.

Referring to FIG. 4A, an adhesion/barrier layer 24 having a thickness of between 0.01 and 0.7 μm, and preferably of between 0.03 and 0.7 μm, can be sputtered on the passivation layer 14 and on the pad 16, such as aluminum pad or copper pad, exposed by the opening 14a. The material of the adhesion/barrier layer 24 may include titanium, a titanium-tungsten alloy, titanium nitride, chromium, tantalum, tantalum nitride, an alloy of refractory metal, or a composite of the abovementioned materials. Alternatively, the adhesion/barrier layer 24 can be formed by an evaporation process.

For example, the adhesion/barrier layer 24 may be formed by sputtering a titanium layer with a thickness of between 0.01 and 0.7 μm, and preferably of between 0.03 and 0.7 μm, on the passivation layer 14 and on the pad 16, principally made of aluminum, exposed by the opening 14a. Alternatively, the adhesion/barrier layer 24 may be formed by sputtering a titanium-tungsten-alloy layer with a thickness of between 0.01 and 0.7 μm, and preferably of between 0.03 and 0.7 μm, on the passivation layer 14 and on the pad 16, principally made of aluminum, exposed by the opening 14a. Alternatively, the adhesion/barrier layer 24 may be formed by sputtering a titanium-nitride layer with a thickness of between 0.01 and 0.7 μm, and preferably of between 0.03 and 0.7 μm, on the passivation layer 14 and on the pad 16, principally made of aluminum, exposed by the opening 14a. Alternatively, the adhesion/barrier layer 24 may be formed by sputtering a chromium layer with a thickness of between 0.01 and 0.7 μm, and preferably of between 0.03 and 0.7 μm, on the passivation layer 14 and on the pad 16, principally made of aluminum, exposed by the opening 14a. Alternatively, the adhesion/barrier layer 24 may be formed by sputtering a tantalum-nitride layer with a thickness of between 0.01 and 0.7 μm, and preferably of between 0.03 and 0.7 μm, on the passivation layer 14 and on the pad 16, principally made of aluminum, exposed by the opening 14a. Alternatively, the adhesion/barrier layer 24 may be formed by sputtering a tantalum layer with a thickness of between 0.01 and 0.7 μm, and preferably of between 0.03 and 0.7 μm, on the passivation layer 14 and on the pad 16, principally made of aluminum, exposed by the opening 14a.

For example, the adhesion/barrier layer 24 may be formed by sputtering a titanium layer with a thickness of between 0.01 and 0.7 μm, and preferably of between 0.03 and 0.7 μm, on the passivation layer 14 and on the pad 16, principally made of copper, exposed by the opening 14a. Alternatively, the adhesion/barrier layer 24 may be formed by sputtering a titanium-tungsten-alloy layer with a thickness of between 0.01 and 0.7 μm, and preferably of between 0.03 and 0.7 μm, on the passivation layer 14 and on the pad 16, principally made of copper, exposed by the opening 14a. Alternatively, the adhesion/barrier layer 24 may be formed by sputtering a titanium-nitride layer with a thickness of between 0.01 and 0.7 μm, and preferably of between 0.03 and 0.7 μm, on the passivation layer 14 and on the pad 16, principally made of copper, exposed by the opening 14a. Alternatively, the adhesion/barrier layer 24 may be formed by sputtering a chromium layer with a thickness of between 0.01 and 0.7 μm, and preferably of between 0.03 and 0.7 μm, on the passivation layer 14 and on the pad 16, principally made of copper, exposed by the opening 14a. Alternatively, the adhesion/barrier layer 24 may be formed by sputtering a tantalum-nitride layer with a thickness of between 0.01 and 0.7 μm, and preferably of between 0.03 and 0.7 μm, on the passivation layer 14 and on the pad 16, principally made of copper, exposed by the opening 14a. Alternatively, the adhesion/barrier layer 24 may be formed by sputtering a tantalum layer with a thickness of between 0.01 and 0.7 μm, and preferably of between 0.03 and 0.7 μm, on the passivation layer 14 and on the pad 16, principally made of copper, exposed by the opening 14a.

Figure 4B:
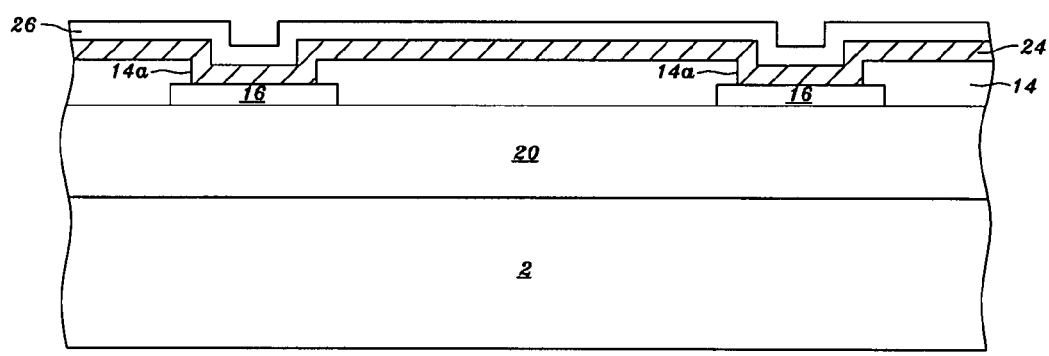

Referring to FIG. 4B, a seed layer 26 having a thickness of between 0.03 and 1 μm, and preferably of between 0.03 and 0.7 μm, can be sputtered on the adhesion/barrier layer 24. Alternatively, the seed layer 26 can be formed by a vapor deposition method, an electroless plating method or a PVD (Physical Vapor Deposition) method. The seed layer 26 is beneficial to electroplating a metal layer thereon. Thus, the material of the seed layer 26 varies with the material of the electroplated metal layer formed on the seed layer 26. When a gold layer is to be electroplated on the seed layer 26, gold is a preferable material to the seed layer 26. When a copper layer is to be electroplated on the seed layer 26, copper is a preferable material to the seed layer 26. When a palladium layer is to be electroplated on the seed layer 26, palladium is a preferable material to the seed layer 26.

For example, when the adhesion/barrier layer 24 is formed by sputtering a titanium layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the titanium layer. When the adhesion/barrier layer 24 is formed by sputtering a titanium-tungsten-alloy layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the titanium-tungsten-alloy layer. When the adhesion/barrier layer 24 is formed by sputtering a titanium-nitride layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the titanium-nitride layer. When the adhesion/barrier layer 24 is formed by sputtering a chromium layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the chromium layer. When the adhesion/barrier layer 24 is formed by sputtering a tantalum-nitride layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the tantalum-nitride layer. When the adhesion/barrier layer 24 is formed by sputtering a tantalum layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the tantalum layer.

For example, when the adhesion/barrier layer 24 is formed by sputtering a titanium layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the titanium layer. When the adhesion/barrier layer 24 is formed by sputtering a titanium-tungsten-alloy layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the titanium-tungsten-alloy layer. When the adhesion/barrier layer 24 is formed by sputtering a titanium-nitride layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the titanium-nitride layer. When the adhesion/barrier layer 24 is formed by sputtering a chromium layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the chromium layer. When the adhesion/barrier layer 24 is formed by sputtering a tantalum-nitride layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the tantalum-nitride layer. When the adhesion/barrier layer 24 is formed by sputtering a tantalum layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the tantalum layer.

For example, when the adhesion/barrier layer 24 is formed by sputtering a titanium layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the titanium layer. When the adhesion/barrier layer 24 is formed by sputtering a titanium-tungsten-alloy layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the titanium-tungsten-alloy layer. When the adhesion/barrier layer 24 is formed by sputtering a titanium-nitride layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the titanium-nitride layer. When the adhesion/barrier layer 24 is formed by sputtering a chromium layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the chromium layer. When the adhesion/barrier layer 24 is formed by sputtering a tantalum-nitride layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the tantalum-nitride layer. When the adhesion/barrier layer 24 is formed by sputtering a tantalum layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the tantalum layer.

Figure 4C:
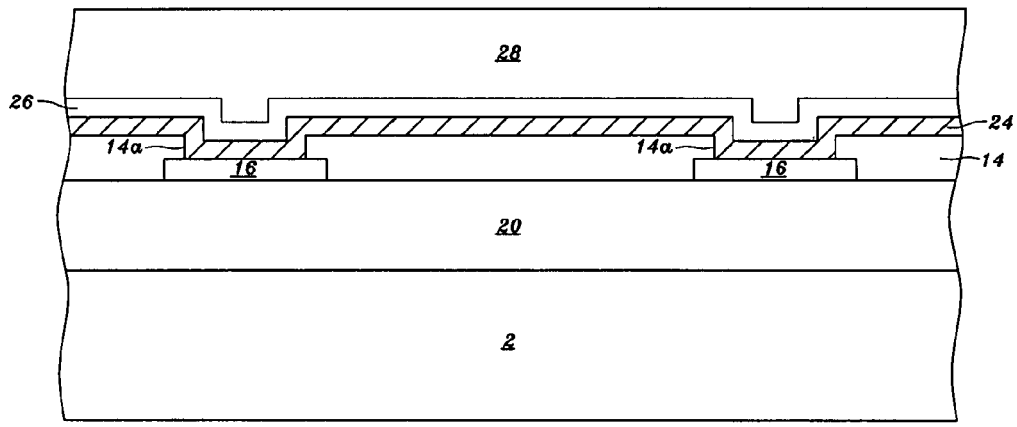
Figure 4D:
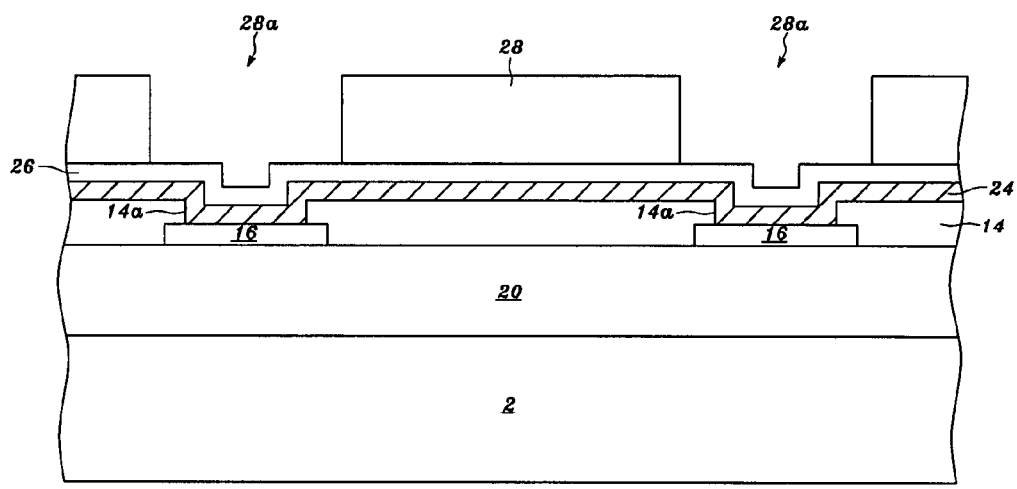

Referring to FIG. 4C, a photoresist layer 28, such as positive-type photoresist layer, having a thickness of between 1 and 25 μm, and preferably of between 3 and 10 μm, is spin-on coated on the seed layer 26. Referring to FIG. 4D, the photoresist layer 28 is patterned with the processes of exposure, development, etc., to form an opening 28a in the photoresist layer 28 exposing the seed layer 26 over the pad 16. A 1× stepper or 1× contact aligner can be used to expose the photoresist layer 28 during the process of exposure.

For example, the photoresist layer 28 can be formed by spin-on coating a positive-type photosensitive polymer layer having a thickness of between 1 and 25 μm, and preferably of between 3 and 10 μm, on the seed layer 26, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants form the seed layer 26 with an $O_2$ plasma or a plasma containing fluorine of below 200 PPM and oxygen, such that the photoresist layer 28 can be patterned with an opening 28a in the photoresist layer 28 exposing the seed layer 26 over the pad 16.

Figure 4E:
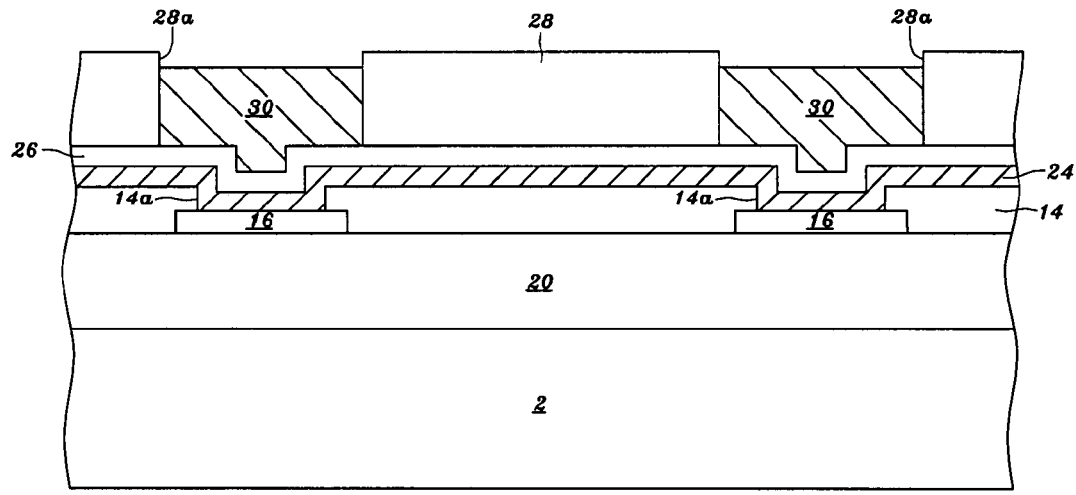

Referring to FIG. 4E, a metal layer 30 having a thickness of between 1 and 20 μm, and preferably of between 3 and 5 μm, can be electroplated and/or electroless plated over the seed layer 26 exposed by the opening 28a. The material of the metal layer 30 may include gold, copper, nickel or palladium.

For example, the metal layer 30 may be formed by electroplating a gold layer with a thickness of between 1 and 20 μm, such as between 3 and 5 μm or between 1 and 4 μm, on the seed layer 26, made of gold, exposed by the opening 28a. Alternatively, the metal layer 30 may be formed by electroplating a palladium layer with a thickness of between 1 and 20 μm, such as between 3 and 5 μm or between 1 and 4 μm, on the seed layer 26, made of palladium, exposed by the opening 28a. Alternatively, the metal layer 30 may be formed by electroplating a copper layer with a thickness of between 1 and 10 μm on the seed layer 26, made of copper, exposed by the opening 28a, then electroplating a nickel layer with a thickness of between 1 and 5 μm on the copper layer in the opening 28a, and then electroplating a gold layer with a thickness of between 1 and 5 μm on the nickel layer in the opening 28a, wherein the thickness of the copper layer, the nickel layer and the gold layer is between 1 and 20 μm, and preferably of between 3 and 5 μm. Alternatively, the metal layer 30 may be formed by electroplating a copper layer with a thickness of between 1 and 13 μm on the seed layer 26, made of copper, exposed by the opening 28a, then electroplating a nickel layer with a thickness of between 1 and 5 μm on the copper layer in the opening 28a, and then electroless plating a gold layer with a thickness of between 0.05 and 2 μm on the nickel layer in the opening 28a, wherein the thickness of the copper layer, the nickel layer and the gold layer is between 1 and 20 μm, and preferably of between 3 and 5 μm. Alternatively, the metal layer 30 may be formed by electroplating a copper layer with a thickness of between 1 and 10 μm on the seed layer 26, made of copper, exposed by the opening 28a, then electroplating a nickel layer with a thickness of between 1 and 5 μm on the copper layer in the opening 28a, and then electroplating a palladium layer with a thickness of between 1 and 5 μm on the nickel layer in the opening 28a, wherein the thickness of the copper layer, the nickel layer and the palladium layer is between 1 and 20 μm, and preferably of between 3 and 5 μm. Alternatively, the metal layer 30 may be formed by electroplating a copper layer with a thickness of between 1 and 13 μm on the seed layer 26, made of copper, exposed by the opening 28a, then electroplating a nickel layer with a thickness of between 1 and 5 μm on the copper layer in the opening 28a, and then electroless plating a palladium layer with a thickness of between 0.05 and 2 μm on the nickel layer in the opening 28a, wherein the thickness of the copper layer, the nickel layer and the palladium layer is between 1 and 20 μm, and preferably of between 3 and 5 μm.

Figure 4F:
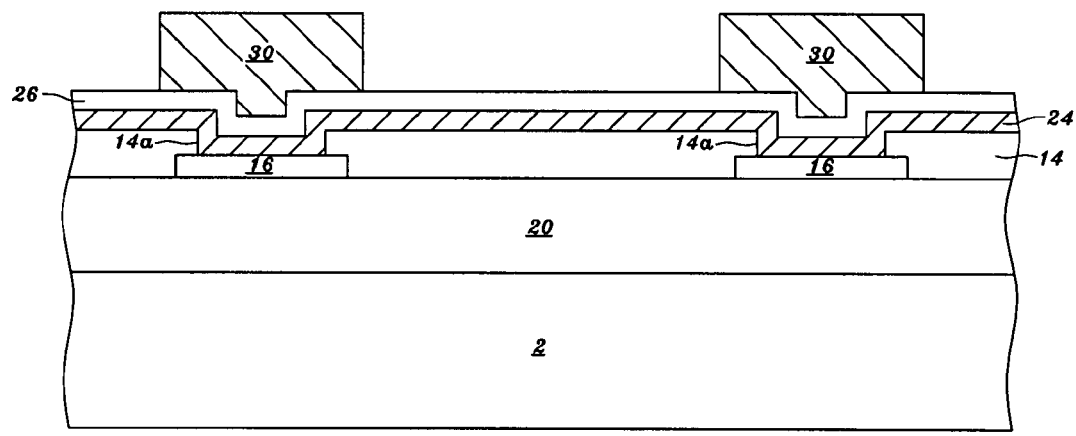

Referring to FIG. 4F, after the metal layer 30 is formed, most of the photoresist layer 28 can be removed using an organic solution with amide. However, some residuals from the photoresist layer 28 could remain on the metal layer 30 and on the seed layer 26. Thereafter, the residuals can be removed from the metal layer 30 and from the seed layer 26 with a plasma, such as $O_2$ plasma or plasma containing fluorine of below 200 PPM and oxygen.

Figure 4G:
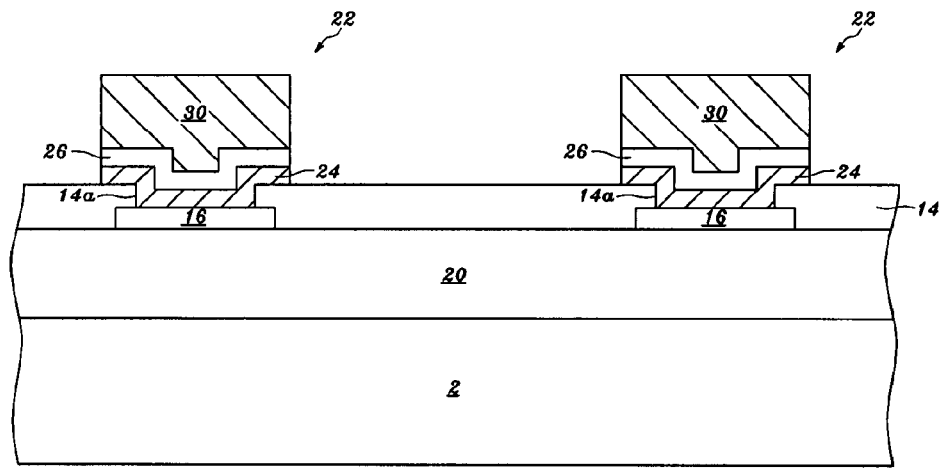

Referring to FIG. 4G, the seed layer 26 and the adhesion/barrier layer 24 not under the metal layer 30 are subsequently removed with a dry etching method or a wet etching method. As to the wet etching method, when the seed layer 26 is a gold layer, it can be etched with an iodine-containing solution, such as solution containing potassium iodide; when the seed layer 26 is a copper layer, it can be etched with a solution containing $NH_4OH$; when the adhesion/barrier layer 24 is a titanium-tungsten-alloy layer, it can be etched with a solution containing hydrogen peroxide; when the adhesion/barrier layer 24 is a titanium layer, it can be etched with a solution containing hydrogen fluoride; when the adhesion/barrier layer 24 is a chromium layer, it can be etched with a solution containing potassium ferricyanide. As to the dry etching method, when the seed layer 26 is a gold layer, it can be removed with an ion milling process or with an Ar sputtering etching process; when the adhesion/barrier layer 24 is a titanium layer or a titanium-tungsten-alloy layer, it can be etched with a chlorine-containing plasma etching process or with an RIE process. Generally, the dry etching method to etch the seed layer 26 and the adhesion/barrier layer 24 not under the metal layer 30 may include a chemical plasma etching process, a sputtering etching process, such as argon sputter process, or a chemical vapor etching process.

Thereby, in the present invention, the bonding pad 22 can be formed on the pad 16 exposed by the opening 14a. The bonding pad 22 can be formed of the adhesion/barrier layer 24, the seed layer 26 on the adhesion/barrier layer 24 and the electroplated metal layer 30 on the seed layer 26. The material of bonding pad 22 may comprise titanium, titanium-tungsten alloy, titanium nitride, chromium, tantalum nitride, tantalum, gold, copper, palladium or nickel. Based on the above teaching, the bonding pad 22 may include the following fashions.

For example, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of gold, having a thickness of between 0.03 and 1 μm, and preferably of between 0.03 and 0.7 μm, on the titanium-containing layer, and an electroplated gold layer having a thickness of between 1 and 20 μm, such as between 3 and 5 μm or between 1 and 4 μm, on the sputtered seed layer. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of palladium, having a thickness of between 0.03 and 1 μm, and preferably of between 0.03 and 0.7 μm, on the titanium-containing layer, and an electroplated palladium layer having a thickness of between 1 and 20 μm, such as between 3 and 5 μm or between 1 and 4 μm, on the sputtered seed layer. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the titanium-containing layer, an electroplated copper layer having a thickness of between 1 and 10 μm on the sputtered seed layer, an electroplated nickel layer having a thickness of between 1 and 5 μm on the electroplated copper layer, and an electroplated gold layer having a thickness of between 1 and 5 μm on the electroplated nickel layer, wherein the thickness of the electroplated copper layer, the electroplated nickel layer and the electroplated gold layer is between 1 and 20 μm, and preferably of between 3 and 5 μm. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the titanium-containing layer, an electroplated copper layer having a thickness of between 1 and 13 μm on the sputtered seed layer, an electroplated nickel layer having a thickness of between 1 and 5 μm on the electroplated copper layer, and an electroless plated gold layer having a thickness of between 0.05 and 2 μm on the electroplated nickel layer, wherein the thickness of the electroplated copper layer, the electroplated nickel layer and the electroless plated gold layer is between 1 and 20 μm, and preferably of between 3 and 5 μm. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the titanium-containing layer, an electroplated copper layer having a thickness of between 1 and 10 μm on the sputtered seed layer, an electroplated nickel layer having a thickness of between 1 and 5 μm on the electroplated copper layer, and an electroplated palladium layer having a thickness of between 1 and 5 μm on the electroplated nickel layer, wherein the thickness of the electroplated copper layer, the electroplated nickel layer and the electroplated palladium layer is between 1 and 20 μm, and preferably of between 3 and 5 μm. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the titanium-containing layer, an electroplated copper layer having a thickness of between 1 and 13 μm on the sputtered seed layer, an electroplated nickel layer having a thickness of between 1 and 5 μm on the electroplated copper layer, and an electroless plated palladium layer having a thickness of between 0.05 and 2 μm on the electroplated nickel layer, wherein the thickness of the electroplated copper layer, the electroplated nickel layer and the electroless plated palladium layer is between 1 and 20 μm, and preferably of between 3 and 5 μm.

For example, the bonding pad 22 may be formed of a chromium layer having a thickness of between 0.01 and 0.7 μm, and preferably of between 0.03 and 0.7 μm, on the pad 16, principally made of copper, typically called a copper pad, exposed by the opening 14a, a sputtered seed layer, made of gold, having a thickness of between 0.03 and 1 μm, and preferably of between 0.03 and 0.7 μm, on the chromium layer, and an electroplated gold layer having a thickness of between 1 and 20 μm, such as between 3 and 5 μm or between 1 and 4 μm, on the sputtered seed layer. Alternatively, the bonding pad 22 may be formed of a chromium layer having a thickness of between 0.01 and 0.7 μm, and preferably of between 0.03 and 0.7 μm, on the pad 16, principally made of copper, typically called a copper pad, exposed by the opening 14a, a sputtered seed layer, made of palladium, having a thickness of between 0.03 and 1 μm, and preferably of between 0.03 and 0.7 μm, on the chromium layer, and an electroplated palladium layer having a thickness of between 1 and 20 μm, such as between 3 and 5 μm or between 1 and 4 μm, on the sputtered seed layer. Alternatively, the bonding pad 22 may be formed of a chromium layer having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the chromium layer, an electroplated copper layer having a thickness of between 1 and 10 μm on the sputtered seed layer, an electroplated nickel layer having a thickness of between 1 and 5 μm on the electroplated copper layer, and an electroplated gold layer having a thickness of between 1 and 5 μm on the electroplated nickel layer, wherein the thickness of the electroplated copper layer, the electroplated nickel layer and the electroplated gold layer is between 1 and 20 μm, and preferably of between 3 and 5 μm. Alternatively, the bonding pad 22 may be formed of a chromium layer having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the chromium layer, an electroplated copper layer having a thickness of between 1 and 13 μm on the sputtered seed layer, an electroplated nickel layer having a thickness of between 1 and 5 μm on the electroplated copper layer, and an electroless plated gold layer having a thickness of between 0.05 and 2 μm on the electroplated nickel layer, wherein the thickness of the electroplated copper layer, the electroplated nickel layer and the electroless plated gold layer is between 1 and 20 μm, and preferably of between 3 and 5 μm. Alternatively, the bonding pad 22 may be formed of a chromium layer having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the chromium layer, an electroplated copper layer having a thickness of between 1 and 10 μm on the sputtered seed layer, an electroplated nickel layer having a thickness of between 1 and 5 μm on the electroplated copper layer, and an electroplated palladium layer having a thickness of between 1 and 5 μm on the electroplated nickel layer, wherein the thickness of the electroplated copper layer, the electroplated nickel layer and the electroplated palladium layer is between 1 and 20 μm, and preferably of between 3 and 5 μm. Alternatively, the bonding pad 22 may be formed of a chromium layer having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the chromium layer, an electroplated copper layer having a thickness of between 1 and 13 μm on the sputtered seed layer, an electroplated nickel layer having a thickness of between 1 and 5 μm on the electroplated copper layer, and an electroless plated palladium layer having a thickness of between 0.05 and 2 μm on the electroplated nickel layer, wherein the thickness of the electroplated copper layer, the electroplated nickel layer and the electroless plated palladium layer is between 1 and 20 μm, and preferably of between 3 and 5 μm.

For example, the bonding pad 22 may be formed of a tantalum-containing layer, such as tantalum layer or tantalum-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of gold, having a thickness of between 0.03 and 1 μm, and preferably of between 0.03 and 0.7 μm, on the tantalum-containing layer, and an electroplated gold layer having a thickness of between 1 and 20 μm, such as between 3 and 5 μm or between 1 and 4 μm, on the sputtered seed layer. Alternatively, the bonding pad 22 may be formed of a tantalum-containing layer, such as tantalum layer or tantalum-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of palladium, having a thickness of between 0.03 and 1 μm, and preferably of between 0.03 and 0.7 μm, on the tantalum-containing layer, and an electroplated palladium layer having a thickness of between 1 and 20 μm, such as between 3 and 5 μm or between 1 and 4 μm, on the sputtered seed layer. Alternatively, the bonding pad 22 may be formed of a tantalum-containing layer, such as tantalum layer or tantalum-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the tantalum-containing layer, an electroplated copper layer having a thickness of between 1 and 10 μm on the sputtered seed layer, an electroplated nickel layer having a thickness of between 1 and 5 μm on the electroplated copper layer, and an electroplated gold layer having a thickness of between 1 and 5 μm on the electroplated nickel layer, wherein the thickness of the electroplated copper layer, the electroplated nickel layer and the electroplated gold layer is between 1 and 20 μm, and preferably of between 3 and 5 μm. Alternatively, the bonding pad 22 may be formed of a tantalum-containing layer, such as tantalum layer or tantalum-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the tantalum-containing layer, an electroplated copper layer having a thickness of between 1 and 13 μm on the sputtered seed layer, an electroplated nickel layer having a thickness of between 1 and 5 μm on the electroplated copper layer, and an electroless plated gold layer having a thickness of between 0.05 and 2 μm on the electroplated nickel layer, wherein the thickness of the electroplated copper layer, the electroplated nickel layer and the electroless plated gold layer is between 1 and 20 μm, and preferably of between 3 and 5 μm. Alternatively, the bonding pad 22 may be formed of a tantalum-containing layer, such as tantalum layer or tantalum-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the tantalum-containing layer, an electroplated copper layer having a thickness of between 1 and 10 μm on the sputtered seed layer, an electroplated nickel layer having a thickness of between 1 and 5 μm on the electroplated copper layer, and an electroplated palladium layer having a thickness of between 1 and 5 μm on the electroplated nickel layer, wherein the thickness of the electroplated copper layer, the electroplated nickel layer and the electroplated palladium layer is between 1 and 20 μm, and preferably of between 3 and 5 μm. Alternatively, the bonding pad 22 may be formed of a tantalum-containing layer, such as tantalum layer or tantalum-nitride layer, having a thickness of between 0.01 and 0.7 μm, and preferably of between 0.03 and 0.7 μm, on the pad 16, principally made of copper, typically called a copper pad, exposed by the opening 14a, a sputtered seed layer, made of copper, having a thickness of between 0.03 and 1 μm, and preferably of between 0.03 and 0.7 μm, on the tantalum-containing layer, an electroplated copper layer having a thickness of between 1 and 13 μm on the sputtered seed layer, an electroplated nickel layer having a thickness of between 1 and 5 μm on the electroplated copper layer, and an electroless plated palladium layer having a thickness of between 0.05 and 2 μm on the electroplated nickel layer, wherein the thickness of the electroplated copper layer, the electroplated nickel layer and the electroless plated palladium layer is between 1 and 20 μm, and preferably of between 3 and 5 μm.

For example, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of aluminum, typically called an aluminum pad, exposed by the opening 14a, a sputtered seed layer, made of gold, having a thickness of between 0.03 and 1 μm, and preferably of between 0.03 and 0.7 μm, on the titanium-containing layer, and an electroplated gold layer having a thickness of between 1 and 20 μm, such as between 3 and 5 μm or between 1 and 4 μm, on the sputtered seed layer. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of aluminum, typically called an aluminum pad, exposed by the opening 14a, a sputtered seed layer, made of palladium, having a thickness of between 0.03 and 1 μm, and preferably of between 0.03 and 0.7 μm, on the titanium-containing layer, and an electroplated palladium layer having a thickness of between 1 and 20 μm, such as between 3 and 5 μm or between 1 and 4 μm, on the sputtered seed layer. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of aluminum, typically called an aluminum pad, exposed by the opening 14a, a sputtered seed layer, made of copper, having a thickness of between 0.03 and 1 μm, and preferably of between 0.03 and 0.7 μm, on the titanium-containing layer, an electroplated copper layer having a thickness of between 1 and 10 μm on the sputtered seed layer, an electroplated nickel layer having a thickness of between 1 and 5 μm on the electroplated copper layer, and an electroplated gold layer having a thickness of between 1 and 5 μm on the electroplated nickel layer, wherein the thickness of the electroplated copper layer, the electroplated nickel layer and the electroplated gold layer is between 1 and 20 μm, and preferably of between 3 and 5 μm. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of aluminum, typically called an aluminum pad, exposed by the opening 14a, a sputtered seed layer, made of copper, having a thickness of between 0.03 and preferably of between 0.03 and 0.7 μm, on the titanium-containing layer, an electroplated copper layer having a thickness of between 1 and 13 μm on the sputtered seed layer, an electroplated nickel layer having a thickness of between 1 and 5 μm on the electroplated copper layer, and an electroless plated gold layer having a thickness of between 0.05 and 2 μm on the electroplated nickel layer, wherein the thickness of the electroplated copper layer, the electroplated nickel layer and the electroless plated gold layer is between 1 and 20 μm, and preferably of between 3 and 5 μm. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of aluminum, typically called an aluminum pad, exposed by the opening 14a, a sputtered seed layer, made of copper, having a thickness of between 0.03 and 1 μm, and preferably of between 0.03 and 0.7 μm, on the titanium-containing layer, an electroplated copper layer having a thickness of between 1 and 10 μm on the sputtered seed layer, an electroplated nickel layer having a thickness of between 1 and 5 μm on the electroplated copper layer, and an electroplated palladium layer having a thickness of between 1 and 5 μm on the electroplated nickel layer, wherein the thickness of the electroplated copper layer, the electroplated nickel layer and the electroplated palladium layer is between 1 and 20 μm, and preferably of between 3 and 5 μm. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the pad 16, principally made of aluminum, typically called an aluminum pad, exposed by the opening 14a, a sputtered seed layer, made of copper, having a thickness of between 0.03 and 1 µm, and preferably of between 0.03 and 0.7 µm, on the titanium-containing layer, an electroplated copper layer having a thickness of between 1 and 13 µm on the sputtered seed layer, an electroplated nickel layer having a thickness of between 1 and 5 µm on the electroplated copper layer, and an electroless plated palladium layer having a thickness of between 0.05 and 2 µm on the electroplated nickel layer, wherein the thickness of the electroplated copper layer, the electroplated nickel layer and the electroless plated palladium layer is between 1 and 20 µm, and preferably of between 3 and 5 µm.

For example, the bonding pad 22 may be formed of a chromium layer having a thickness of between 0.01 and 0.7 µm, and preferably of between 0.03 and 0.7 µm, on the pad 16, principally made of aluminum, typically called an aluminum pad, exposed by the opening 14a, a sputtered seed layer, made of gold, having a thickness of between 0.03 and fpm, and preferably of between 0.03 and 0.7 µm, on the chromium layer, and an electroplated gold layer having a thickness of between 1 and 20 µm, such as between 3 and 5 µm or between 1 and 4 µm, on the sputtered seed layer. Alternatively, the bonding pad 22 may be formed of a chromium layer having a thickness of between 0.01 and 0.7 µm, and preferably of between 0.03 and 0.7 µm, on the pad 16, principally made of aluminum, typically called an aluminum pad, exposed by the opening 14a, a sputtered seed layer, made of palladium, having a thickness of between 0.03 and 1 µm, and preferably of between 0.03 and 0.7 µm, on the chromium layer, and an electroplated palladium layer having a thickness of between 1 and 20 µm, such as between 3 and 5 µm or between 1 and 4 µm, on the sputtered seed layer. Alternatively, the bonding pad 22 may be formed of a chromium layer having a thickness of between 0.01 and 0.7 µm, and preferably of between 0.03 and 0.7 µm, on the pad 16, principally made of aluminum, typically called an aluminum pad, exposed by the opening 14a, a sputtered seed layer, made of copper, having a thickness of between 0.03 and 1 µm, and preferably of between 0.03 and 0.7 µm, on the chromium layer, an electroplated copper layer having a thickness of between 1 and 10 µm on the sputtered seed layer, an electroplated nickel layer having a thickness of between 1 and 5 µm on the electroplated copper layer, and an electroplated gold layer having a thickness of between 1 and 5 µm on the electroplated nickel layer, wherein the thickness of the electroplated copper layer, the electroplated nickel layer and the electroplated gold layer is between 1 and 20 µm, and preferably of between 3 and 5 µm. Alternatively, the bonding pad 22 may be formed of a chromium layer having a thickness of between 0.01 and 0.7 µm, and preferably of between 0.03 and 0.7 µm, on the pad 16, principally made of aluminum, typically called an aluminum pad, exposed by the opening 14a, a sputtered seed layer, made of copper, having a thickness of between 0.03 and 1 µm, and preferably of between 0.03 and 0.7 µm, on the chromium layer, an electroplated copper layer having a thickness of between 1 and 13 µm on the sputtered seed layer, an electroplated nickel layer having a thickness of between 1 and 5 µm on the electroplated copper layer, and an electroless plated gold layer having a thickness of between 1 and 5 µm on the electroplated nickel layer, wherein the thickness of the electroplated copper layer, the electroplated nickel layer and the electroless plated gold layer is between 1 and 20 µm, and preferably of between 3 and 5 µm. Alternatively, the bonding pad 22 may be formed of a chromium layer having a thickness of between 0.01 and 0.7 µm, and preferably of between 0.03 and 0.7 µm, on the pad 16, principally made of aluminum, typically called an aluminum pad, exposed by the opening 14a, a sputtered seed layer, made of copper, having a thickness of between 0.03 and 1 µm, and preferably of between 0.03 and 0.7 µm, on the chromium layer, an electroplated copper layer having a thickness of between 1 and 10 µm on the sputtered seed layer, an electroplated nickel layer having a thickness of between 1 and 5 µm on the electroplated copper layer, and an electroplated palladium layer having a thickness of between 1 and 5 µm on the electroplated nickel layer, wherein the thickness of the electroplated copper layer, the electroplated nickel layer and the electroplated palladium layer is between 1 and 20 µm, and preferably of between 3 and 5 µm. Alternatively, the bonding pad 22 may be formed of a chromium layer having a thickness of between 0.01 and 0.7 µm, and preferably of between 0.03 and 0.7 µm, on the pad 16, principally made of aluminum, typically called an aluminum pad, exposed by the opening 14a, a sputtered seed layer, made of copper, having a thickness of between 0.03 and 1 µm, and preferably of between 0.03 and 0.7 µm, on the chromium layer, an electroplated copper layer having a thickness of between 1 and 13 µm on the sputtered seed layer, an electroplated nickel layer having a thickness of between 1 and 5 µm on the electroplated copper layer, and an electroless plated palladium layer having a thickness of between 0.05 and 2 µm on the electroplated nickel layer, wherein the thickness of the electroplated copper layer, the electroplated nickel layer and the electroless plated palladium layer is between 1 and 20 µm, and preferably of between 3 and 5 µm.

For example, the bonding pad 22 may be formed of a tantalum-containing layer, such as tantalum layer or tantalum-nitride layer, having a thickness of between 0.01 and 0.7 µm, and preferably of between 0.03 and 0.7 µm, on the pad 16, principally made of aluminum, typically called an aluminum pad, exposed by the opening 14a, a sputtered seed layer, made of gold, having a thickness of between 0.03 and 1 µm, and preferably of between 0.03 and 0.7 µm, on the tantalum-containing layer, and an electroplated gold layer having a thickness of between 1 and 20 µm, such as between 3 and 5 µm or between 1 and 4 µm, on the sputtered seed layer. Alternatively, the bonding pad 22 may be formed of a tantalum-containing layer, such as tantalum layer or tantalum-nitride layer, having a thickness of between 0.01 and 0.7 µm, and preferably of between 0.03 and 0.7 µm, on the pad 16, principally made of aluminum, typically called an aluminum pad, exposed by the opening 14a, a sputtered seed layer, made of palladium, having a thickness of between 0.03 and 1 µm, and preferably of between 0.03 and 0.7 µm, on the tantalum-containing layer, and an electroplated palladium layer having a thickness of between 1 and 20 µm, such as between 3 and 5 µm or between 1 and 4 µm, on the sputtered seed layer. Alternatively, the bonding pad 22 may be formed of a tantalum-containing layer, such as tantalum layer or tantalum-nitride layer, having a thickness of between 0.01 and 0.7 µm, and preferably of between 0.03 and 0.7 µm, on the pad 16, principally made of aluminum, typically called an aluminum pad, exposed by the opening 14a, a sputtered seed layer, made of copper, having a thickness of between 0.03 and 1 µm, and preferably of between 0.03 and 0.7 µm, on the tantalum-containing layer, an electroplated copper layer having a thickness of between 1 and 10 µm on the sputtered seed layer, an electroplated nickel layer having a thickness of between 1 and 5 µm on the electroplated copper layer, and an electroplated gold layer having a thickness of between 1 and 5 µm on the electroplated nickel layer, wherein the thickness of the electroplated copper layer, the electroplated nickel layer and the electroplated gold layer is between 1 and 20 µm, and preferably of between 3 and 5 µm. Alternatively, the bonding pad 22 may be formed of a tantalum-containing layer, such as tantalum layer or tantalum-nitride layer, having a thickness of between 0.01 and 0.7 μm, and preferably of between 0.03 and 0.7 μm, on the pad 16, principally made of aluminum, typically called an aluminum pad, exposed by the opening 14a, a sputtered seed layer, made of copper, having a thickness of between 0.03 and 1 μm, and preferably of between 0.03 and 0.7 μm, on the tantalum-containing layer, an electroplated copper layer having a thickness of between 1 and 13 μm on the sputtered seed layer, an electroplated nickel layer having a thickness of between 1 and 5 μm on the electroplated copper layer, and an electroless plated gold layer having a thickness of between 0.05 and 2 μm on the electroplated nickel layer, wherein the thickness of the electroplated copper layer, the electroplated nickel layer and the electroless plated gold layer is between 1 and 20 μm, and preferably of between 3 and 5 μm. Alternatively, the bonding pad 22 may be formed of a tantalum-containing layer, such as tantalum layer or tantalum-nitride layer, having a thickness of between 0.01 and 0.7 μm, and preferably of between 0.03 and 0.7 μm, on the pad 16, principally made of aluminum, typically called an aluminum pad, exposed by the opening 14a, a sputtered seed layer, made of copper, having a thickness of between 0.03 and 1 μm, and preferably of between 0.03 and 0.7 μm, on the tantalum-containing layer, an electroplated copper layer having a thickness of between 1 and 10 μm on the sputtered seed layer, an electroplated nickel layer having a thickness of between 1 and 5 μm on the electroplated copper layer, and an electroplated palladium layer having a thickness of between 1 and 5 μm on the electroplated nickel layer, wherein the thickness of the electroplated copper layer, the electroplated nickel layer and the electroplated palladium layer is between 1 and 20 μm, and preferably of between 3 and 5 μm. Alternatively, the bonding pad 22 may be formed of a tantalum-containing layer, such as tantalum layer or tantalum-nitride layer, having a thickness of between 0.01 and 0.7 μm, and preferably of between 0.03 and 0.7 μm, on the pad 16, principally made of aluminum, typically called an aluminum pad, exposed by the opening 14a, a sputtered seed layer, made of copper, having a thickness of between 0.03 and 1 μm, and preferably of between 0.03 and 0.7 μm, on the tantalum-containing layer, an electroplated copper layer having a thickness of between 1 and 13 μm on the sputtered seed layer, an electroplated nickel layer having a thickness of between 1 and 5 μm on the electroplated copper layer, and an electroless plated palladium layer having a thickness of between 0.05 and 2 μm on the electroplated nickel layer, wherein the thickness of the electroplated copper layer, the electroplated nickel layer and the electroless plated palladium layer is between 1 and 20 μm, and preferably of between 3 and 5 μm.

After a semiconductor wafer is formed with the bonding pad 22, the semiconductor wafer can be diced into a plurality of individual semiconductor chips 23, IC (integrated circuit) chips, as shown in FIG. 3.

Figure 5A:
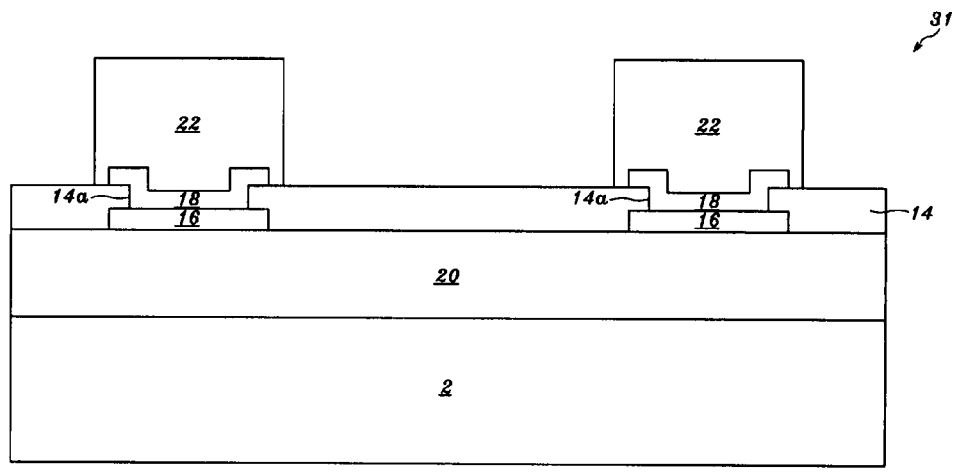
FIGS. 5A and 5B are cross-sectional views showing a semiconductor chip with a bonding pad on a metal cap according to the present invention.
Figure 5B:
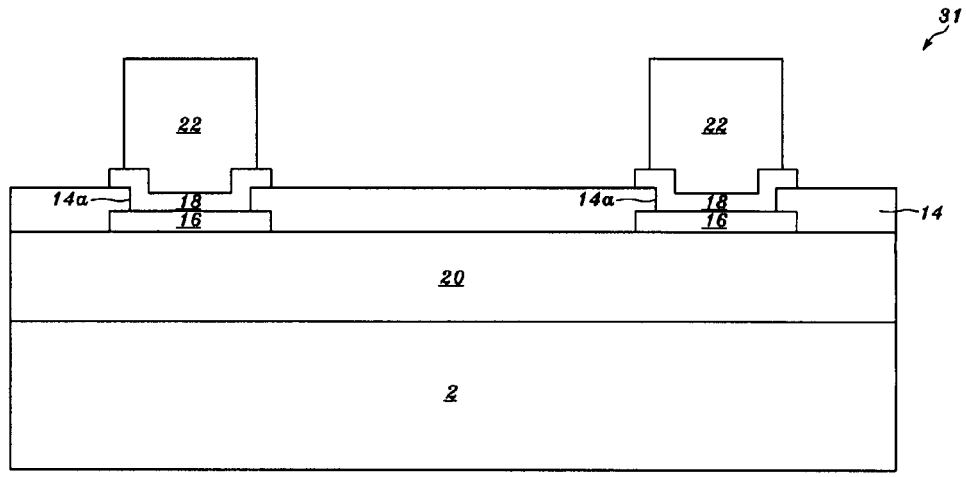

Referring to FIGS. 5A and 5B, in the present invention, a bonding pad 22 having a thickness of between 1 and 20 μm, and preferably of between 3 and 5 μm, can be formed on the metal cap 18. The metal cap 18 may comprise a tantalum-containing layer, such as tantalum layer or tantalum-nitride layer, having a thickness of between 0.01 and 0.7 μm on the pad 16, such as copper pad, exposed by the opening 14a, and an aluminum-containing layer, such as aluminum layer, aluminum-copper-alloy layer or Al—Si—Cu alloy layer, having a thickness of between 0.4 and 2 μm on the tantalum-containing layer. The bonding pad 22 may be used to be bonded with a wire, such as gold wire. The bonding pad 22 may be formed on the entire upper surface of the metal cap 18 and on the upper surface of the passivation layer 14 near the metal cap 18, as shown in FIG. 5A. Alternatively, the bonding pad 22 may be formed on a portion of a top surface of the metal cap 18, as shown in FIG. 5B. A method of forming the bonding pad 22 on the metal cap 18 can be referred to FIGS. 6A-6G. FIGS. 6A-6G illustrate a process for forming the bonding pad 22 shown in FIG. 5A on the metal cap 18. Alternatively, the illustrations of FIGS. 6A-6G can be applied to a process for forming the bonding pad 22 shown in FIG. 5B on the metal cap 18. After a semiconductor wafer is formed with the bonding pad 22, the semiconductor wafer can be separated into multiple individual semiconductor chips 31, integrated circuit chips, by a laser cutting process or by a mechanical cutting process.

Figure 6A:
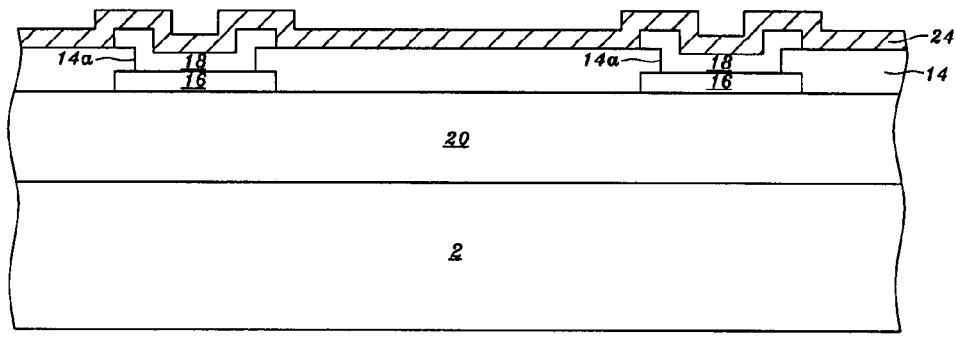
FIGS. 6A through 6G are cross-sectional views showing a process of forming a bonding pad over a metal cap.

Referring to FIG. 6A, an adhesion/barrier layer 24 having a thickness of between 0.01 and 0.7 μm, and preferably of between 0.03 and 0.7 μm, can be sputtered on the passivation layer 14 and on the metal cap 18, wherein the metal cap 18 may comprise a tantalum-containing layer, such as tantalum layer or tantalum-nitride layer, having a thickness of between 0.01 and 0.7 μm on the pad 16, such as copper pad, exposed by the opening 14a, and an aluminum-containing layer, such as aluminum layer, aluminum-copper-alloy layer or Al—Si—Cu alloy layer, having a thickness of between 0.4 and 2 μm on the tantalum-containing layer. The material of the adhesion/barrier layer 24 may include titanium, a titanium-tungsten alloy, titanium nitride, chromium, tantalum, tantalum nitride, an alloy of refractory metal, or a composite of the abovementioned materials. Alternatively, the adhesion/barrier layer 24 can be formed by an evaporation process.

For example, the adhesion/barrier layer 24 may be formed by sputtering a titanium layer with a thickness of between 0.01 and 0.7 μm, and preferably of between 0.03 and 0.7 μm, on the passivation layer 14 and on the aluminum-containing layer of the metal cap 18. Alternatively, the adhesion/barrier layer 24 may be formed by sputtering a titanium-tungsten-alloy layer with a thickness of between 0.01 and 0.7 μm, and preferably of between 0.03 and 0.7 μm, on the passivation layer 14 and on the aluminum-containing layer of the metal cap 18. Alternatively, the adhesion/barrier layer 24 may be formed by sputtering a titanium-nitride layer with a thickness of between 0.01 and 0.7 μm, and preferably of between 0.03 and 0.7 μm, on the passivation layer 14 and on the aluminum-containing layer of the metal cap 18. Alternatively, the adhesion/barrier layer 24 may be formed by sputtering a chromium layer with a thickness of between 0.01 and 0.7 μm, and preferably of between 0.03 and 0.7 μm, on the passivation layer 14 and on the aluminum-containing layer of the metal cap 18. Alternatively, the adhesion/barrier layer 24 may be formed by sputtering a tantalum-nitride layer with a thickness of between 0.01 and 0.7 μm, and preferably of between 0.03 and 0.7 μm, on the passivation layer 14 and on the aluminum-containing layer of the metal cap 18. Alternatively, the adhesion/barrier layer 24 may be formed by sputtering a tantalum layer with a thickness of between 0.01 and 0.7 μm, and preferably of between 0.03 and 0.7 μm, on the passivation layer 14 and on the aluminum-containing layer of the metal cap 18. Alternatively, the adhesion/barrier layer 24 may be formed by sputtering a tantalum layer with a thickness of between 0.01 and 0.7 μm, and preferably of between 0.03 and 0.7 μm, on the passivation layer 14 and on the aluminum-containing layer of the metal cap 18.

Figure 6B:
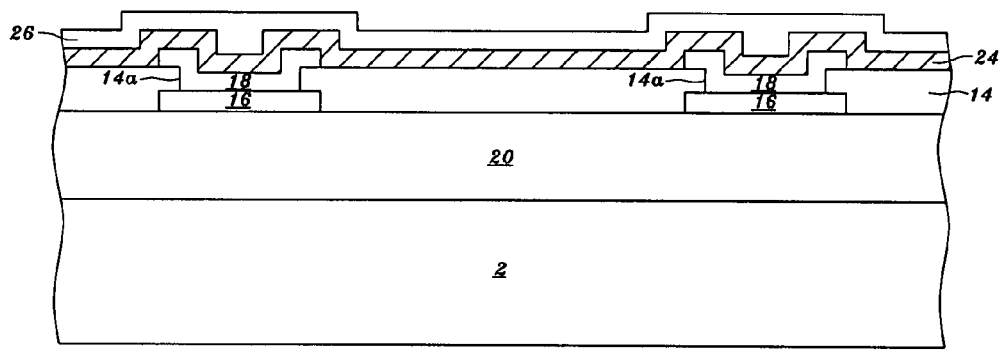

Referring to FIG. 6B, a seed layer 26 having a thickness of between 0.03 and 1 μm, and preferably of between 0.03 and 0.7 μm, can be sputtered on the adhesion/barrier layer 24. Alternatively, the seed layer 26 can be formed by a vapor deposition method, an electroless plating method or a PVD (Physical Vapor Deposition) method. The seed layer 26 is beneficial to electroplating a metal layer thereon. Thus, the material of the seed layer 26 varies with the material of the electroplated metal layer formed on the seed layer 26. When a gold layer is to be electroplated on the seed layer 26, gold is a preferable material to the seed layer 26. When a copper layer is to be electroplated on the seed layer 26, copper is a preferable material to the seed layer 26. When a palladium layer is to be electroplated on the seed layer 26, palladium is a preferable material to the seed layer 26.

For example, when the adhesion/barrier layer 24 is formed by sputtering a titanium layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the titanium layer. When the adhesion/barrier layer 24 is formed by sputtering a titanium-tungsten-alloy layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the titanium-tungsten-alloy layer. When the adhesion/barrier layer 24 is formed by sputtering a titanium-nitride layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the titanium-nitride layer. When the adhesion/barrier layer 24 is formed by sputtering a chromium layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the chromium layer. When the adhesion/barrier layer 24 is formed by sputtering a tantalum-nitride layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the tantalum-nitride layer. When the adhesion/barrier layer 24 is formed by sputtering a tantalum layer with a thickness of between 0.01 and 0.7 μm, and preferably of between 0.03 and 0.7 μm, the seed layer 26 can be formed by sputtering a gold layer with a thickness of between 0.03 and 1 μm, and preferably of between 0.03 and 0.7 μm, on the tantalum layer.

For example, when the adhesion/barrier layer 24 is formed by sputtering a titanium layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the titanium layer. When the adhesion/barrier layer 24 is formed by sputtering a titanium-tungsten-alloy layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the titanium-tungsten-alloy layer. When the adhesion/barrier layer 24 is formed by sputtering a titanium-nitride layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the titanium-nitride layer. When the adhesion/barrier layer 24 is formed by sputtering a chromium layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the chromium layer. When the adhesion/barrier layer 24 is formed by sputtering a tantalum-nitride layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the tantalum-nitride layer. When the adhesion/barrier layer 24 is formed by sputtering a tantalum layer with a thickness of between 0.01 and 0.7 μm, and preferably of between 0.03 and 0.7 μm, the seed layer 26 can be formed by sputtering a copper layer with a thickness of between 0.03 and 1 μm, and preferably of between 0.03 and 0.7 μm, on the tantalum layer.

For example, when the adhesion/barrier layer 24 is formed by sputtering a titanium layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the titanium layer. When the adhesion/barrier layer 24 is formed by sputtering a titanium-tungsten-alloy layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the titanium-tungsten-alloy layer. When the adhesion/barrier layer 24 is formed by sputtering a titanium-nitride layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the titanium-nitride layer. When the adhesion/barrier layer 24 is formed by sputtering a chromium layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the chromium layer. When the adhesion/barrier layer 24 is formed by sputtering a tantalum-nitride layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the tantalum-nitride layer. When the adhesion/barrier layer 24 is formed by sputtering a tantalum layer with a thickness of between 0.01 and 0.7 μm, and preferably of between 0.03 and 0.7 μm, the seed layer 26 can be formed by sputtering a palladium layer with a thickness of between 0.03 and 1 μm, and preferably of between 0.03 and 0.7 μm, on the tantalum layer.

Figure 6C:
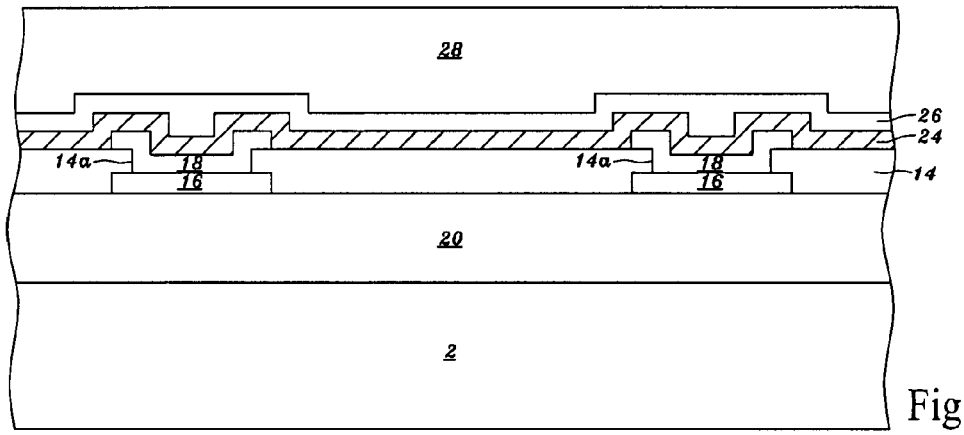
Figure 6D:
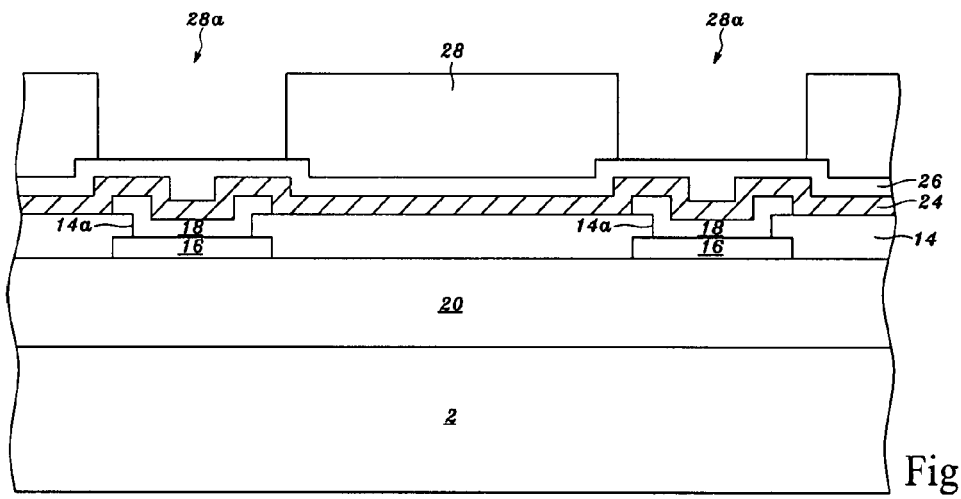

Referring to FIG. 6C, a photoresist layer 28, such as positive-type photoresist layer, having a thickness of between 1 and 25 μm, and preferably of between 3 and 10 μm, is spin-on coated on the seed layer 26. Referring to FIG. 6D, the photoresist layer 28 is patterned with the processes of exposure, development, etc., to form an opening 28a in the photoresist layer 28 exposing the seed layer 26 over the pad 16. A 1× stepper or 1× contact aligner can be used to expose the photoresist layer 28 during the process of exposure.

For example, the photoresist layer 28 can be formed by spin-on coating a positive-type photosensitive polymer layer having a thickness of between 1 and 25 μm, and preferably of between 3 and 10 μm, on the seed layer 26, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants form the seed layer 26 with an $O_2$ plasma or a plasma containing fluorine of below 200 PPM and oxygen, such that the photoresist layer 28 can be patterned with an opening 28a in the photoresist layer 28 exposing the seed layer 26 over the pad 16.

Figure 6E:
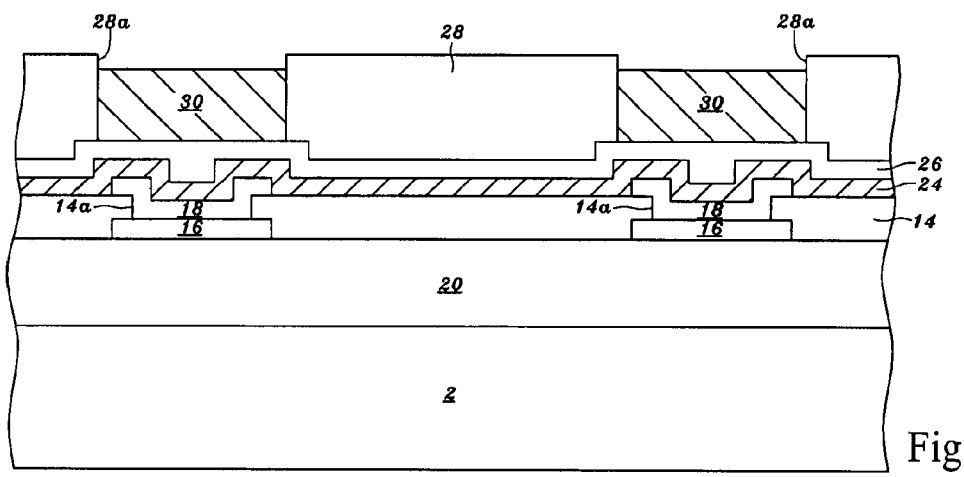

Referring to FIG. 6E, a metal layer 30 having a thickness of between 1 and 20 μm, and preferably of between 3 and 5 μm, can be electroplated and/or electroless plated over the seed layer 26 exposed by the opening 28a. The material of the metal layer 30 may include gold, copper, nickel or palladium. The specification of the metal layer 30 shown in FIG. 6E can be referred to as the metal layer 30 illustrated in FIG. 4E. The process of forming the metal layer 30 shown in FIG. 6E can be referred to as the process of forming the metal layer 30 illustrated in FIG. 4E.

Figure 6F:
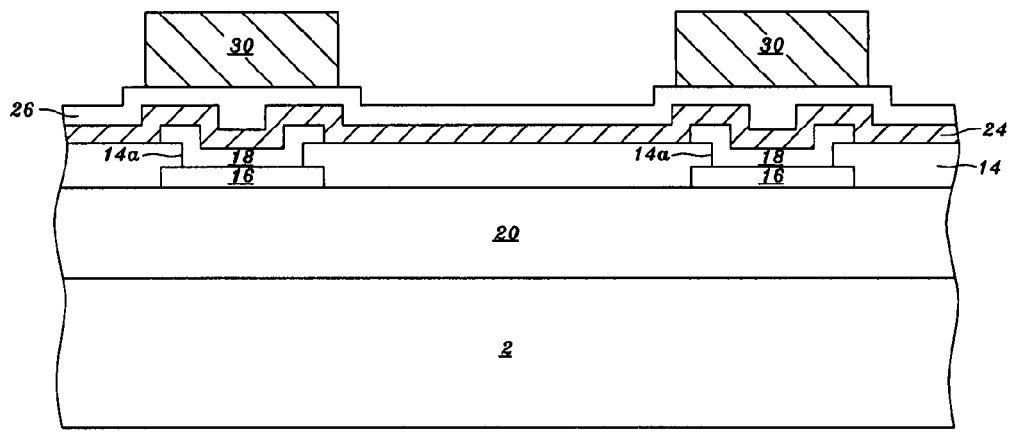

Referring to FIG. 6F, after the metal layer 30 is formed, most of the photoresist layer 28 can be removed using an organic solution with amide. However, some residuals from the photoresist layer 28 could remain on the metal layer 30 and on the seed layer 26. Thereafter, the residuals can be removed from the metal layer 30 and from the seed layer 26 with a plasma, such as $O_2$ plasma or plasma containing fluorine of below 200 PPM and oxygen.

Figure 6G:
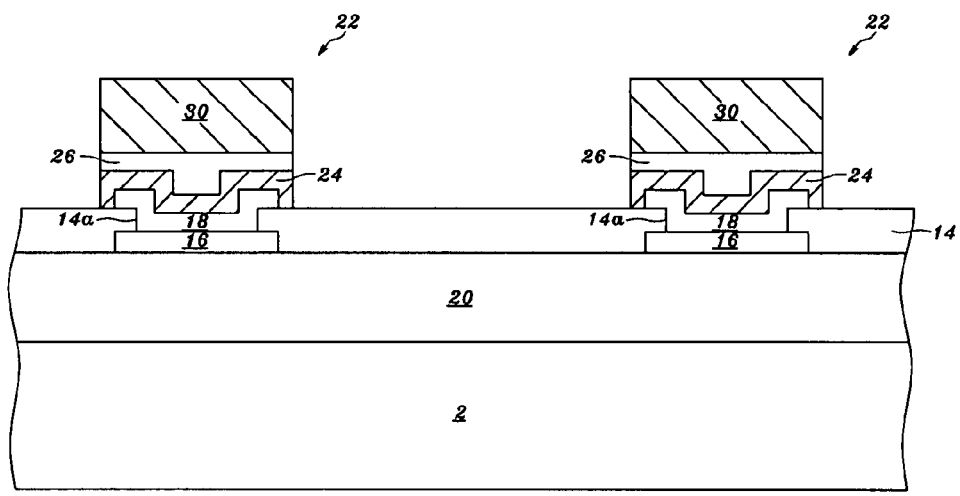

Referring to FIG. 6G, the seed layer 26 and the adhesion/barrier layer 24 not under the metal layer 30 are subsequently removed with a dry etching method or a wet etching method. The process of removing the seed layer 26 and the adhesion/barrier layer 24 not under the metal layer 30, as shown in FIG. 6G, can be referred to as the process of removing the seed layer 26 and the adhesion/barrier layer 24 not under the metal layer 30, as illustrated in FIG. 4G.

Thereby, in the present invention, the bonding pad 22 can be formed on the aluminum-containing layer of the metal cap 18. The bonding pad 22 can be formed of the adhesion/barrier layer 24, the seed layer 26 on the adhesion/barrier layer 24 and the electroplated metal layer 30 on the seed layer 26. The material of bonding pad 22 may comprise titanium, titanium-tungsten alloy, titanium nitride, chromium, tantalum nitride, tantalum, gold, copper, palladium or nickel. Based on the above teaching, the bonding pad 22 may include the following fashions.

For example, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the aluminum-containing layer of the metal cap 18 on the pad 16, principally made of copper, exposed by the opening 14a, a sputtered seed layer, made of gold, having a thickness of between 0.03 and 1 μm, and preferably of between 0.03 and 0.7 μm, on the titanium-containing layer, and an electroplated gold layer having a thickness of between 1 and 20 μm, such as between 3 and 5 μm or between 1 and 4 μm, on the sputtered seed layer. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the aluminum-containing layer of the metal cap 18 on the pad 16, principally made of copper, exposed by the opening 14a, a sputtered seed layer, made of palladium, having a thickness of between 0.03 and 1 μm, and preferably of between 0.03 and 0.7 μm, on the titanium-containing layer, and an electroplated palladium layer having a thickness of between 1 and 20 μm, such as between 3 and 5 μm or between 1 and 4 μm, on the sputtered seed layer. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the aluminum-containing layer of the metal cap 18 on the pad 16, principally made of copper, exposed by the opening 14a, a sputtered seed layer, made of copper, having a thickness of between 0.03 and 1 μm, and preferably of between 0.03 and 0.7 μm, on the titanium-containing layer, an electroplated copper layer having a thickness of between 1 and 10 μm on the sputtered seed layer, an electroplated nickel layer having a thickness of between 1 and 5 μm on the electroplated copper layer, and an electroplated gold layer having a thickness of between 1 and 5 μm on the electroplated nickel layer, wherein the thickness of the electroplated copper layer, the electroplated nickel layer and the electroplated gold layer is between 1 and 20 μm, and preferably of between 3 and 5 μm. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the aluminum-containing layer of the metal cap 18 on the pad 16, principally made of copper, exposed by the opening 14a, a sputtered seed layer, made of copper, having a thickness of between 0.03 and 1 μm, and preferably of between 0.03 and 0.7 μm, on the titanium-containing layer, an electroplated copper layer having a thickness of between 1 and 13 μm on the sputtered seed layer, an electroplated nickel layer having a thickness of between 1 and 5 μm on the electroplated copper layer, and an electroless plated gold layer having a thickness of between 0.05 and 2 μm on the electroplated nickel layer, wherein the thickness of the electroplated copper layer, the electroplated nickel layer and the electroless plated gold layer is between 1 and 20 μm, and preferably of between 3 and 5 μm. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the aluminum-containing layer of the metal cap 18 on the pad 16, principally made of copper, exposed by the opening 14a, a sputtered seed layer, made of copper, having a thickness of between 0.03 and 1 μm, and preferably of between 0.03 and 0.7 μm, on the titanium-containing layer, an electroplated copper layer having a thickness of between 1 and 10 μm on the sputtered seed layer, an electroplated nickel layer having a thickness of between 1 and 5 μm on the electroplated copper layer, and an electroplated palladium layer having a thickness of between 1 and 5 μm on the electroplated nickel layer, wherein the thickness of the electroplated copper layer, the electroplated nickel layer and the electroplated palladium layer is between 1 and 20 μm, and preferably of between 3 and 5 μm. Alternatively, the bonding pad 22 may be formed of a titanium-containing layer, such as titanium layer, titanium-tungsten-alloy layer or titanium-nitride layer, having a thickness of between 0.01 and 0.7 μm, and preferably of between 0.03 and 0.7 μm, on the aluminum-containing layer of the metal cap 18 on the pad 16, principally made of copper, exposed by the opening 14a, a sputtered seed layer, made of copper, having a thickness of between 0.03 and 1 μm, and preferably of between 0.03 and 0.7 μm, on the titanium-containing layer, an electroplated copper layer having a thickness of between 1 and 13 μm on the sputtered seed layer, an electroplated nickel layer having a thickness of between 1 and 5 μm on the electroplated copper layer, and an electroless plated palladium layer having a thickness of between 0.05 and 2 μm on the electroplated nickel layer, wherein the thickness of the electroplated copper layer, the electroplated nickel layer and the electroless plated palladium layer is between 1 and 20 μm, and preferably of between 3 and 5 μm.

For example, the bonding pad 22 may be formed of a chromium layer having a thickness of between 0.01 and 0.7 μm, and preferably of between 0.03 and 0.7 μm, on the aluminum-containing layer of the metal cap 18 on the pad 16, principally made of copper, exposed by the opening 14*a*, a sputtered seed layer, made of gold, having a thickness of between 0.03 and 1 μm, and preferably of between 0.03 and 0.7 μm, on the chromium layer, and an electroplated gold layer having a thickness of between 1 and 2 μm, such as between 3 and 5 μm or between 1 and 4 μm, on the sputtered seed layer. Alternatively, the bonding pad 22 may be formed of a chromium layer having a thickness of between 0.01 and 0.7 μm, and preferably of between 0.03 and 0.7 μm, on the aluminum-containing layer of the metal cap 18 on the pad 16, principally made of copper, exposed by the opening 14*a*, a sputtered seed layer, made of palladium, having a thickness of between 0.03 and 1 μm, and preferably of between 0.03 and 0.7 μm, on the chromium layer, and an electroplated palladium layer having a thickness of between 1 and 20 μm, such as between 3 and 5 μm or between 1 and 4 μm, on the sputtered seed layer. Alternatively, the bonding pad 22 may be formed of a chromium layer having a thickness of between 0.01 and 0.7 μm, and preferably of between 0.03 and 0.7 μm, on the aluminum-containing layer of the metal cap 18 on the pad 16, principally made of copper, exposed by the opening 14*a*, a sputtered seed layer, made of copper, having a thickness of between 0.03 and 1 μm, and preferably of between 0.03 and 0.7 μm, on the chromium layer, an electroplated copper layer having a thickness of between 1 and 10 μm on the sputtered seed layer, an electroplated nickel layer having a thickness of between 1 and 5 μm on the electroplated copper layer, and an electroplated gold layer having a thickness of between 1 and 5 μm on the electroplated nickel layer, wherein the thickness of the electroplated copper layer, the electroplated nickel layer and the electroplated gold layer is between 1 and 20 μm, and preferably of between 3 and 5 μm. Alternatively, the bonding pad 22 may be formed of a chromium layer having a thickness of between 0.01 and 0.7 μm, and preferably of between 0.03 and 0.7 μm, on the aluminum-containing layer of the metal cap 18 on the pad 16, principally made of copper, exposed by the opening 14*a*, a sputtered seed layer, made of copper, having a thickness of between 0.03 and 1 μm, and preferably of between 0.03 and 0.7 μm, on the chromium layer, an electroplated copper layer having a thickness of between 1 and 13 μm on the sputtered seed layer, an electroplated nickel layer having a thickness of between 1 and 5um on the electroplated copper layer, and an electroless plated gold layer having a thickness of between 0.05 and 2 μm on the electroplated nickel layer, wherein the thickness of the electroplated copper layer, the electroplated nickel layer and the electroless plated gold layer is between 1 and 20 μm, and preferably of between 3 and 5 μm. Alternatively, the bonding pad 22 may be formed of a chromium layer having a thickness of between 0.01 and 0.7 μm, and preferably of between 0.03 and 0.7 μm, on the aluminum-containing layer of the metal cap 18 on the pad 16, principally made of copper, exposed by the opening 14*a*, a sputtered seed layer, made of copper, having a thickness of between 0.03 and 1 μm, and preferably of between 0.03 and 0.7 μm, on the chromium layer, an electroplated copper layer having a thickness of between 1 and 10 μm on the sputtered seed layer, an electroplated nickel layer having a thickness of between 1 and 5 μm on the electroplated copper layer, and an electroplated palladium layer having a thickness of between 1 and 5 μm on the electroplated nickel layer, wherein the thickness of the electroplated copper layer, the electroplated nickel layer and the electroplated palladium layer is between 1 and 20 μm, and preferably of between 3 and 5 μm. Alternatively, the bonding pad 22 may be formed of a chromium layer having a thickness of between 0.01 and 0.7 μm, and preferably of between 0.03 and 0.7 μm, on the aluminum-containing layer of the metal cap 18 on the pad 16, principally made of copper, exposed by the opening 14*a*, a sputtered seed layer, made of copper, having a thickness of between 0.03 and 1 μm, and preferably of between 0.03 and 0.7 μm, on the chromium layer, an electroplated copper layer having a thickness of between 1 and 13 μm on the sputtered seed layer, an electroplated nickel layer having a thickness of between 1 and 5 μm on the electroplated copper layer, and an electroless plated palladium layer having a thickness of between 0.05 and 2 μm on the electroplated nickel layer, wherein the thickness of the electroplated copper layer, the electroplated nickel layer and the electroplated palladium layer is between 1 and 20 μm, and preferably of between 3 and 5 μm.

For example, the bonding pad 22 may be formed of a tantalum-containing layer, such as tantalum layer or tantalum-nitride layer, having a thickness of between 0.01 and 0.7 μm, and preferably of between 0.03 and 0.7 μm, on the aluminum-containing layer of the metal cap 18 on the pad 16, principally made of copper, exposed by the opening 14*a*, a sputtered seed layer, made of gold, having a thickness of between 0.03 and 1 μm, and preferably of between 0.03 and 0.7 μm, on the tantalum-containing layer, and an electroplated gold layer having a thickness of between 1 and 20 μm, such as between 3 and 5 μm or between 1 and 4 μm, on the sputtered seed layer. Alternatively, the bonding pad 22 may be formed of a tantalum-containing layer, such as tantalum layer or tantalum-nitride layer, having a thickness of between 0.01 and 0.7 μm, and preferably of between 0.03 and 0.7 μm, on the aluminum-containing layer of the metal cap 18 on the pad 16, principally made of copper, exposed by the opening 14*a*, a sputtered seed layer, made of palladium, having a thickness of between 0.03 and 1 μm, and preferably of between 0.03 and 0.7 μm, on the tantalum-containing layer, and an electroplated palladium layer having a thickness of between 1 and 20 μm, such as between 3 and 5 μm or between 1 and 4 μm, on the sputtered seed layer. Alternatively, the bonding pad 22 may be formed of a tantalum-containing layer, such as tantalum layer or tantalum-nitride layer, having a thickness of between 0.01 and 0.7 μm, and preferably of between 0.03 and 0.7 μm, on the aluminum-containing layer of the metal cap 18 on the pad 16, principally made of copper, exposed by the opening 14*a*, a sputtered seed layer, made of copper, having a thickness of between 0.03 and 1 μm, and preferably of between 0.03 and 0.7 μm, on the tantalum-containing layer, an electroplated copper layer having a thickness of between 1 and 10 μm on the sputtered seed layer, an electroplated nickel layer having a thickness of between 1 and 5 μm on the electroplated copper layer, and an electroplated gold layer having a thickness of between 1 and 5 μm on the electroplated nickel layer, wherein the thickness of the electroplated copper layer, the electroplated nickel layer and the electroplated gold layer is between 1 and 20 μm, and preferably of between 3 and 5 μm. Alternatively, the bonding pad 22 may be formed of a tantalum-containing layer, such as tantalum layer or tantalum-nitride layer, having a thickness of between 0.01 and 0.7 μm, and preferably of between 0.03 and 0.7 μm, on the aluminum-containing layer of the metal cap 18 on the pad 16, principally made of copper, exposed by the opening 14*a*, a sputtered seed layer, made of copper, having a thickness of between 0.03 and 1 µm, and preferably of between 0.03 and 0.7 µm, on the tantalum-containing layer, an electroplated copper layer having a thickness of between 1 and 13 µm on the sputtered seed layer, an electroplated nickel layer having a thickness of between 1 and 5 µm on the electroplated copper layer, and an electroless plated gold layer having a thickness of between 0.05 and 2 µm on the electroplated nickel layer, wherein the thickness of the electroplated copper layer, the electroplated nickel layer and the electroless plated gold layer is between 1 and 20 µm, and preferably of between 3 and 5 µm. Alternatively, the bonding pad 22 may be formed of a tantalum-containing layer, such as tantalum layer or tantalum-nitride layer, having a thickness of between 0.01 and 0.7 µm, and preferably of between 0.03 and 0.7 µm, on the aluminum-containing layer of the metal cap 18 on the pad 16, principally made of copper, exposed by the opening 14a, a sputtered seed layer, made of copper, having a thickness of between 0.03 and 1 µm, and preferably of between 0.03 and 0.7 µm, on the tantalum-containing layer, an electroplated copper layer having a thickness of between 1 and 10 µm on the sputtered seed layer, an electroplated nickel layer having a thickness of between 1 and 5 µm on the electroplated copper layer, and an electroplated palladium layer having a thickness of between 1 and 5 µm on the electroplated nickel layer, wherein the thickness of the electroplated copper layer, the electroplated nickel layer and the electroplated palladium layer is between 1 and 20 µm, and preferably of between 3 and 5 µm. Alternatively, the bonding pad 22 may be formed of a tantalum-containing layer, such as tantalum layer or tantalum-nitride layer, having a thickness of between 0.01 and 0.7 µm, and preferably of between 0.03 and 0.7 µm, on the aluminum-containing layer of the metal cap 18 on the pad 16, principally made of copper, exposed by the opening 14a, a sputtered seed layer, made of copper, having a thickness of between 0.03 and 1 µm, and preferably of between 0.03 and 0.7 µm, on the tantalum-containing layer, an electroplated copper layer having a thickness of between 1 and 13 µm on the sputtered seed layer, an electroplated nickel layer having a thickness of between 1 and 5 µm on the electroplated copper layer, and an electroless plated palladium layer having a thickness of between 0.05 and 2 µm on the electroplated nickel layer, wherein the thickness of the electroplated copper layer, the electroplated nickel layer and the electroless plated palladium layer is between 1 and 20 µm, and preferably of between 3 and 5 µm.

After a semiconductor wafer is formed with the bonding pad 22, the semiconductor wafer can be diced into a plurality of individual semiconductor chips 31, IC (integrated circuit) chips, as shown in FIG. 5A.

Figure 7A:
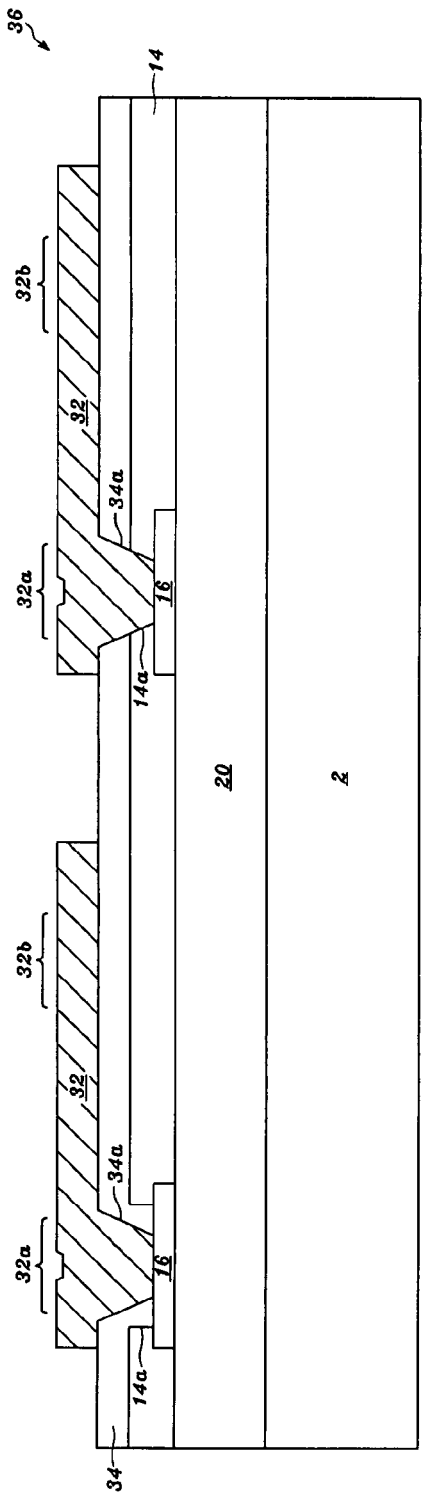
FIGS. 7A through 7F are cross-sectional views showing various semiconductor chips with a metal trace over a passivation layer.
Figure 7B:
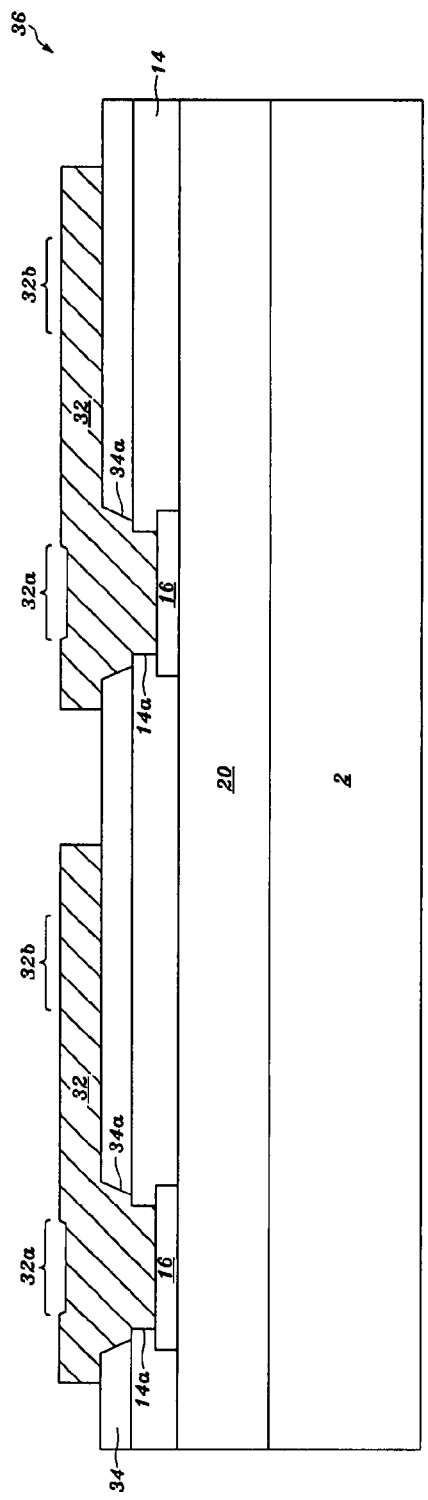

Referring to FIGS. 7A and 7B, in the present invention, a metal trace 32 can be formed on a polymer layer 34, and the metal trace 32 is connected to the pad 16 through an opening 34a in the polymer layer 34, wherein the polymer layer 34 is formed on the passivation layer 14, and the opening 34a, exposing the pad 16, is formed in the polymer layer 34 by a photolithography process, for example. The pad 16 may include a center portion exposed by an opening 34a and a peripheral portion covered with the polymer layer 34, as shown in FIG. 7A. Alternatively, the opening 34a may expose the entire upper surface of the pad 16 exposed by the opening 14a in the passivation layer 14 and further may expose the upper surface of the passivation layer 14 near the pad 16, as shown in FIG. 7B.

The material of the polymer layer 34 may include polyimide (PI), benzocyclobutane (BCB), polyurethane, epoxy resin, a parylene-based polymer, a solder-mask material, an elastomer, or a porous dielectric material. The polymer layer 34 having a thickness of between 3 and 25 µm can be formed by a process including a spin-on coating process, a lamination process or a screen-printing process.

For example, the polymer layer 34 can be formed by spin-on coating a negative-type photosensitive polyimide layer, containing ester-typer precursor, having a thickness of between 6 and 50 µm on the passivation layer 14, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and Mine, H-line and I-line, or G-line, H-line and I-line illuminate the baked polyimide layer, then developing the exposed polyimide layer, an opening in the developed polyimide layer exposing the pad 16, then curing or heating the developed polyimide layer at a peak temperature of between 250 and 400° C. for a time of between 10 and 200 minutes in a nitrogen ambient or in an oxygen-free ambient, the cured polyimide layer having a thickness of between 3 and 25 µm, and then removing the residual polymeric material or other contaminants form the upper surface of the pad 16 exposed by the opening in the cured polyimide layer with an $O_2$ plasma or a plasma containing fluorine of below 200 PPM and oxygen, such that the polyimide layer can be patterned with at least one opening in the polyimide layer exposing at least one pad 16 of the circuit structure 6.

The material of the metal trace 32 may comprise gold, copper, nickel or palladium, and the metal trace 32 can be formed by a process including sputtering, electroplating or electroless plating. For example, the metal trace 22 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the pad 16, principally made of sputtered aluminum or electroplated copper, exposed by the opening 34a, and on the polymer layer 34, then sputtering a seed layer, made of gold, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a gold layer having a thickness of between 1 and 30 micrometers, and preferably of between 2 and 20 micrometers, on the seed layer exposed by the opening in the photoresist layer, then removing the photoresist layer, then removing the seed layer not under the gold layer, and then removing the adhesion/barrier layer not under the gold layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the pad 16, principally made of sputtered aluminum or electroplated copper, exposed by the opening 34a, and on the polymer layer 34, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroplating a gold layer having a thickness of between 0.01 and 5 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the pad 16, principally made of sputtered aluminum or electroplated copper, exposed by the opening 34a, and on the polymer layer 34, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroless plating a gold layer having a thickness of between 0.05 and 2 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the pad 16, principally made of sputtered aluminum or electroplated copper, exposed by the opening 34a, and on the polymer layer 34, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroplating a palladium layer having a thickness of between 0.01 and 5 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the pad 16, principally made of sputtered aluminum or electroplated copper, exposed by the opening 34a, and on the polymer layer 34, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroless plating a palladium layer having a thickness of between 0.05 and 2 micrometers on the nickel layer in the opening, then removing the photoresist layer, then removing the seed layer not under the copper layer, and then removing the adhesion/barrier layer not under the copper layer.

The metal trace 32 comprises at least one bonding pad for being bonded with a wire, such as gold wire. From a top perspective view, the position of the bonding pad may be different from that of the pad 16, to which the metal trace 32 is connected. For example, the metal trace 32 may comprise a first bonding pad 32a and a second bonding pad 32b. From a top perspective view, the position of the first bonding pad 32a is the same as that of the pad 16, to which the metal trace 32 is connected, but the position of the second bonding pad 32b is different from that of the pad 16, to which the metal trace 32 is connected. One of the first and second bonding pads 32a and 32b may have a gold wire ball bonded thereto using a wirebonding process. Alternatively, both of the first and second bonding pads 32a and 32b may have gold wires ball bonded thereto, respectively, using a wirebonding process.

After a semiconductor wafer is formed with the metal trace 32, the semiconductor wafer can be diced into a plurality of individual semiconductor chips 36, IC (integrated circuit) chips, as shown in FIGS. 7A and 7B.

Figure 7C:
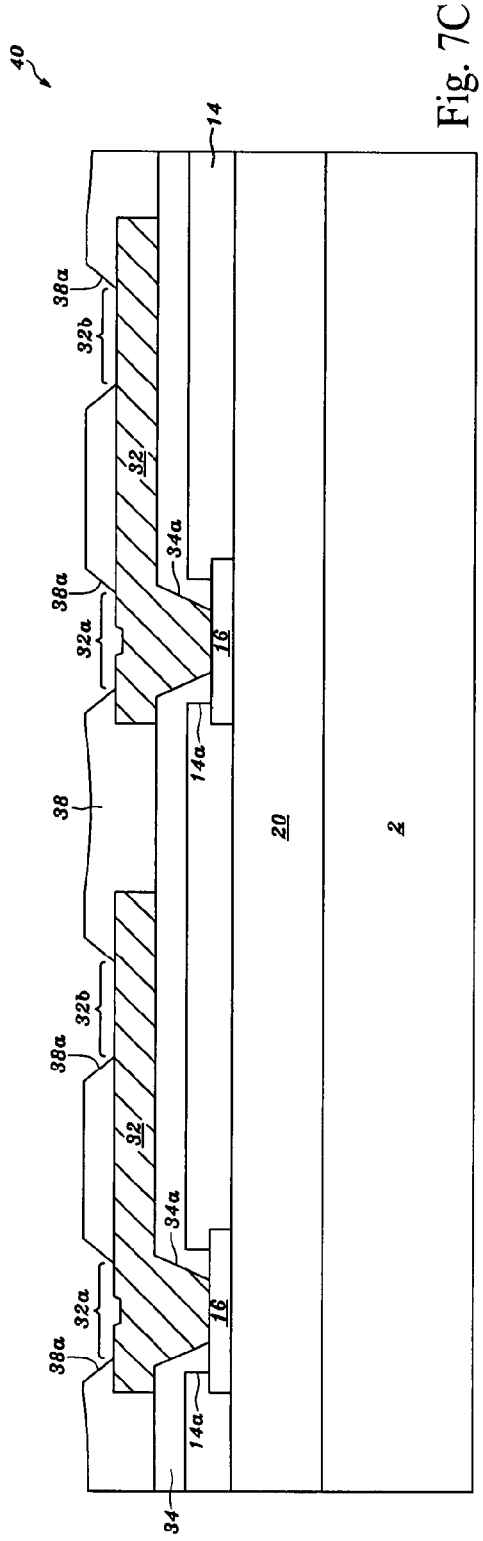
Figure 7D:
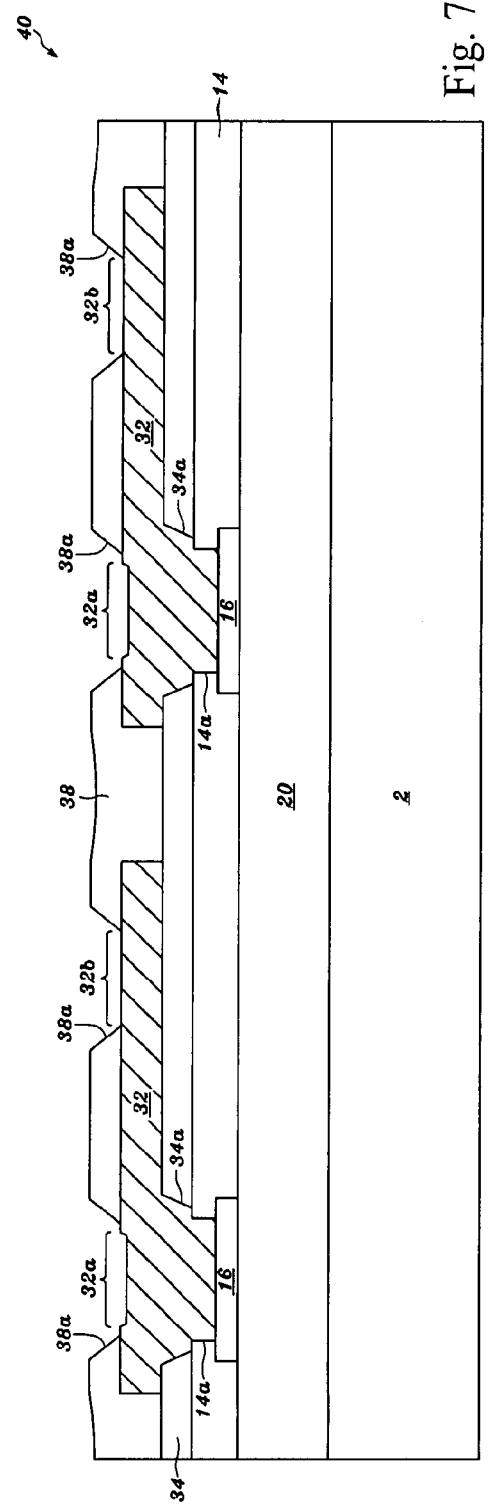

Referring to FIGS. 7C and 7D, after the metal trace 32 shown in FIGS. 7A and 7B is formed, a polymer layer 38 may be formed on the metal trace 32 and on the polymer layer 34, and at least one opening 38a is formed in the polymer layer 38 by a photolithography process, for example, to expose a bonding pad 32a and/or 32b of the metal trace 32 for being bonded with a wire, such as gold wire. For example, the metal trace 32 may include a first bonding pad 32a exposed by the opening 38a and a second bonding pad 32b exposed by the opening 38a. From a top perspective view, the position of the first bonding pad 32a exposed by the opening 38a is the same as that of the pad 16, to which the metal trace 32 is connected, but the position of the second bonding pad 32b exposed by the opening 38a is different from that of the pad 16, to which the metal trace 32 is connected. One of the first and second bonding pads 32a and 32b may have a gold wire ball bonded thereto using a wirebonding process. Alternatively, both of the first and second bonding pads 32a and 32b may have gold wires ball bonded thereto, respectively, using a wirebonding process.

The material of the polymer layer 38 may be polyimide (PI), benzocyclobutane (BCB), polyurethane, epoxy resin, a parylene-based polymer, a solder-mask material, an elastomer, or a porous dielectric material. The polymer layer 38 having a thickness of between 3 and 25 µm can be formed by a process including a spin-on coating process, a lamination process or a screen-printing process.

For example, the polymer layer 38 can be formed by spin-on coating a negative-type photosensitive polyimide layer, containing ester-typer precursor, having a thickness of between 6 and 50 µm on the metal trace 32 and on the polymer layer 34, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and Mine having a wavelength ranging from 363 to 367 nm, illuminating the baked polyimide layer, that is, G-line and H-line, G-line and Mine, H-line and I-line, or G-line, H-line and I-line illuminate the baked polyimide layer, then developing the exposed polyimide layer, two openings in the developed polyimide layer exposing the gold layer of the bonding pads 32a and 32b or the palladium layer of the bonding pads 32a and 32b, then curing or heating the developed polyimide layer at a peak temperature of between 250 and 400° C. for a time of between 10 and 200 minutes in a nitrogen ambient or in an oxygen-free ambient, the cured polyimide layer having a thickness of between 3 and 25 μm, and then removing the residual polymeric material or other contaminants form the upper surface of the metal trace 32 exposed by the opening in the cured polyimide layer with an $O_2$ plasma or a plasma containing fluorine of below 200 PPM and oxygen, such that the polyimide layer can be patterned with two openings in the polyimide layer exposing the gold layer of the bonding pads 32a and 32b or the palladium layer of the bonding pads 32a and 32b.

After a semiconductor wafer is formed with the polymer layer 38 on the metal trace 32, the semiconductor wafer can be diced into a plurality of individual semiconductor chips 40, IC (integrated circuit) chips, as shown in FIGS. 7C and 7D.

Figure 7E:
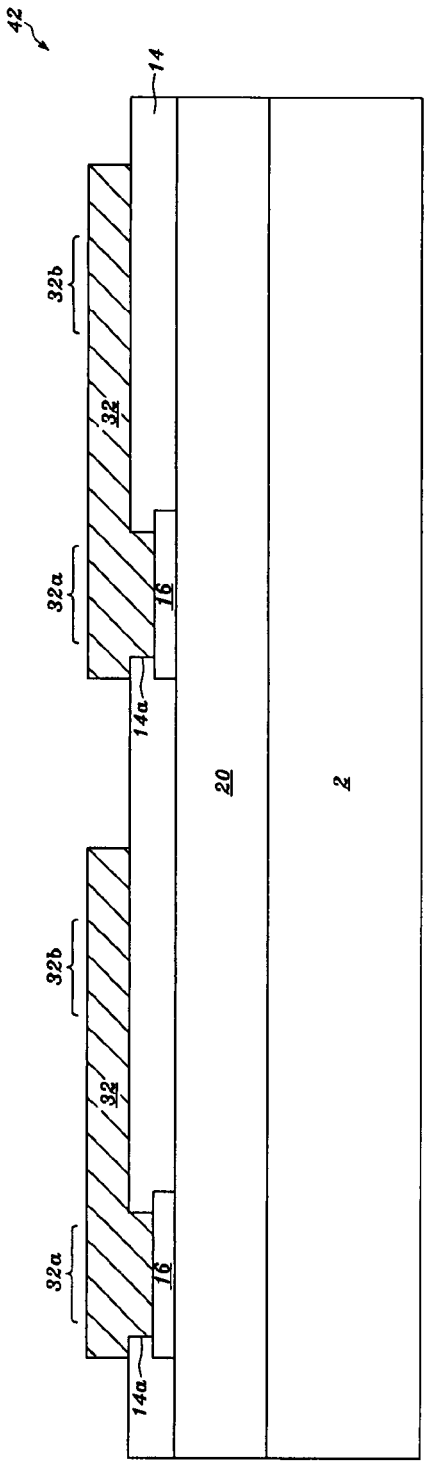

Referring to FIG. 7E, in the present invention, the step of forming the polymer layer 34 on the passivation layer 14, as shown in FIGS. 7A and 7B, can be omitted, that is, the metal trace 32 can be directly formed on the passivation layer 14 and on the pad 16 exposed by the opening 14a.

For example, the metal trace 22 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the pad 16, principally made of sputtered aluminum or electroplated copper, exposed by the opening 14a, and on the passivation layer 14, then sputtering a seed layer, made of gold, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a gold layer having a thickness of between 1 and 30 micrometers, and preferably of between 2 and 20 micrometers, on the seed layer exposed by the opening in the photoresist layer, then removing the photoresist layer, then removing the seed layer not under the gold layer, and then removing the adhesion/barrier layer not under the gold layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the pad 16, principally made of sputtered aluminum or electroplated copper, exposed by the opening 14a, and on the passivation layer 14, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroplating a gold layer having a thickness of between 0.01 and 5 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the pad 16, principally made of sputtered aluminum or electroplated copper, exposed by the opening 14a, and on the passivation layer 14, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroless plating a gold layer having a thickness of between 0.05 and 2 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the pad 16, principally made of sputtered aluminum or electroplated copper, exposed by the opening 14a, and on the passivation layer 14, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroplating a palladium layer having a thickness of between 0.01 and 5 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the pad 16, principally made of sputtered aluminum or electroplated copper, exposed by the opening 14a, and on the passivation layer 14, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroless plating a palladium layer having a thickness of between 0.05 and 2 micrometers on the nickel layer in the opening, then removing the photoresist layer, then removing the seed layer not under the copper layer, and then removing the adhesion/barrier layer not under the copper layer.

The metal trace 32 comprises at least one bonding pad for being bonded with a wire, such as gold wire. From a top perspective view, the position of the bonding pad may be different from that of the pad 16, to which the metal trace 32 is connected. For example, the metal trace 32 may comprise a first bonding pad 32a and a second bonding pad 32b. From a top perspective view, the position of the first bonding pad 32a is the same as that of the pad 16, to which the metal trace 32 is connected, but the position of the second bonding pad 32b is different from that of the pad 16, to which the metal trace 32 is connected. One of the first and second bonding pads 32a and 32b may have a gold wire ball bonded thereto using a wirebonding process. Alternatively, both of the first and second bonding pads 32a and 32b may have gold wires ball bonded thereto, respectively, using a wirebonding process.

After a semiconductor wafer is formed with the metal trace 32, the semiconductor wafer can be diced into a plurality of individual semiconductor chips 42, IC (integrated circuit) chips, as shown in FIG. 7E.

Figure 7F:
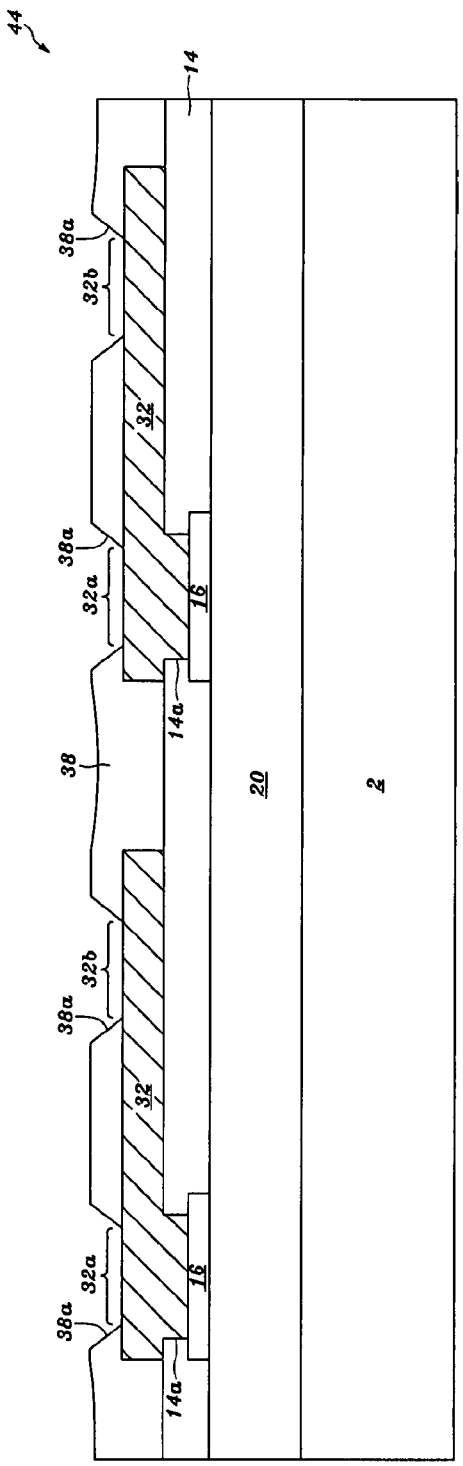

Referring to FIG. 7F, after the metal trace 32 shown in FIG. 7E is formed, a polymer layer 38 may be formed on the metal trace 32 and on the passivation layer 14, and at least one opening 38a is formed in the polymer layer 38 by a photolithography process, for example, to expose a bonding pad 32a and/or 32b of the metal trace 32 for being bonded with a wire, such as gold wire. For example, the metal trace 32 may include a first bonding pad 32a exposed by the opening 38a and a second bonding pad 32b exposed by the opening 38a. From a top perspective view, the position of the first bonding pad 32a exposed by the opening 38a is the same as that of the pad 16, to which the metal trace 32 is connected, but the position of the second bonding pad 32b exposed by the opening 38a is different from that of the pad 16, to which the metal trace 32 is connected. One of the first and second bonding pads 32a and 32b may have a gold wire ball bonded thereto using a wirebonding process. Alternatively, both of the first and second bonding pads 32a and 32b may have gold wires ball bonded thereto, respectively, using a wirebonding process.

The material of the polymer layer 38 may include polyimide (PI), benzocyclobutane (BCB), polyurethane, epoxy resin, a parylene-based polymer, a solder-mask material, an elastomer, or a porous dielectric material. The polymer layer 38 having a thickness of between 3 and 25 μm can be formed by a process including a spin-on coating process, a lamination process or a screen-printing process.

For example, the polymer layer 38 can be formed by spin-on coating a negative-type photosensitive polyimide layer, containing ester-typer precursor, having a thickness of between 6 and 50 μm on the metal trace 32 and on the passivation layer 14, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, or G-line, H-line and I-line illuminate the baked polyimide layer, then developing the exposed polyimide layer, two openings in the developed polyimide layer exposing the gold layer of the bonding pads 32a and 32b or the palladium layer of the bonding pads 32a and 32b, then curing or heating the developed polyimide layer at a peak temperature of between 250 and 400° C. for a time of between 10 and 200 minutes in a nitrogen ambient or in an oxygen-free ambient, the cured polyimide layer having a thickness of between 3 and 25 μm, and then removing the residual polymeric material or other contaminants from the upper surface of the metal trace 32 exposed by the opening in the cured polyimide layer with an $O_2$ plasma or a plasma containing fluorine of below 200 PPM and oxygen, such that the polyimide layer can be patterned with two openings in the polyimide layer exposing the gold layer of the bonding pads 32a and 32b or the palladium layer of the bonding pads 32a and 32b.

After a semiconductor wafer is formed with the polymer layer 38 on the metal trace 32, the semiconductor wafer can be diced into a plurality of individual semiconductor chips 44, IC (integrated circuit) chips, as shown in FIG. 7F.

Figure 8A:
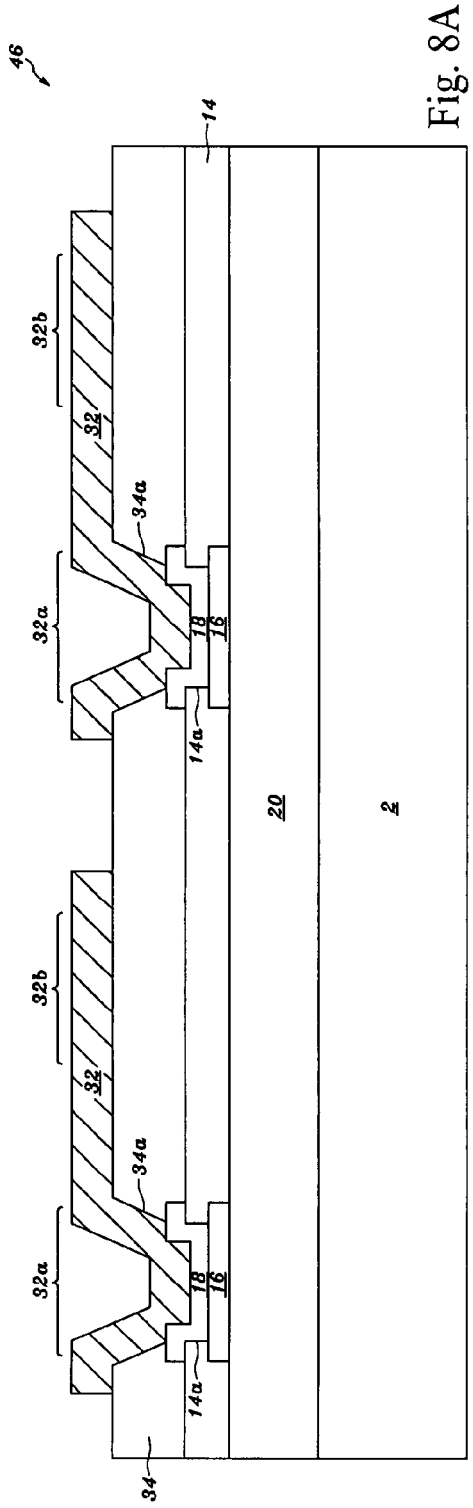
FIGS. 8A through 8D are cross-sectional views showing various semiconductor chips with a metal trace over a polymer layer.

Referring to FIG. 8A, in the present invention, a metal trace 32 can be formed on a polymer layer 34, and the metal trace 32 is connected to the aluminum-containing layer of the metal cap 18 through an opening 34a in the polymer layer 34, wherein the polymer layer 34 is formed on the passivation layer 14, and the opening 34a, exposing the aluminum-containing layer of the metal cap 18, is formed in the polymer layer 34 by a photolithography process, for example. The metal cap 18 may comprise a tantalum-containing layer, such as tantalum layer or tantalum-nitride layer, having a thickness of between 0.01 and 0.7 μm on the pad 16, such as copper pad, exposed by the opening 14a, and an aluminum-containing layer, such as aluminum layer, aluminum-copper-alloy layer or Al—Si—Cu alloy layer, having a thickness of between 0.4 and 2 μm on the tantalum-containing layer.

The material of the polymer layer 34 may include polyimide (PI), benzocyclobutane (BCB), polyurethane, epoxy resin, a parylene-based polymer, a solder-mask material, an elastomer, or a porous dielectric material. The polymer layer 34 having a thickness of between 3 and 25 μm can be formed by a process including a spin-on coating process, a lamination process or a screen-printing process.

For example, the polymer layer 34 can be formed by spin-on coating a negative-type photosensitive polyimide layer, containing ester-typer precursor, having a thickness of between 6 and 50 μm on the passivation layer 14 and on the aluminum-containing layer of the metal cap 18, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and Mine, or G-line, H-line and Mine illuminate the baked polyimide layer, then developing the exposed polyimide layer, an opening in the developed polyimide layer exposing the aluminum-containing layer of the metal cap 18, then curing or heating the developed polyimide layer at a peak temperature of between 250 and 400° C. for a time of between 10 and 200 minutes in a nitrogen ambient or in an oxygen-free ambient, the cured polyimide layer having a thickness of between 3 and 25 μm, and then removing the residual polymeric material or other contaminants from the upper surface of the aluminum-containing layer of the metal cap 18 exposed by the opening in the cured polyimide layer with an $O_2$ plasma or a plasma containing fluorine of below 200 PPM and oxygen, such that the polyimide layer can be patterned with an opening in the polyimide layer exposing the aluminum-containing layer of the metal cap 18.

The material of the metal trace 32 may comprise gold, copper, nickel or palladium, and the metal trace 32 can be formed by a process including sputtering, electroplating or electroless plating. For example, the metal trace 22 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the aluminum-containing layer of the metal cap 18 exposed by the opening 34a and on the polymer layer 34, then sputtering a seed layer, made of gold, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a gold layer having a thickness of between 1 and 30 micrometers, and preferably of between 2 and 20 micrometers, on the seed layer exposed by the opening in the photoresist layer, then removing the photoresist layer, then removing the seed layer not under the gold layer, and then removing the adhesion/barrier layer not under the gold layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the aluminum-containing layer of the metal cap 18 exposed by the opening 34a and on the polymer layer 34, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroplating a gold layer having a thickness of between 0.01 and 5 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the aluminum-containing layer of the metal cap 18 exposed by the opening 34a and on the polymer layer 34, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroless plating a gold layer having a thickness of between 0.05 and 2 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the aluminum-containing layer of the metal cap 18 exposed by the opening 34a and on the polymer layer 34, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroplating a palladium layer having a thickness of between 0.01 and 5 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the aluminum-containing layer of the metal cap 18 exposed by the opening 34a and on the polymer layer 34, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroless plating a palladium layer having a thickness of between 0.05 and 2 micrometers on the nickel layer in the opening, then removing the photoresist layer, then removing the seed layer not under the copper layer, and then removing the adhesion/barrier layer not under the copper layer.

The metal trace 32 comprises at least one bonding pad for being bonded with a wire, such as gold wire. From a top perspective view, the position of the bonding pad may be different from that of the metal cap 18, to which the metal trace 32 is connected. For example, the metal trace 32 may comprise a first bonding pad 32a and a second bonding pad 32b. From a top perspective view, the position of the first bonding pad 32a is the same as that of the metal cap 18, to which the metal trace 32 is connected, but the position of the second bonding pad 32b is different from that of the metal cap 18, to which the metal trace 32 is connected. One of the first and second bonding pads 32a and 32b may have a gold wire ball bonded thereto using a wirebonding process. Alternatively, both of the first and second bonding pads 32a and 32b may have gold wires ball bonded thereto, respectively, using a wirebonding process.

After a semiconductor wafer is formed with the metal trace 32, the semiconductor wafer can be diced into a plurality of individual semiconductor chips 46, IC (integrated circuit) chips, as shown in FIG. 8A.

Figure 8B:
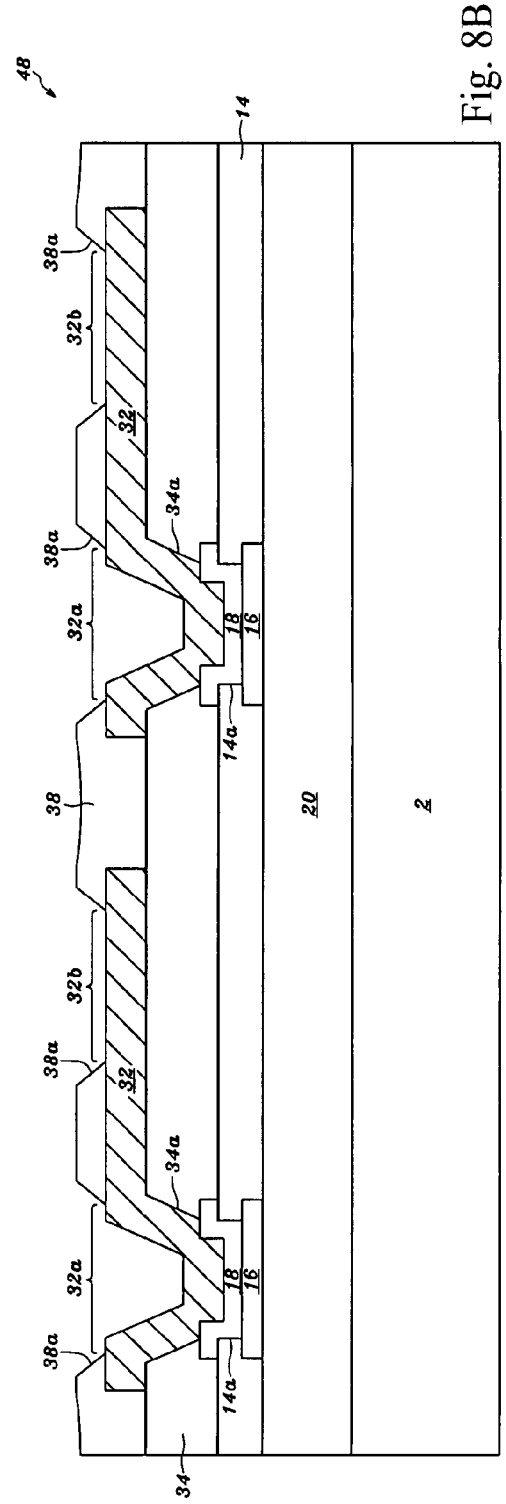

Referring to FIG. 8B, after the metal trace 32 shown in FIG. 8A is formed, a polymer layer 38 may be formed on the metal trace 32 and on the polymer layer 34, and at least one opening 38a is formed in the polymer layer 38 by a photolithography process, for example, to expose a bonding pad 32a and/or 32b of the metal trace 32 for being bonded with a wire, such as gold wire. For example, the metal trace 32 may include a first bonding pad 32a exposed by the opening 38a and a second bonding pad 32b exposed by the opening 38a. From a top perspective view, the position of the first bonding pad 32a exposed by the opening 38a is the same as that of the metal cap 18, to which the metal trace 32 is connected, but the position of the second bonding pad 32b exposed by the opening 38a is different from that of the metal cap 18, to which the metal trace 32 is connected. One of the first and second bonding pads 32a and 32b may have a gold wire ball bonded thereto using a wirebonding process. Alternatively, both of the first and second bonding pads 32a and 32b may have gold wires ball bonded thereto, respectively, using a wirebonding process. The specification of the polymer layer 38 shown in FIG. 8B can be referred to as the polymer layer 38 illustrated in FIGS. 7C and 7D. The process of forming the polymer layer 38 shown in FIG. 8B can be referred to as the process of forming the polymer layer 38 illustrated in FIGS. 7C and 7D.

After a semiconductor wafer is formed with the polymer layer 38 on the metal trace 32, the semiconductor wafer can be diced into a plurality of individual semiconductor chips 48, IC (integrated circuit) chips, as shown in FIG. 8B.

Figure 8C:
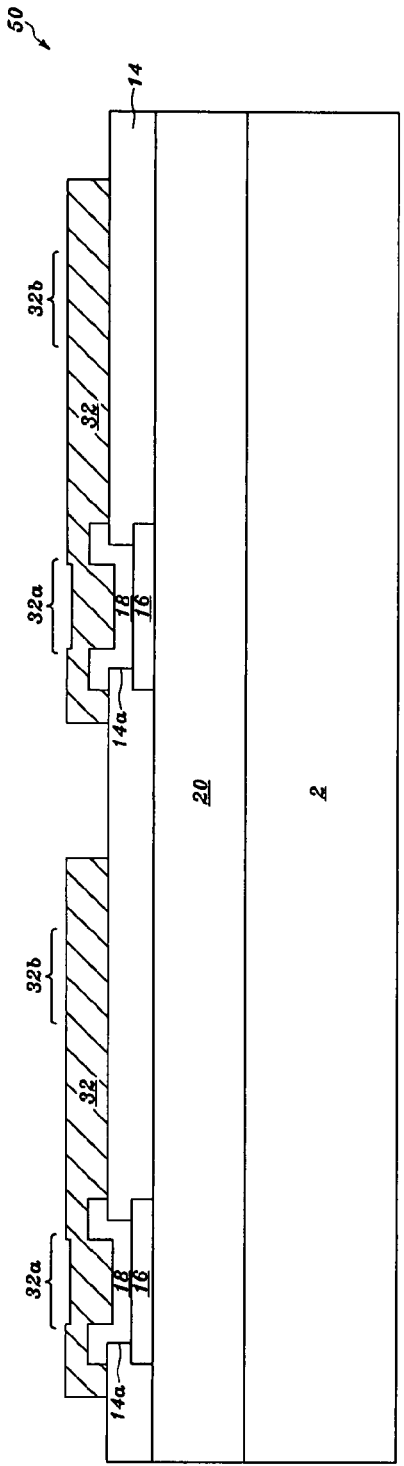

Referring to FIG. 8C, in the present invention, the step of forming the polymer layer 34 on the passivation layer 14, as shown in FIG. 8A, can be omitted, that is, the metal trace 32 can be directly formed on the passivation layer 14 and on the aluminum-containing layer of the metal cap 18.

For example, the metal trace 22 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the aluminum-containing layer of the metal cap 18 and on the passivation layer 14, then sputtering a seed layer, made of gold, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a gold layer having a thickness of between 1 and 30 micrometers, and preferably of between 2 and 20 micrometers, on the seed layer exposed by the opening in the photoresist layer, then removing the photoresist layer, then removing the seed layer not under the gold layer, and then removing the adhesion/barrier layer not under the gold layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the aluminum-containing layer of the metal cap 18 and on the passivation layer 14, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroplating a gold layer having a thickness of between 0.01 and 5 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the aluminum-containing layer of the metal cap 18 and on the passivation layer 14, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroless plating a gold layer having a thickness of between 0.05 and 2 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the aluminum-containing layer of the metal cap 18 and on the passivation layer 14, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroplating a palladium layer having a thickness of between 0.01 and 5 micrometers on the nickel layer in the opening, then removing the photoresist layer, then removing the seed layer not under the copper layer, and then removing the adhesion/barrier layer not under the copper layer. Alternatively, the metal trace 32 may be formed by sputtering an adhesion/barrier layer, such as titanium, a titanium-tungsten alloy, titanium nitride, tantalum, tantalum nitride or chromium, having a thickness of between 0.01 and 0.7 micrometers, and preferably of between 0.03 and 0.7 micrometers, on the aluminum-containing layer of the metal cap 18 and on the passivation layer 14, then sputtering a seed layer, made of copper, having a thickness of between 0.03 and 1 micrometers, and preferably of between 0.03 and 0.7 micrometers, on the adhesion/barrier layer, then forming a photoresist layer on the seed layer, an opening in the photoresist layer with a trace pattern exposing the seed layer, then electroplating a copper layer having a thickness of between 1 and 20 micrometers on the seed layer exposed by the opening in the photoresist layer, then electroplating a nickel layer having a thickness of between 1 and 10 micrometers on the copper layer in the opening, then electroless plating a palladium layer having a thickness of between 0.05 and 2 micrometers on the nickel layer in the opening, then removing the photoresist layer, then removing the seed layer not under the copper layer, and then removing the adhesion/barrier layer not under the copper layer.

The metal trace 32 comprises at least one bonding pad for being bonded with a wire, such as gold wire. From a top perspective view, the position of the bonding pad may be different from that of the metal cap 18, to which the metal trace 32 is connected. For example, the metal trace 32 may comprise a first bonding pad 32a and a second bonding pad 32b. From a top perspective view, the position of the first bonding pad 32a is the same as that of the metal cap 18, to which the metal trace 32 is connected, but the position of the second bonding pad 32b is different from that of the metal cap 18, to which the metal trace 32 is connected. One of the first and second bonding pads 32a and 32b may have a gold wire ball bonded thereto using a wirebonding process. Alternatively, both of the first and second bonding pads 32a and 32b may have gold wires ball bonded thereto, respectively, using a wirebonding process.

After a semiconductor wafer is formed with the metal trace 32, the semiconductor wafer can be diced into a plurality of individual semiconductor chips 50, IC (integrated circuit) chips, as shown in FIG. 8C.

Figure 8D:
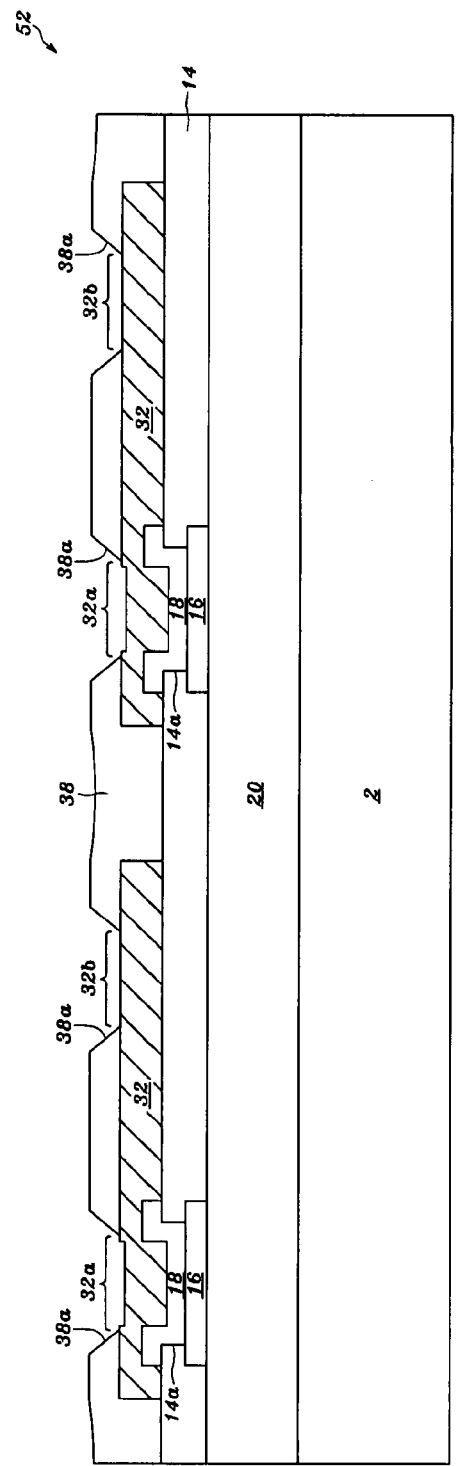

Referring to FIG. 8D, after the metal trace 32 shown in FIG. 8C is formed, a polymer layer 38 may be formed on the metal trace 32 and on the passivation layer 14, and at least one opening 38a is formed in the polymer layer 38 by a photolithography process, for example, to expose a bonding pad 32a and/or 32b of the metal trace 32 for being bonded with a wire, such as gold wire. For example, the metal trace 32 may include a first bonding pad 32a exposed by the opening 38a and a second bonding pad 32b exposed by the opening 38a. From a top perspective view, the position of the first bonding pad 32a exposed by the opening 38a is the same as that of the metal cap 18, to which the metal trace 32 is connected, but the position of the second bonding pad 32b exposed by the opening 38a is different from that of the metal cap 18, to which the metal trace 32 is connected. One of the first and second bonding pads 32a and 32b may have a gold wire ball bonded thereto using a wirebonding process. Alternatively, both of the first and second bonding pads 32a and 32b may have gold wires ball bonded thereto, respectively, using a wirebonding process. The specification of the polymer layer 38 shown in FIG. 8D can be referred to as the polymer layer 38 illustrated in FIG. 7F. The process of forming the polymer layer 38 shown in FIG. 8D can be referred to as the process of forming the polymer layer 38 illustrated in FIG. 7F.

After a semiconductor wafer is formed with the polymer layer 38 on the metal trace 32, the semiconductor wafer can be diced into a plurality of individual semiconductor chips 52, IC (integrated circuit) chips, as shown in FIG. 8E.

Embodiment 1

Referring to FIG. 9A, a glue material 54 is first formed on multiple regions of a substrate 56 by a dispensing process to form multiple glue portions 54 on the substrate 56. Next, multiple semiconductor chips 23 are respectively mounted onto the glue portions 54 to be adhered to the substrate 56, and then the glue material 54 is baked at a temperature of between 100 and 200° C. In another word, the semiconductor substrate 2 of the semiconductor chip 23 can be adhered to the substrate 56 using the glue material 54.

For example, the glue material 54 may be polyimide having a thickness of between 1 and 50 μm to adhere the semiconductor chips 23 to the substrate 56. Alternatively, the glue material 54 may be epoxy resin having a thickness of between 1 and 50 μm to adhere the semiconductor chips 23 to the substrate 56. Alternatively, the glue material 54 may be silver-filed epoxy having a thickness of between 1 and 50 μm to adhere the semiconductor chips 23 to the substrate 56.

The substrate 56 may be a ball grid array (BGA) substrate with a thickness of between 200 and 2,000 μm. Alternatively, the substrate 56 may be a glass fiber reinforced epoxy based substrate with a thickness of between 200 and 2,000 μm. Alternatively, the substrate 56 may be a glass substrate with a thickness of between 200 and 2,000 μm. Alternatively, the substrate 56 may be a silicon substrate with a thickness of between 200 and 2,000 μm. Alternatively, the substrate 56 may be a ceramic substrate with a thickness of between 200 and 2,000 μm. Alternatively, the substrate 56 may be an organic substrate with a thickness of between 200 and 2,000 μm. Alternatively, the substrate 56 may be a metal substrate, comprising aluminum, with a thickness of between 200 and 2,000 μm. Alternatively, the substrate 56 may be a metal substrate, comprising copper, with a thickness of between 200 and 2,000 μm.

Referring to FIG. 9B, via a wire-bonding process, one end of a wire 58 can be ball bonded to a bonding pad 22 of the semiconductor chip 23, and the other end of the wire 58 can be wedge bonded to a contact point 57 of a metal trace of the substrate 56, wherein the wire 58 has a diameter of between 20 and 50 micrometers, and the wire 58 is made of gold, typically called a gold wire. For example, one end of the wire 58 can be ball bonded to a gold layer of the bonding pad 22 of the semiconductor chip 23, and the other end of the wire 58 can be wedge bonded to the contact point 57 of the metal trace of the substrate 56. Alternatively, one end of the wire 58 can be ball bonded to a palladium layer of the bonding pad 22 of the semiconductor chip 23, and the other end of the wire 58 can be wedge bonded to the contact point 57 of the metal trace of the substrate 56. Thereby, the bonding pad 22 of the semiconductor chip 23 is electrically connected to the metal trace of the substrate 56.

Referring to FIG. 9C, a polymer material 60 having a thickness t5 of between 250 and 1,000 μm is formed on the substrate 56, covering the semiconductor chips 23 and the wires 58. The polymer material 60 can be formed by molding benzocyclobutane (BCB), polyimide (PI) or an epoxy-based material, by dispensing benzocyclobutane (BCB), polyimide (PI) or an epoxy-based material, by coating benzocyclobutane (BCB), polyimide (PI) or an epoxy-based material, by printing benzocyclobutane (BCB), polyimide (PI) or an epoxy-based material, or by laminating benzocyclobutane (BCB), polyimide (PI) or an epoxy-based material.

For example, the polymer material 60 can be formed by molding an epoxy-based material having a thickness t5 of between 250 and 1,000 μm on the substrate 56, covering the semiconductor chips 23 and the wires 58. Alternatively, the polymer material 60 can be formed by molding polyimide or benzocyclobutane having a thickness t5 of between 250 and 1,000 μm on the substrate 56, covering the semiconductor chips 23 and the wires 58. Alternatively, the polymer material 60 can be formed by dispensing polyimide or benzocyclobutane having a thickness t5 of between 250 and 1,000 μm on the substrate 56, covering the semiconductor chips 23 and the wires 58.

Referring to FIG. 9D, a lead-free solder is formed on a contact point 64 of the substrate 56 via a ball planting process or a screen printing process. Next, via a reflowing process, a lead-free solder ball 62 having a diameter d of between 0.25 and 12 mm is formed on the substrate 56 by heating the lead-free solder to a temperature of between 200 and 300° C., and preferably between 230 and 260° C., for a time of between 5 and 90 seconds, and preferably of between 20 and 40 seconds. The material of the lead-free solder ball 62 may be a tin-lead alloy, a tin-silver alloy or a tin-silver-copper alloy. The lead-free solder ball 62 is bonded on the contact point 64 of the metal trace and connected to the contact point 57, for being electrically connected to the wire 58.

Figure 9E:
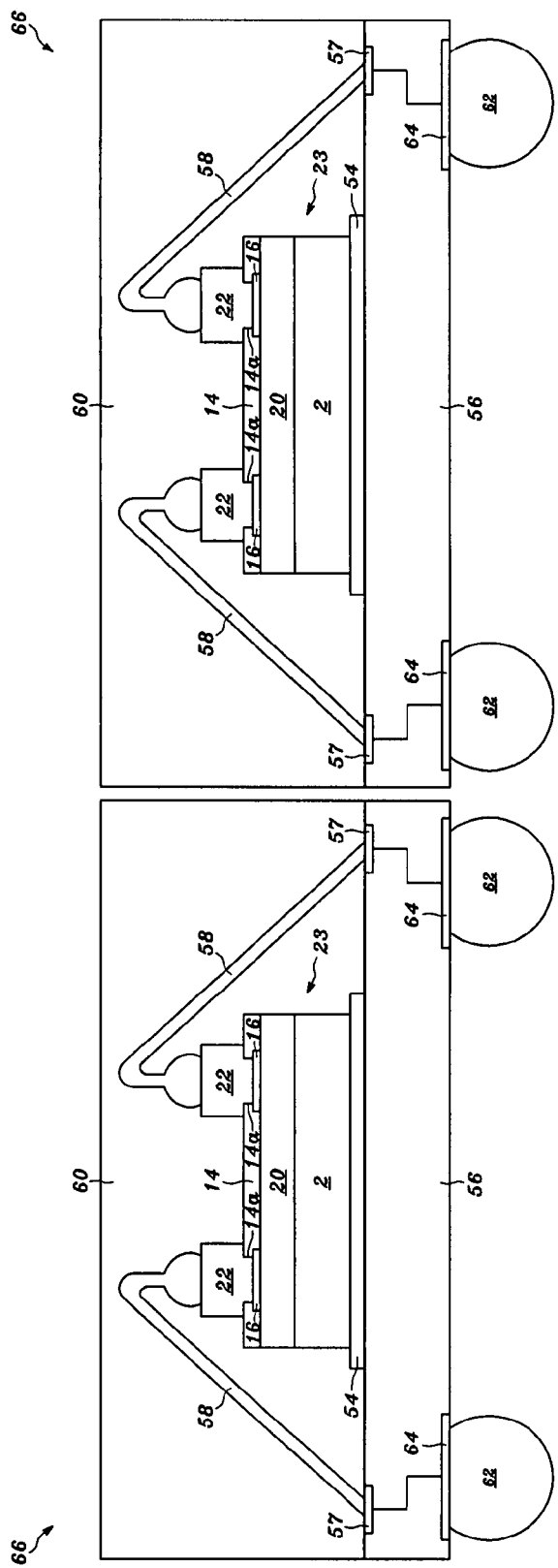

Referring to FIG. 9E, after the lead-free solder ball 62 is formed, the substrate 56 and the polymer material 60 can be cutted into a plurality of chip packages 66 using a mechanical cutting process or using a laser cutting process. The substrate 56 comprises a top surface and a bottom surface opposite to the top surface. The glue material 54 and the polymer material 60 are on the top surface, and the lead-free solder ball 62 is on the bottom surface.

Referring to FIGS. 10A-10L, the semiconductor chip 23 can be replaced by the above-mentioned semiconductor chips 31 shown in FIGS. 5A and 5B, the semiconductor chips 36 shown in FIGS. 7A and 7B, the semiconductor chips 40 shown in FIGS. 7C and 7D, the semiconductor chip 42 shown in FIG. 7E, the semiconductor chip 44 shown in FIG. 7F, the semiconductor chip 46 shown in FIG. 8A, the semiconductor chip 48 shown in FIG. 8B, the semiconductor chip 50 shown in FIG. 8C and the semiconductor chip 52 shown in FIG. 8D. That is, the semiconductor chip 31, 36, 40, 42, 44, 46, 48, 50 or 52 can be adhered to the substrate 56 using the glue material 54, which can be referred to the above description concerning FIG. 9A, followed by the steps as referred to in FIGS. 9B-9D, followed by cutting the substrate 56 and the polymer material 60 into a plurality of chip packages 68, 70, 72, 74, 76, 78, 80, 82 or 84 using a mechanical cutting process or using a laser cutting process.

Figure 10A:
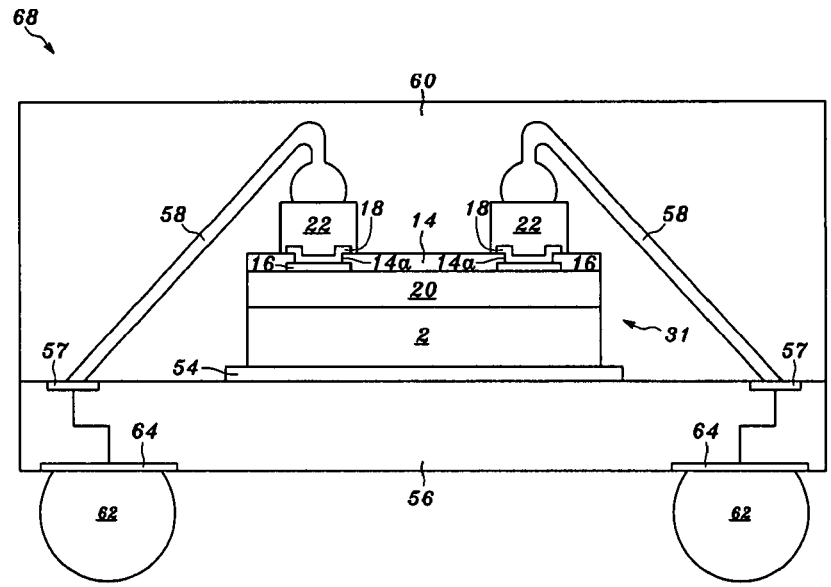
FIGS. 10A through 10L are sectional views showing various chip packages according to the present invention.
Figure 10B:
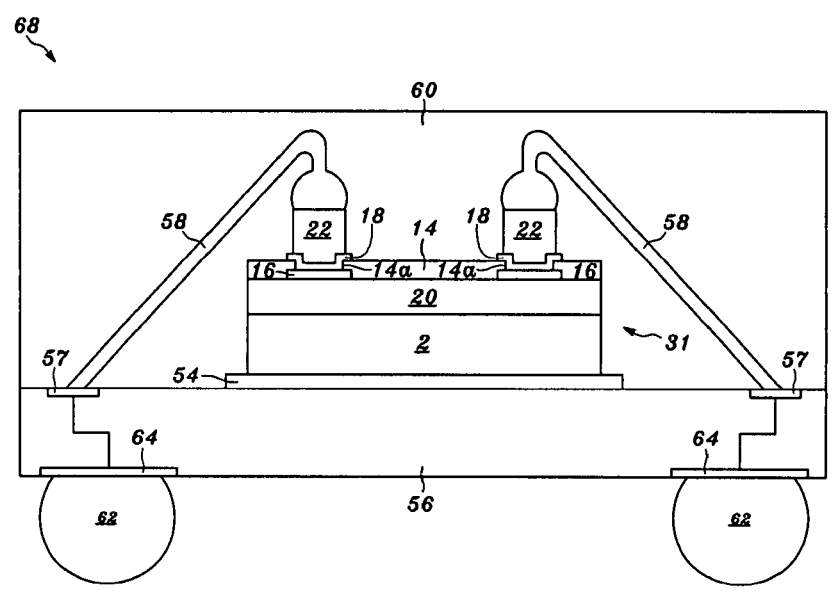
Figure 10C:
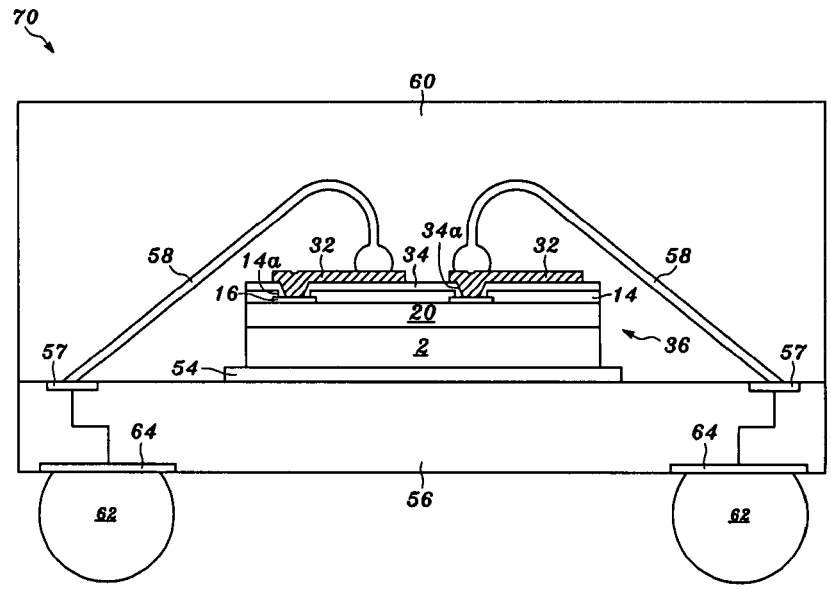
Figure 10D:
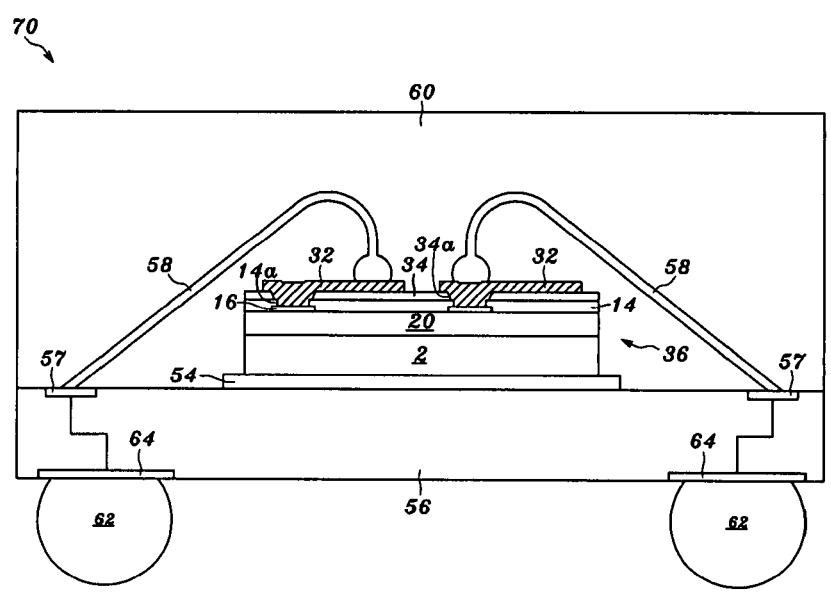
Figure 10E:
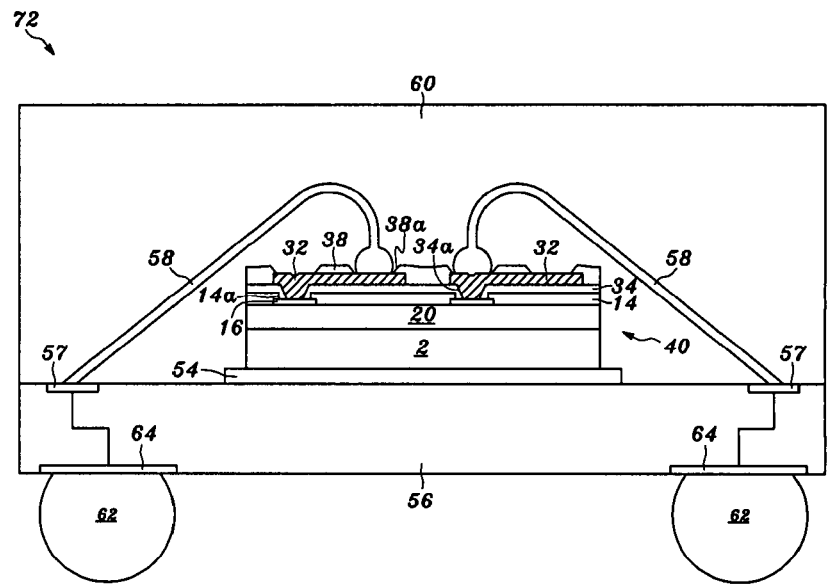
Figure 10F:
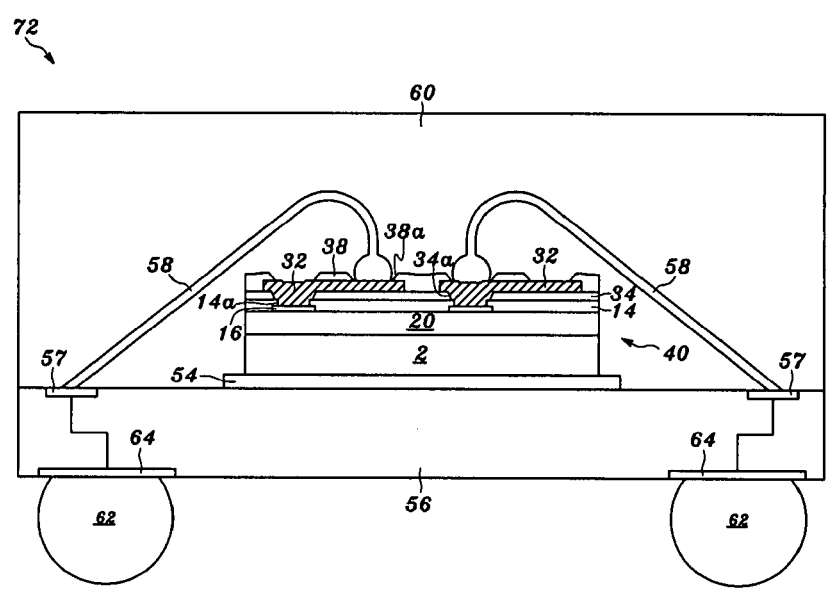
Figure 10G:
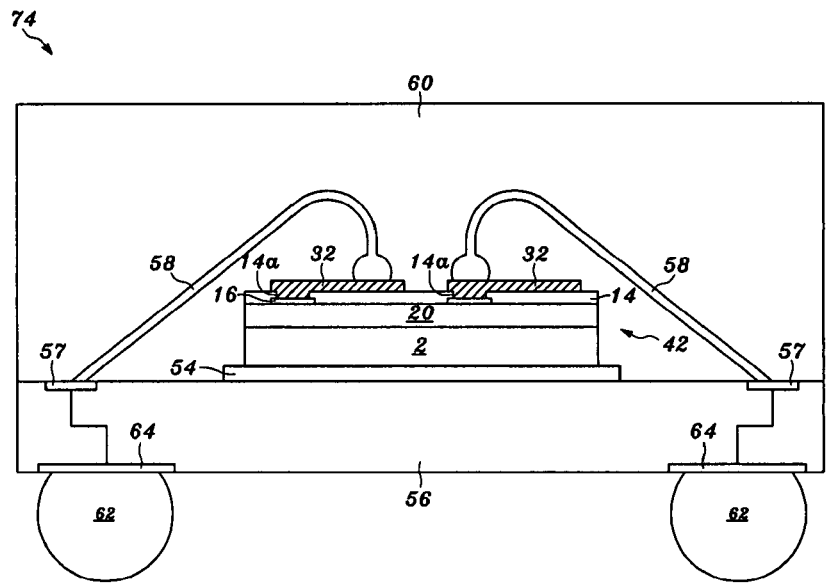
Figure 10H:
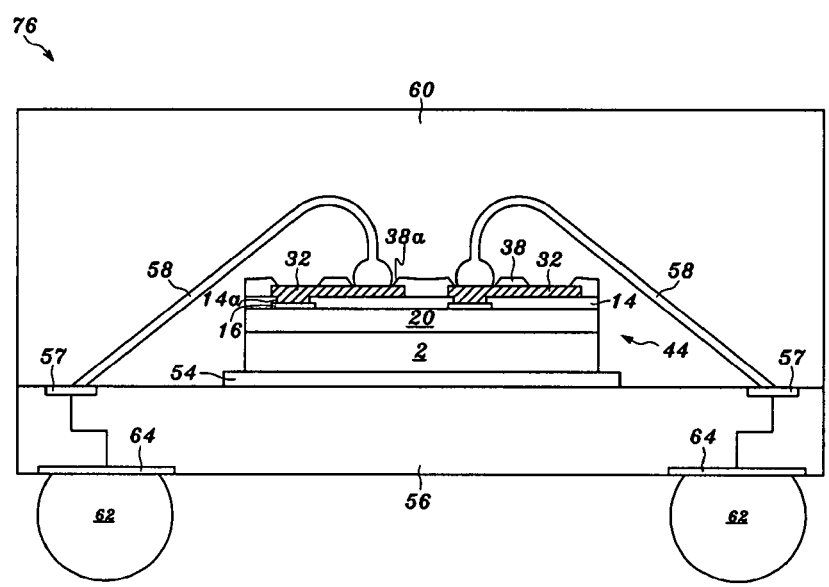
Figure 10I:
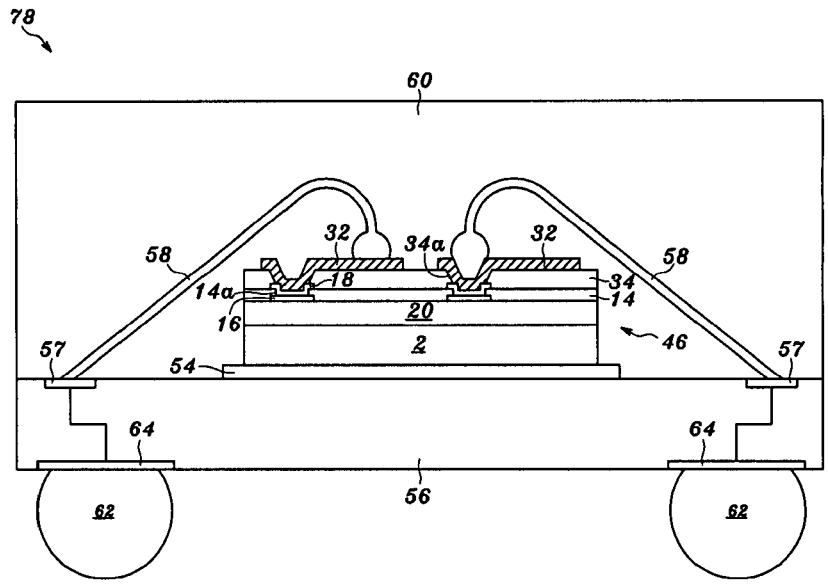
Figure 10J:
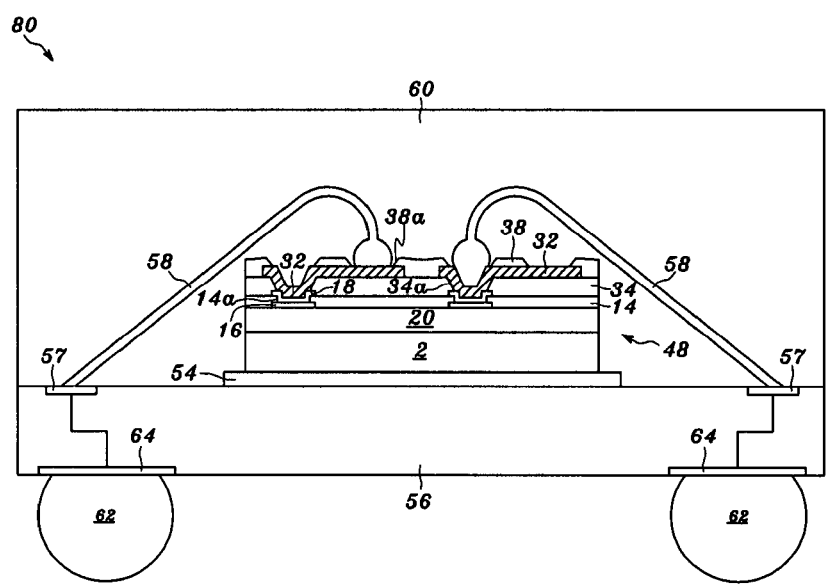
Figure 10K:
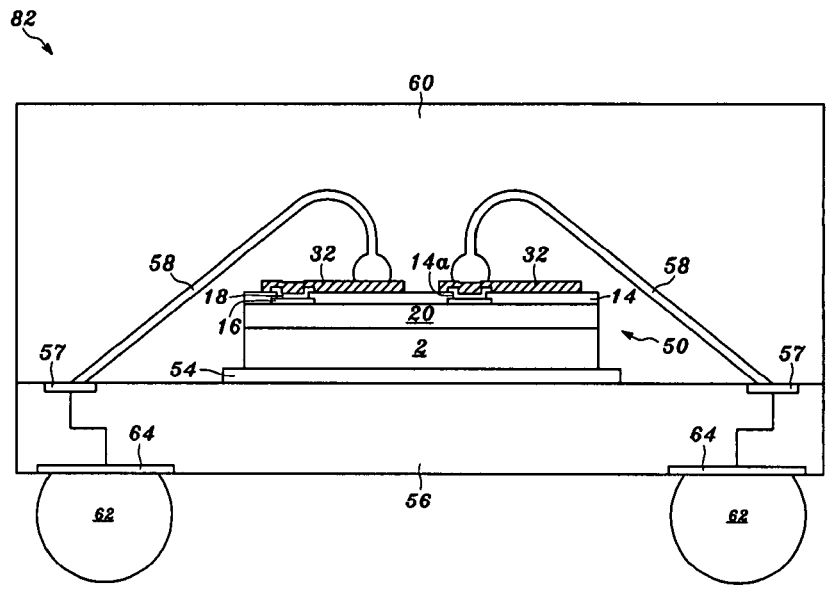
Figure 10L:
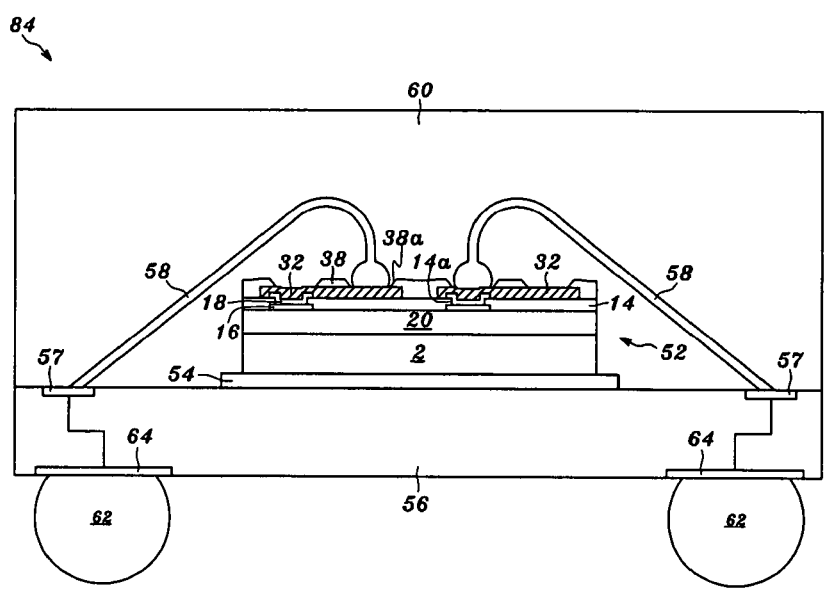

In FIGS. 10C-10D, from a top perspective view, the position of the metal trace 32 bonded with the wire 58 may be different from that of the pad 16, to which the metal trace 32 is connected, or from that of the metal cap 18, to which the metal trace 32 is connected. For example, the metal trace 32 of the chip package 68, 70, 72, 74 or 76 can be bonded with the wire 58, and from a top perspective view, the position of the metal trace 32 bonded with the wire 58 is different from that of the pad 16, to which the metal trace 32 is connected. Alternatively, the metal trace 32 of the chip package 78, 80, 82 or 84 can be bonded with the wire 58, and from a top perspective view, the position of the metal trace 32 bonded with the wire 58 is different from that of the metal cap 18, to which the metal trace 32 is connected.

For example, the metal trace 32 of the chip package 68, 70, 72, 74 or 76 can be bonded with the wire 58, and from a top perspective view, the position of the metal trace 32 bonded with the wire 58 is the same as that of the pad 16, to which the metal trace 32 is connected. Alternatively, the metal trace 32 of the chip package 78, 80, 82 or 84 can be bonded with the wire 58, and from a top perspective view, the position of the metal trace 32 bonded with the wire 58 is the same as that of the metal cap 18, to which the metal trace 32 is connected.

For example, two wires 58 can be bonded to one of the metal traces 32 of the chip package 68, 70, 72, 74 or 76. From a top perspective view, one of the two wires 58 is bonded to a first bonding pad 32a of the metal trace 32, the position of which is the same as that of the pad 16, and the other one of the two wires 58 is bonded to a second bonding pad 32b of the metal trace 32, the position of which is different from that of the pad 16. The first bonding pad 32a is connected to the second bonding pad 32b.

For example, two wires 58 can be bonded to one of the metal traces 32 of the chip package 78, 80, 82 or 84. From a top perspective view, one of the two wires 58 is bonded to a first bonding pad 32a of the metal trace 32, the position of which is the same as that of the metal cap 18, and the other one of the two wires 58 is bonded to a second bonding pad 32b of the metal trace 32, the position of which is different from that of the metal cap 18. The first bonding pad 32a is connected to the second bonding pad 32b.

Embodiment 2

Referring to FIG. 11A, the lead frame 86 comprises multiple die pads 86a and multiple leads 86b surrounding the die pads 86a. A glue material 54 is first formed on the die pads 86a of the lead frame 86 by dispensing multiple glue portions 54 on the die pads 86a. Next, multiple semiconductor chips 23 are respectively mounted onto the glue portions 54 to be adhered to the die pads 86a of the lead frame 86, and then the glue material 54 is baked at a temperature of between 100 and 200° C. In another word, the semiconductor substrate 2 of the semiconductor chip 23 can be adhered to the die pad 86a of the lead frame 86 using the glue material 54. The lead frame 86 has a thickness t6 of between 100 and 2,000 µm, and the material of the lead frame 86 may be copper or copper alloy.

For example, the glue material 54 may be polyimide having a thickness of between 1 and 50 µm to adhere the semiconductor chips 23 to the die pads 86a of the lead frame 86. Alternatively, the glue material 54 may be epoxy resin having a thickness of between 1 and 50 µm to adhere the semiconductor chips 23 to the die pads 86a of the lead frame 86. Alternatively, the glue material 54 may be silver-filed epoxy having a thickness of between 1 and 50 µm to adhere the semiconductor chips 23 to the die pads 86a of the lead frame 86.

Referring to FIG. 11B, via a wire-bonding process, one end of a wire 58 can be ball bonded to a bonding pad 22 of the semiconductor chip 23, and the other end of the wire 58 can be wedge bonded to one of the leads 86b of the lead frame 86, wherein the wire 58 has a diameter of between 20 and 50 micrometers, and the wire 58 is made of gold, typically called a gold wire. For example, one end of the wire 58 can be ball bonded to a gold layer of the bonding pad 22 of the semiconductor chip 23, and the other end of the wire 58 can be wedge bonded to one of the leads 86b of the lead frame 86. Alternatively, one end of the wire 58 can be ball bonded to a palladium layer of the bonding pad 22 of the semiconductor chip 23, and the other end of the wire 58 can be wedge bonded to one of the leads 86b of the lead frame 86. Thereby, the bonding pad 22 of the semiconductor chip 23 is electrically connected to one of the leads 86b of the lead frame 86.

Figure 11C:
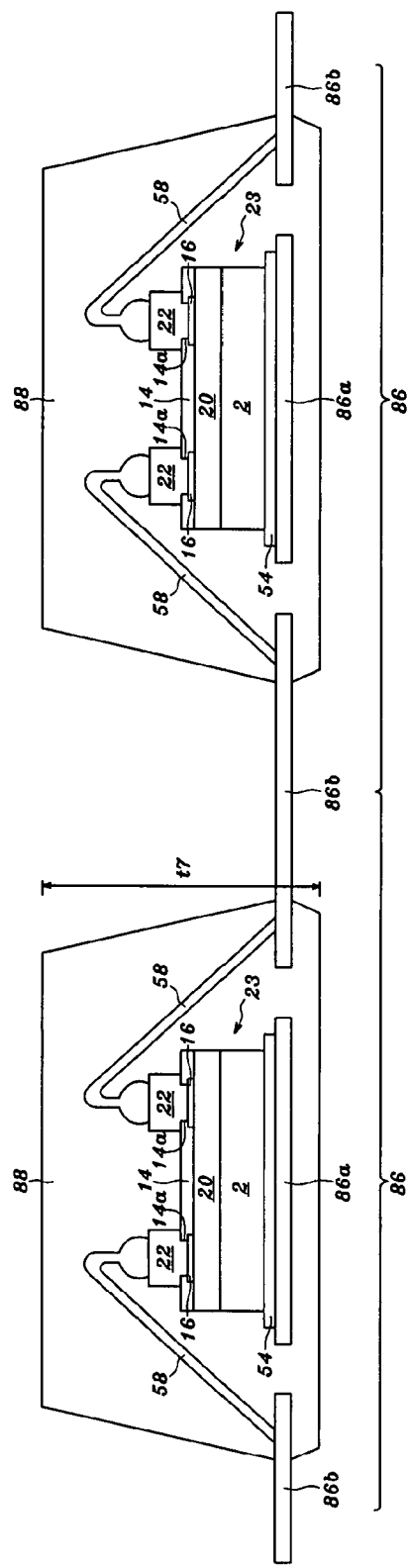

Referring to FIG. 11C, a polymer material 88, such as benzocyclobutane (BCB), polyimide (PI) or an epoxy-based material, having a thickness t7 of between 250 and 1,000 µm is next formed using a molding process, enclosing the die pads 86a, a portion of the leads 86b close to the die pads 86a, the semiconductor chips 23 and the wires 58.

For example, the polymer material 88 can be formed by molding an epoxy-based material having a thickness t7 of between 250 and 1,000 µm enclosing the die pads 86a, a portion of the leads 86b close to the die pads 86a, the semiconductor chips 23 and the wires 58, the semiconductor chips 23 and the wires 58. Alternatively, the polymer material 88 can be formed by molding polyimide or benzocyclobutane having a thickness t7 of between 250 and 1,000 µm enclosing the die pads 86a, a portion of the leads 86b close to the die pads 86a, the semiconductor chips 23 and the wires 58.

Figure 11D:
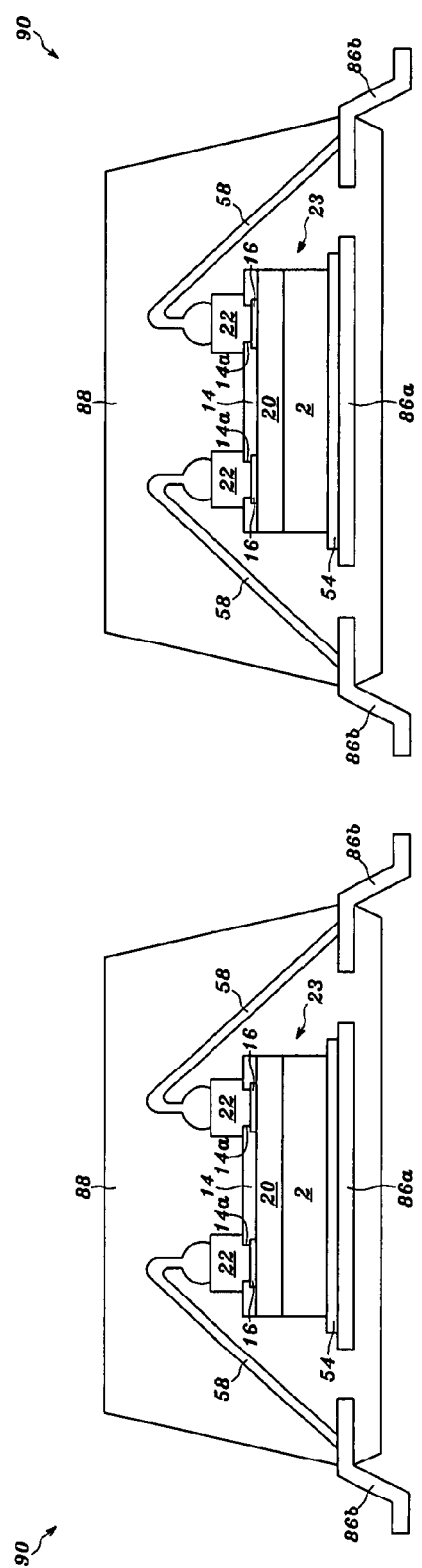
Figure 12A:
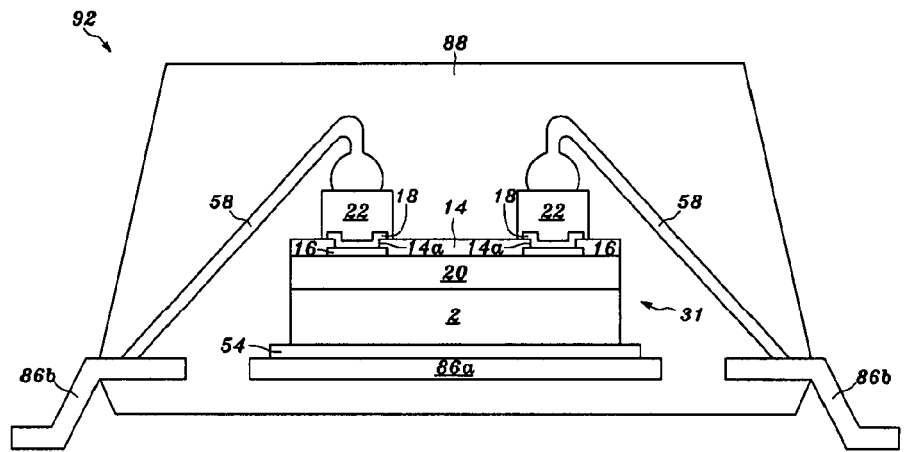
FIGS. 12A through 12L are sectional views showing various chip packages according to the present invention.
Figure 12B:
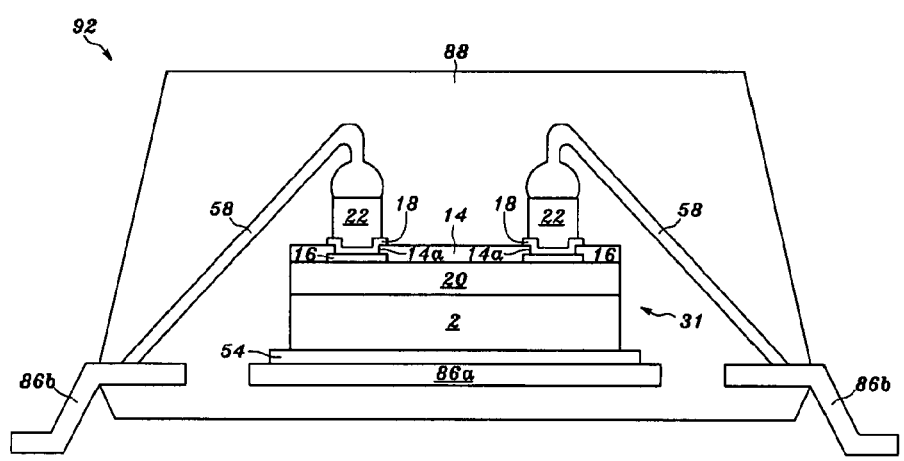
Figure 12C:
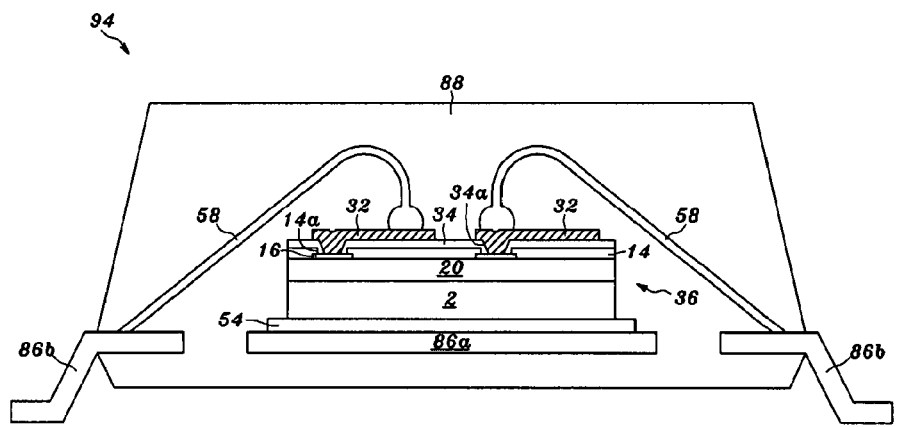
Figure 12D:
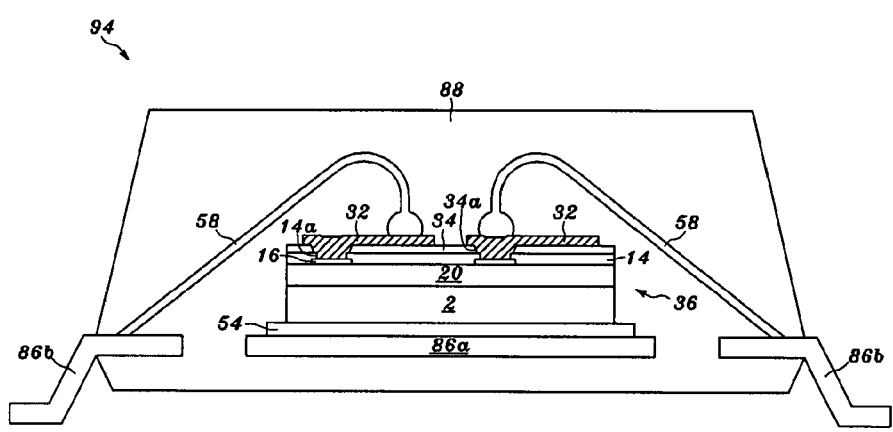
Figure 12E:
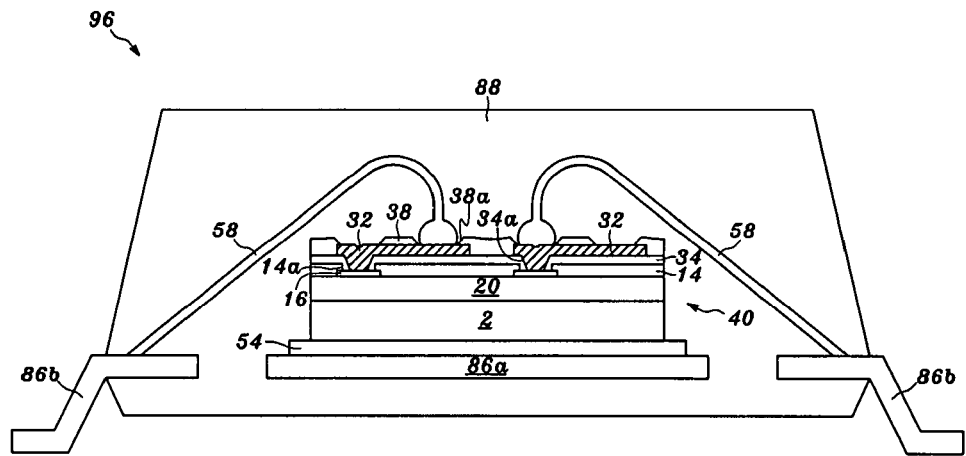
Figure 12F:
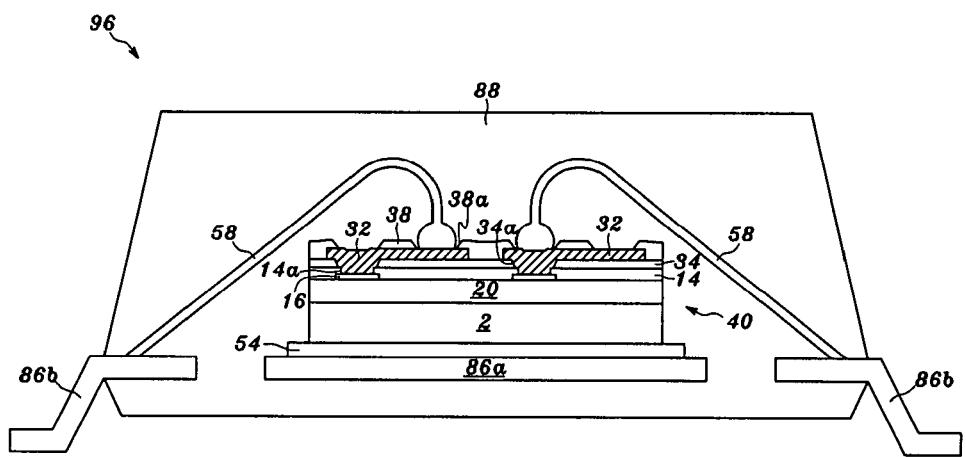
Figure 12G:
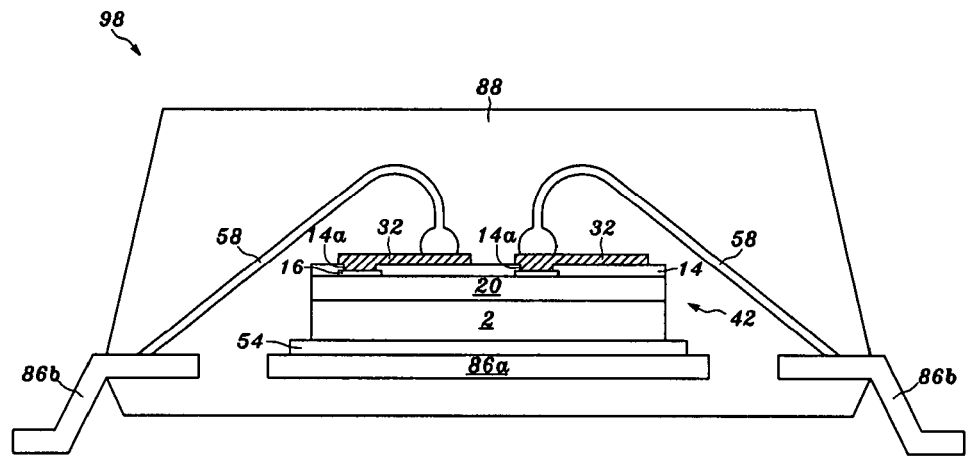
Figure 12H:
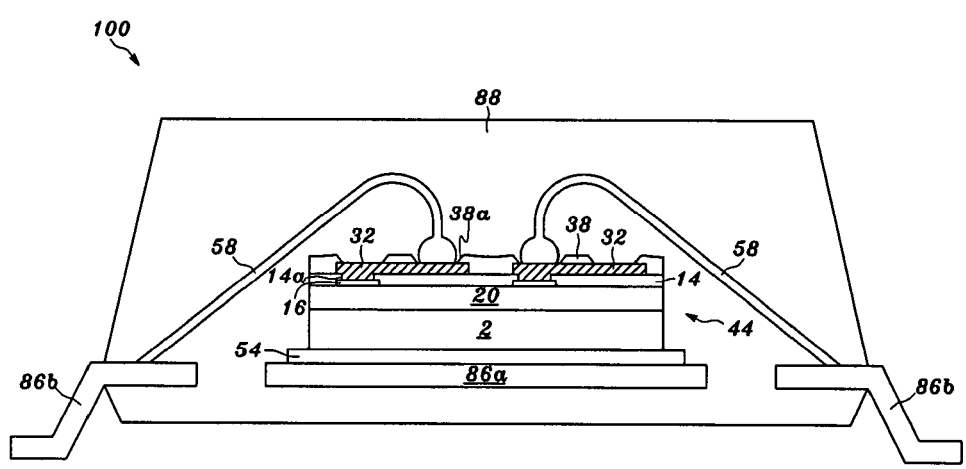
Figure 12I:
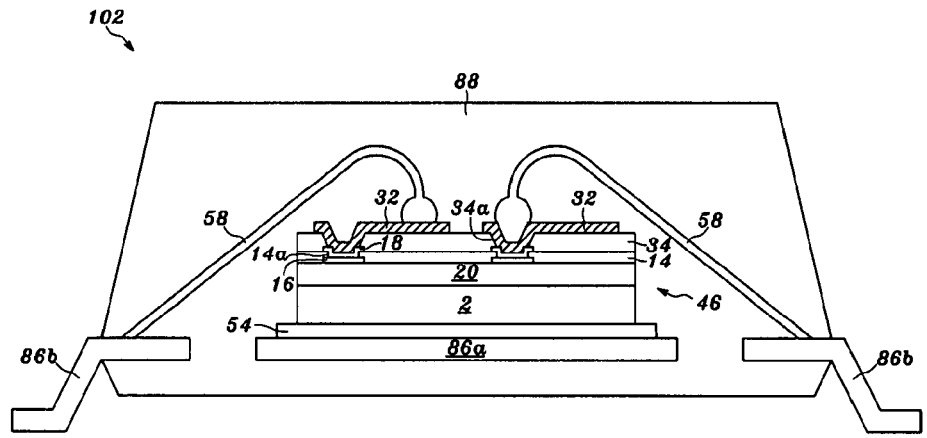
Figure 12J:
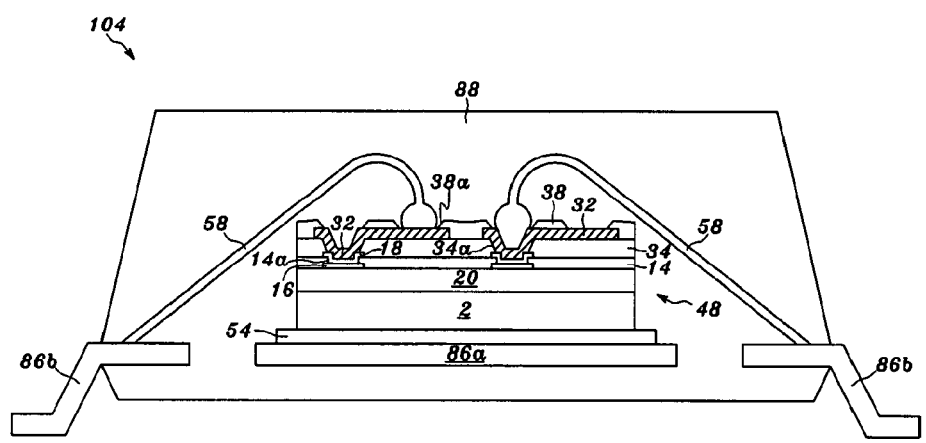
Figure 12K:
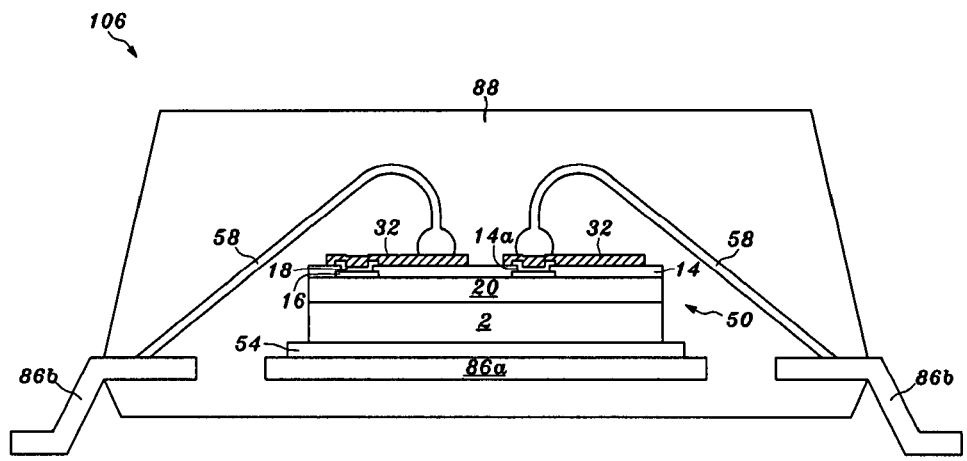
Figure 12L:
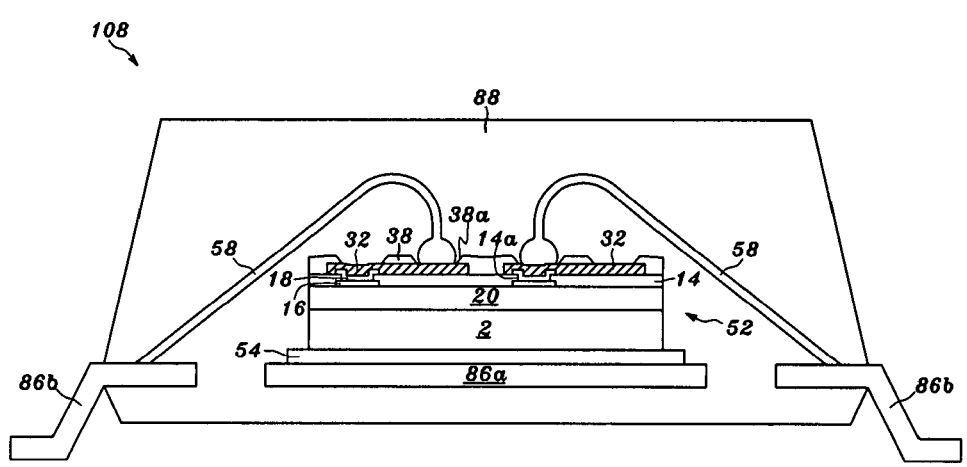

Referring to FIG. 11D, after the polymer material 88 is formed, the steps of dejunking the residual of the polymer material 88, trimming dam bars and cutting and punching the leads 86b can be performed, such that the leads 86b have a designed shape and multiple lead-frame chip packages 90 are singularized.

The chip package 90 may have various types, such as small outline package (SOP), thin small outline package (TSOP), dual in-line package (DIP), ceramic dual in-line package (CDIP), glass ceramic dual in-line package (CERDIP), CERQUAD, ceramic leaded chip carrier (CLCC), quad flat package (QFP), plastic leaded chip carrier (PLCC), small outline J-lead (SOJ), small outline integrated circuit (SOIC) or zig-zag in-line package (ZIP).

Referring to FIGS. 12A-12L, the semiconductor chip 23 can be replaced by the above-mentioned semiconductor chips 31 shown in FIGS. 5A and 5B, the semiconductor chips 36 shown in FIGS. 7A and 7B, the semiconductor chips 40 shown in FIGS. 7C and 7D, the semiconductor chip 42 shown in FIG. 7E, the semiconductor chip 44 shown in FIG. 7F, the semiconductor chip 46 shown in FIG. 8A, the semiconductor chip 48 shown in FIG. 8B, the semiconductor chip 50 shown in FIG. 8C and the semiconductor chip 52 shown in FIG. 8D. That is, the semiconductor chip 31, 36, 40, 42, 44, 46, 48, 50 or 52 can be adhered to the die pad 86a of the lead frame 86 using the glue material 54, which can be referred to the above description concerning FIG. 11A, followed by the steps as referred to in FIGS. 11B-11C, followed by forming a plurality of chip packages 92, 94, 96, 98, 100, 102, 104, 106 or 108 using the above-mentioned dejunking, trimming, cutting and punching process.

In FIGS. 12C-12L, from a top perspective view, the position of the metal trace 32 bonded with the wire 58 may be different from that of the pad 16, to which the metal trace 32 is connected, or from that of the metal cap 18, to which the metal trace 32 is connected. For example, the metal trace 32 of the chip package 92, 94, 96, 98 or 100 can be bonded with the wire 58, and from a top perspective view, the position of the metal trace 32 bonded with the wire 58 is different from that of the pad 16, to which the metal trace 32 is connected. Alternatively, the metal trace 32 of the chip package 102, 104, 106 or 108 can be bonded with the wire 58, and from a top perspective view, the position of the metal trace 32 bonded with the wire 58 is different from that of the metal cap 18, to which the metal trace 32 is connected.

For example, the metal trace 32 of the chip package 92, 94, 96, 98 or 100 can be bonded with the wire 58, and from a top perspective view, the position of the metal trace 32 bonded with the wire 58 is the same as that of the pad 16, to which the metal trace 32 is connected. Alternatively, the metal trace 32 of the chip package 102, 104, 106 or 108 can be bonded with the wire 58, and from a top perspective view, the position of the metal trace 32 bonded with the wire 58 is the same as that of the metal cap 18, to which the metal trace 32 is connected.

For example, two wires 58 can be bonded to one of the metal traces 32 of the chip package 92, 94, 96, 98 or 100. From a top perspective view, one of the two wires 58 is bonded to a first bonding pad 32a of the metal trace 32, the position of which is the same as that of the pad 16, and the other one of the two wires 58 is bonded to a second bonding pad 32b of the metal trace 32, the position of which is different from that of the pad 16. The first bonding pad 32a is connected to the second bonding pad 32b.

For example, two wires 58 can be bonded to one of the metal traces 32 of the chip package 102, 104, 106 or 108. From a top perspective view, one of the two wires 58 is bonded to a first bonding pad 32a of the metal trace 32, the position of which is the same as that of the metal cap 18, and the other one of the two wires 58 is bonded to a second bonding pad 32b of the metal trace 32, the position of which is different from that of the metal cap 18. The first bonding pad 32a is connected to the second bonding pad 32b.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:

1. A chip package comprising:
a circuit substrate comprising a glass substrate, a first metal interconnect at a top side of said glass substrate, and a second metal interconnect at a bottom side of said glass substrate, wherein said first metal interconnect is connected to said second metal interconnect;
a semiconductor chip over said top side of circuit substrate, wherein said semiconductor chip comprises a dielectric layer, a first metal layer, a second metal layer and a third metal layer connecting said first metal layer to said second metal layer, wherein said third metal layer is connected to said first metal layer through an opening in said dielectric layer, wherein said third metal layer is connected to said second metal layer not through any opening in said dielectric layer, wherein said first and second metal layers comprise electroplated copper, and said third metal layer comprises aluminum, wherein said first metal layer is connected to said first metal interconnect through, in sequence, said third metal layer and said second metal layer; and
a solder under said second metal interconnect.

2. The chip package of claim 1, wherein said first metal interconnect is connected to said second metal interconnect through an interconnection in said glass substrate.

3. The chip package of claim 1, wherein said solder comprises silver.

4. The chip package of claim 1, wherein said dielectric layer comprises a nitride.

5. The chip package of claim 1, wherein said dielectric layer comprises an oxide.

6. The chip package of claim 1, wherein said dielectric layer comprises an oxynitride.

7. The chip package of claim 1, wherein said second metal layer further comprises a nickel layer on a surface of said electroplated copper of said second metal layer.

8. The chip package of claim 1, wherein said electroplated copper of said second metal layer has a thickness between 1 and 13 micrometers.

9. The chip package of claim 1 further comprising a wire-bonded wire connecting said second metal layer to said first metal interconnect.

10. The chip package of claim 1, wherein said glass substrate has a thickness between 200 and 2,000 micrometers.

11. The chip package of claim 1, wherein said second metal layer further comprises a titanium-containing layer between said third metal layer and said electroplated copper of said second metal layer.

12. A chip package comprising:
a circuit substrate comprising a glass substrate, a first metal interconnect at a top side of said glass substrate, and a second metal interconnect at a bottom side of said glass substrate, wherein said first metal interconnect is connected to said second metal interconnect;
a semiconductor chip over said top side of circuit substrate, wherein said semiconductor chip comprises a passivation layer, a first metal layer and a second metal layer connected to said first metal layer through an opening in said passivation layer, wherein said passivation layer comprises a nitride, wherein said first and second metal layers comprise electroplated copper, wherein said first metal layer is connected to said first metal interconnect through said second metal layer; and
a solder under said second metal interconnect.

13. The chip package of claim 12, wherein said first metal interconnect is connected to said second metal interconnect through an interconnection in said glass substrate.

14. The chip package of claim 12, wherein said solder comprises silver.

15. The chip package of claim 12, wherein said second metal layer further comprises a nickel layer on a surface of said electroplated copper of said second metal layer.

16. The chip package of claim 12, wherein said electroplated copper of said second metal layer has a thickness between 1 and 13 micrometers.

17. The chip package of claim 12 further comprising a wirebonded wire connecting said second metal layer to said first metal interconnect.

18. The chip package of claim 12, wherein said glass substrate has a thickness between 200 and 2,000 micrometers.

19. The chip package of claim 12, wherein said second metal layer further comprises a titanium-containing layer between said first metal layer and said electroplated copper of said second metal layer.

20. The chip package of claim 12, wherein said nitride has a thickness between 0.2 and 1.2 micrometers.

* * * * *